(12) United States Patent
Winter et al.

(10) Patent No.: US 8,022,535 B2
(45) Date of Patent: Sep. 20, 2011

(54) SYSTEMS, DEVICES, AND METHODS FOR SEMICONDUCTOR DEVICE TEMPERATURE MANAGEMENT

(75) Inventors: Bradley J. Winter, Edina, MN (US); Benedikt Zeyen, Moenkeberg (DE)

(73) Assignee: CoolSilicon LLC, Edina, MN (US)

( * ) Notice: Subject to any disclaimer, the term of this patent is extended or adjusted under 35 U.S.C. 154(b) by 70 days.

(21) Appl. No.: 12/480,650

(22) Filed: Jun. 8, 2009

(65) Prior Publication Data

US 2009/0302461 A1      Dec. 10, 2009

Related U.S. Application Data

(60) Provisional application No. 61/059,603, filed on Jun. 6, 2008, provisional application No. 61/060,413, filed on Jun. 10, 2008, provisional application No. 61/086,600, filed on Aug. 6, 2008.

(51) Int. Cl.
    *H01L 23/34*      (2006.01)
(52) U.S. Cl. ............ 257/714; 257/713; 257/E23.097; 257/E23.098
(58) Field of Classification Search .......... 257/713–714, 257/716, 721–722, E23.08, E23.097, E23.098, 257/E23.099
    See application file for complete search history.

(56) References Cited

U.S. PATENT DOCUMENTS

| | | | |
|---|---|---|---|
| 4,381,818 A | 5/1983 | Sachar et al. | |
| 4,559,580 A | 12/1985 | Lutfy | |
| 4,614,227 A | 9/1986 | Vogel | |
| 4,807,018 A | 2/1989 | Cellai | |
| 4,894,709 A | 1/1990 | Phillips et al. | |
| 4,953,060 A | 8/1990 | Lauffer et al. | |
| 4,977,444 A | 12/1990 | Nakajima et al. | |
| 5,133,403 A | 7/1992 | Yokono et al. | |
| 5,150,371 A | 9/1992 | Abramov et al. | |
| 5,161,090 A * | 11/1992 | Crawford et al. ............. | 361/700 |
| 5,210,440 A | 5/1993 | Long | |

(Continued)

FOREIGN PATENT DOCUMENTS

EP      1840962 A1      10/2007

(Continued)

OTHER PUBLICATIONS

Adams, "A Cool Innovation Stacks Microprocessor" Chip Scale Review, Jan. 2009, pp. 24-29.

(Continued)

*Primary Examiner* — Kiesha R Bryant
*Assistant Examiner* — Tucker Wright
(74) *Attorney, Agent, or Firm* — Shumaker & Sieffert, P.A.

(57) ABSTRACT

Devices, systems, and methods for semiconductor die temperature management are described and discussed herein. An IC device is described that includes at least one intra-die cooling structure. In an embodiment, the IC device includes a semiconductor die formed of integral device layers and further includes at least one coolant reservoir and at least one coolant channel. In an embodiment, the at least one coolant reservoir and at least one coolant channel are disposed wholly within the semiconductor die. In various embodiments, at least one coolant reservoir and at least one coolant channel are constructed and arranged to circulate coolant fluid in proximity to at least one IC device structure in order to decrease and or normalize an operating temperature of the IC device. In other embodiments, systems and methods for designing and/or fabricating IC die that include at least one intra-die cooling structure are provided herein.

17 Claims, 43 Drawing Sheets

U.S. PATENT DOCUMENTS

| | | | |
|---|---|---|---|
| 5,239,200 | A | 8/1993 | Messina et al. |
| 5,270,572 | A | 12/1993 | Nakajima et al. |
| 5,329,993 | A | 7/1994 | Ettehadieh |
| 5,365,400 | A | 11/1994 | Ashiwake et al. |
| 5,388,635 | A | 2/1995 | Gruber et al. |
| 5,955,781 | A | 9/1999 | Joshi et al. |
| 5,959,351 | A | 9/1999 | Sasaki et al. |
| 5,985,697 | A | 11/1999 | Chaney et al. |
| 6,210,986 | B1 | 4/2001 | Arnold et al. |
| 6,374,905 | B1 | 4/2002 | Tantoush |
| 6,389,582 | B1 | 5/2002 | Valainis et al. |
| 6,588,217 | B2 | 7/2003 | Ghoshal |
| 6,661,659 | B2 | 12/2003 | Tamba et al. |
| 6,666,260 | B2 | 12/2003 | Tantoush |
| 7,157,793 | B2 | 1/2007 | Torkington et al. |
| 7,170,164 | B2 | 1/2007 | Chen et al. |
| 7,219,713 | B2 | 5/2007 | Gelorme et al. |
| 7,220,365 | B2 | 5/2007 | Qu et al. |
| 7,227,257 | B2 | 6/2007 | Kim et al. |
| 7,358,201 | B2 | 4/2008 | Ramanathan et al. |
| 7,383,520 | B2 | 6/2008 | Chandra |
| 2005/0128702 | A1 | 6/2005 | Mongia et al. |
| 2006/0291164 | A1 | 12/2006 | Myers et al. |
| 2007/0295480 | A1 | 12/2007 | Campbell et al. |
| 2008/0266787 | A1 | 10/2008 | Gosset et al. |
| 2009/0024969 | A1 | 1/2009 | Chandra |
| 2009/0251862 | A1 | 10/2009 | Knickerbocker et al. |

FOREIGN PATENT DOCUMENTS

| | | |
|---|---|---|
| JP | 2006245311 A | 9/2006 |
| JP | 2007258569 A1 | 10/2007 |

OTHER PUBLICATIONS

Yao et al., "Room Temperature Microchannel Fabrication for Microfluidic System," IEEE-NANO 2007, $7^{th}$ IEEE Conference, Aug. 2-5, 2007, pp. 122-125.

Vulto et al., "Microfluidic channel fabrication in dry film resist for production and prototyping of hybrid chips," Lab Chip, 2005, 5, pp. 158-162.

Chow et al., "Microfluidic Channel Fabrication by PDMS-Interface Bonding," Smart Materials and Structures, Institute of Physics, UK, 2005, pp. 1-9.

McKechnie, "Fabrication of Microfluidic Devices with Application to Membraneless Fuel Cells," Thesis, B. Eng. McMaster University, 2006, 32 pp.

Hong et al., "Tunable Microfluidic Optical Devices with Integrated Mierolens Array," Journal of Micromechanics and Microengineering, vol. 16, Issue 8, Aug. 2006, pp. 1660-1666.

Kwon et al,, "Multi-level mierofluidic channel routing with protected convex corners," Sensor and Actuators A, 97-98, 2002, pp. 729-733.

Jo et al., "Three-Dimensional Micro-Channel Fabrication in Polydimethylsiloxane (PDMS) Elastomer," Journal of Microelectromeehanical Systems, vol. 9, No. 1, Mar. 2000, pp. 76-81.

Sudarsan, "Fabrication of Masters for Microfluidic Devices Using Conventional Printed Circuit Technology," Thesis, Texas A & M University, Aug. 2003, 84 pp.

Cheng et al., "Integrating 3D photonics and microfluidics using ultrashort laser pulses," SPIE Newsroom, Dec. 13, 2006, 3 pp., http://spie.org/x8513.xml?highlight=x2402&ArticleID=x8513.

PowerPoint presentation: "Fabrication of Microfluidic Channels," (ECE138L final paper), Mar. 2009, 9 pp.

Tondra, "Integrated Mass-Fabrication of Microfluidics for Diagnostic Chips," NVE Corporation, 2005, 4 pp.

Koo et al., "Integrated Microchannel Cooling for Three-Dimensional Electronic Circuit Architectures," Journal of Heat Transfer, vol. 127, Jan. 2005, pp. 49-58.

Therriault et al., "Chaotic mixing in three-dimensional microvascular networks fabricated by direct-write assembly," published online at www.nature.com/materials, Mar. 23, 2003, 7 pp.

"Basic Microfluidic Concepts," http://faculty.washington.edu/yagerp/microfluidicstutorial/basicconcepts/basicconcepts.htm, revised Sep. 7, 2001, 8 pp.

"Liquid Metal; Cooling Systems," QATS, Inc., Jun. 2008, pp. 6-11.

Hidrovo et al., "Active Microfluidic Cooling of Integrated Circuits," Electrical, Optical, and Thermal Interconnections for 3D Integrated Systems, 2008, pp. 293-330.

Written Opinion and Search Report from corresponding PCT/US2009/046647, dated Jan. 21, 2010 (11 pgs).

Notification Concerning Transmittal of International Preliminary Report on Patentability (Chapter 1 of the Patent Cooperation Treaty) for corresponding patent application No. PCT/US2009/046647, mailed on Dec. 16, 2010.

\* cited by examiner

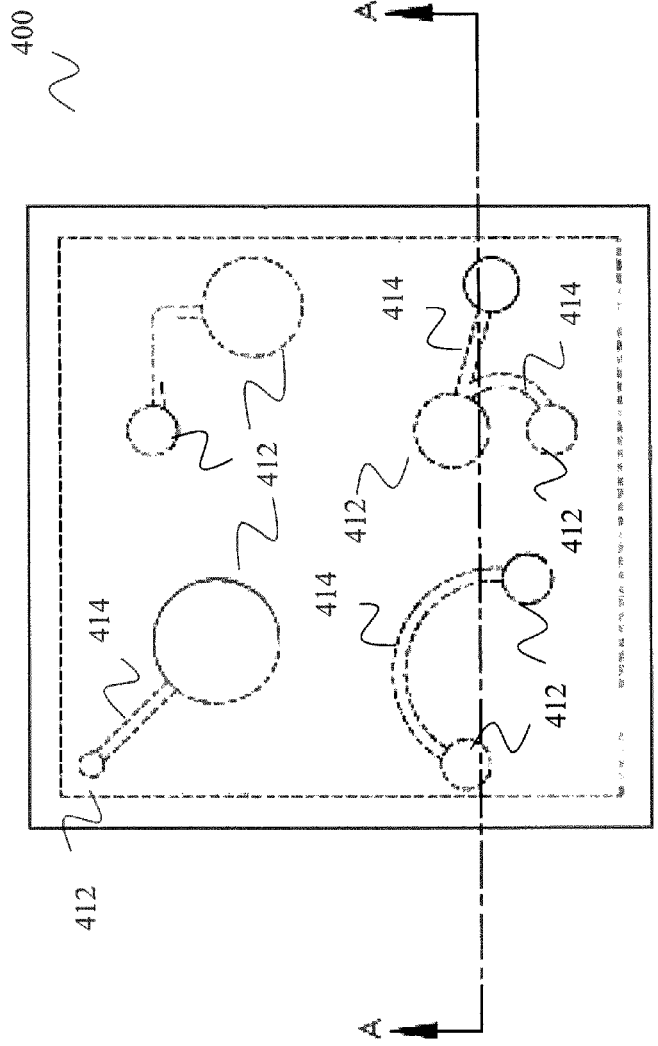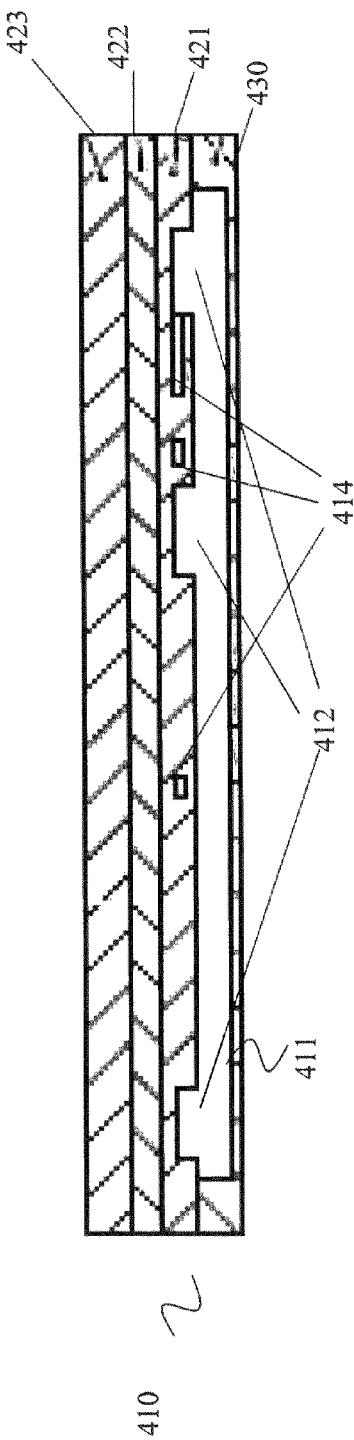
FIG. 4A
FIG. 4B

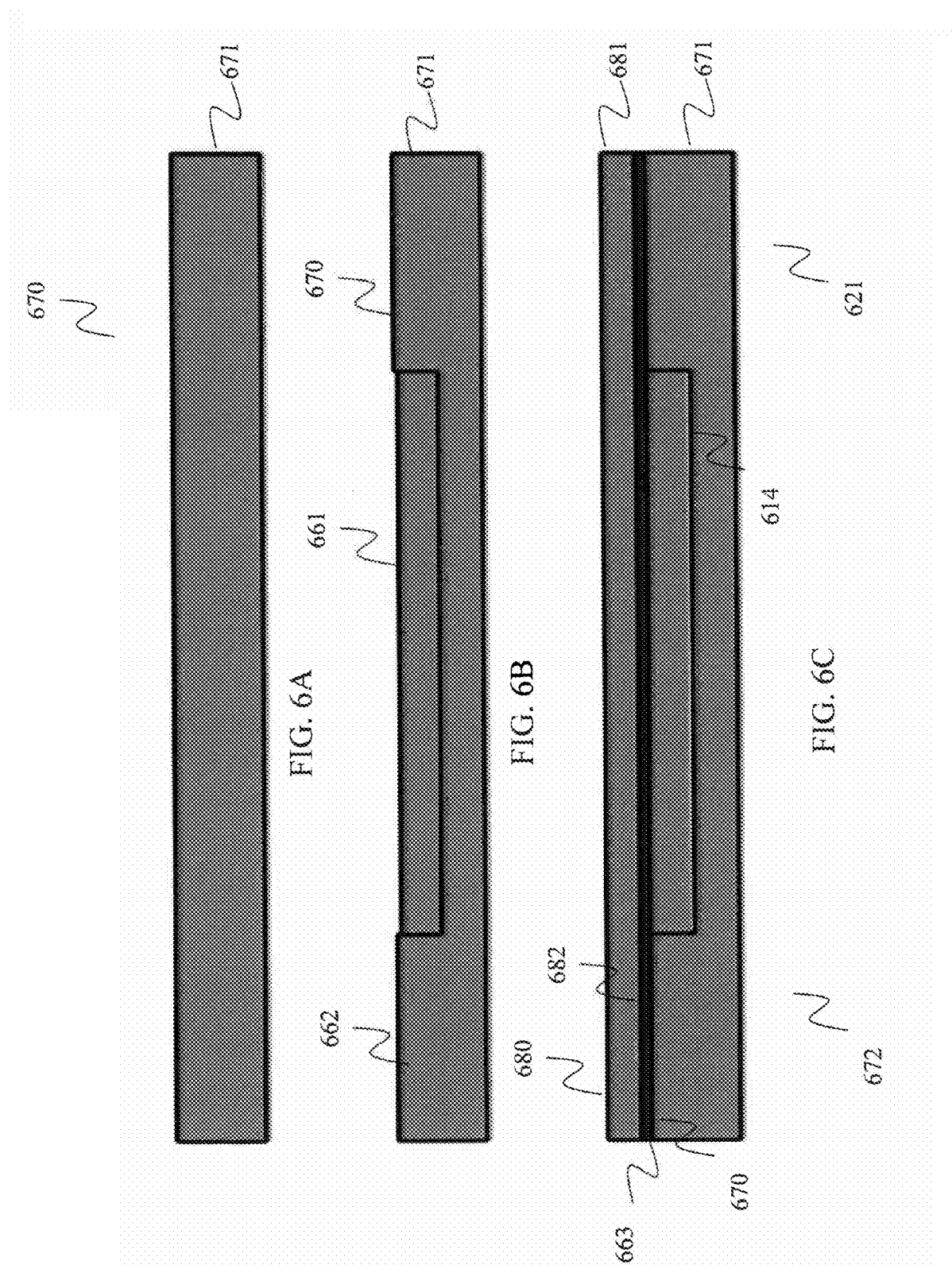

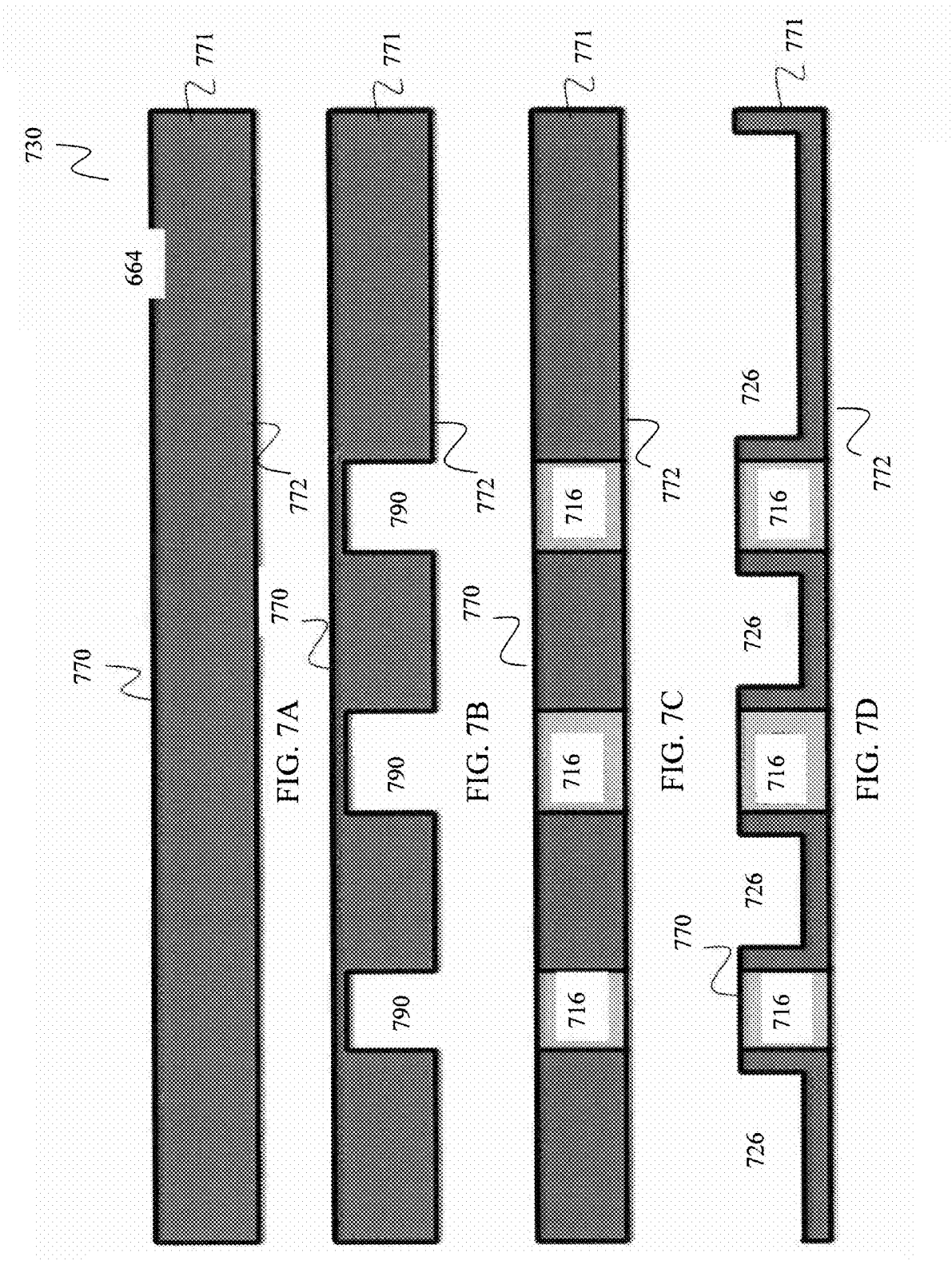

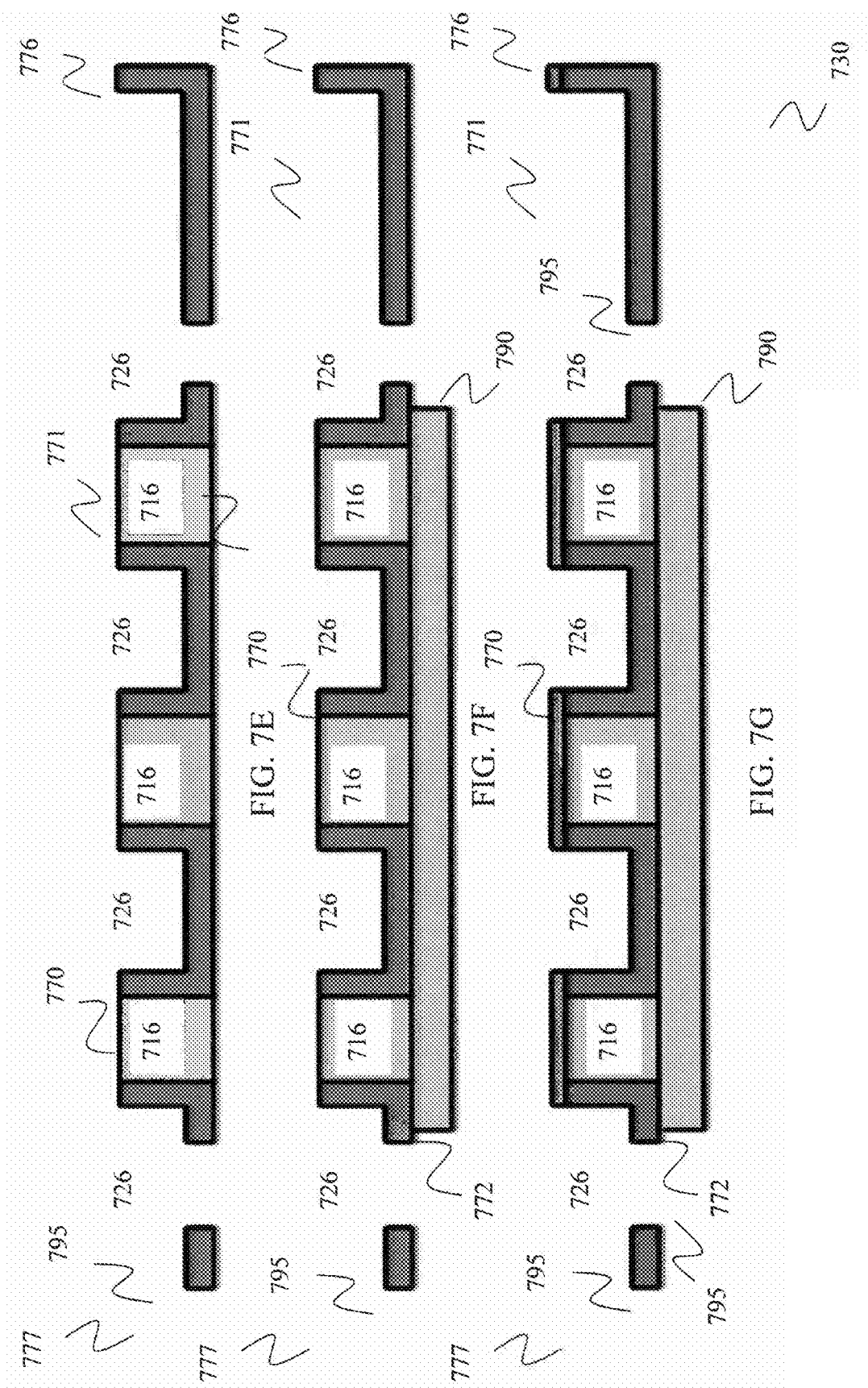

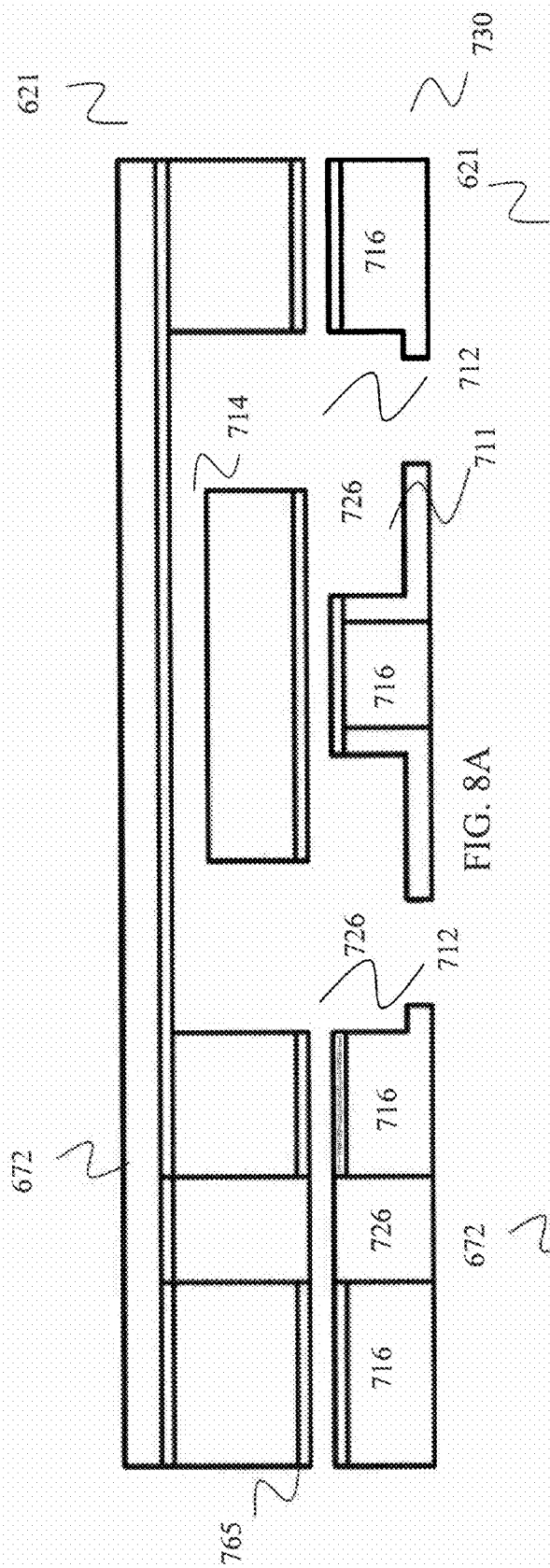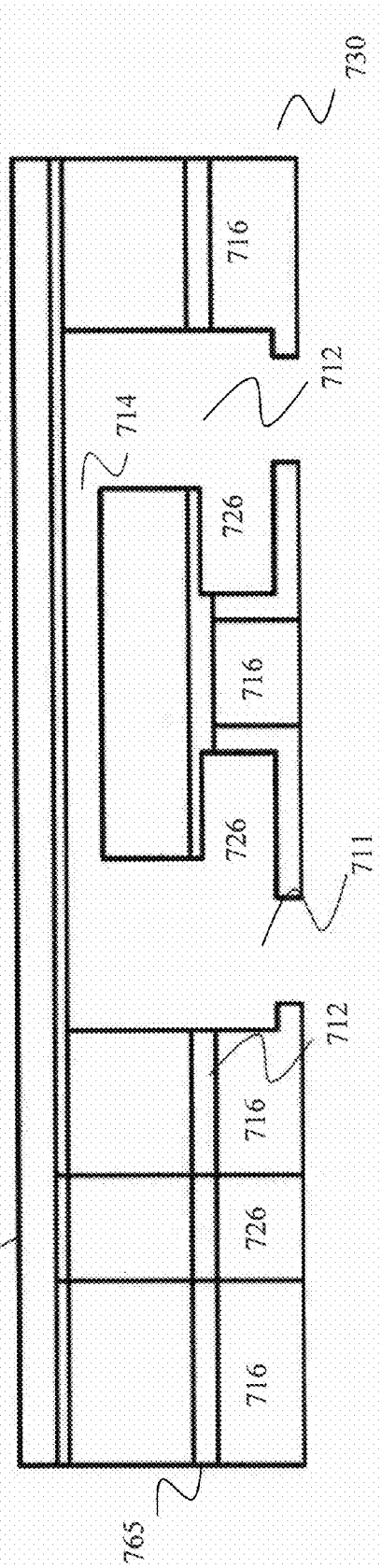

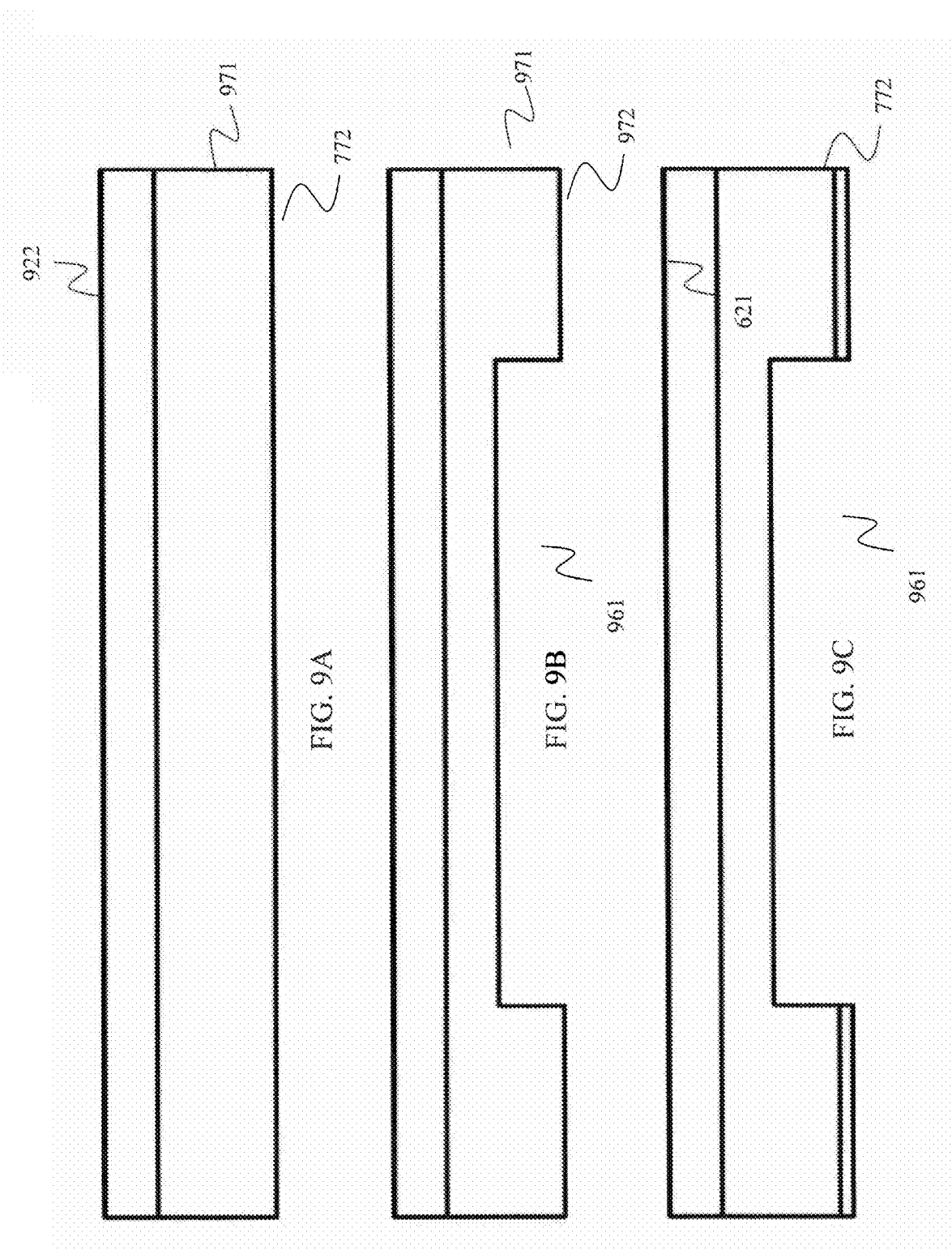

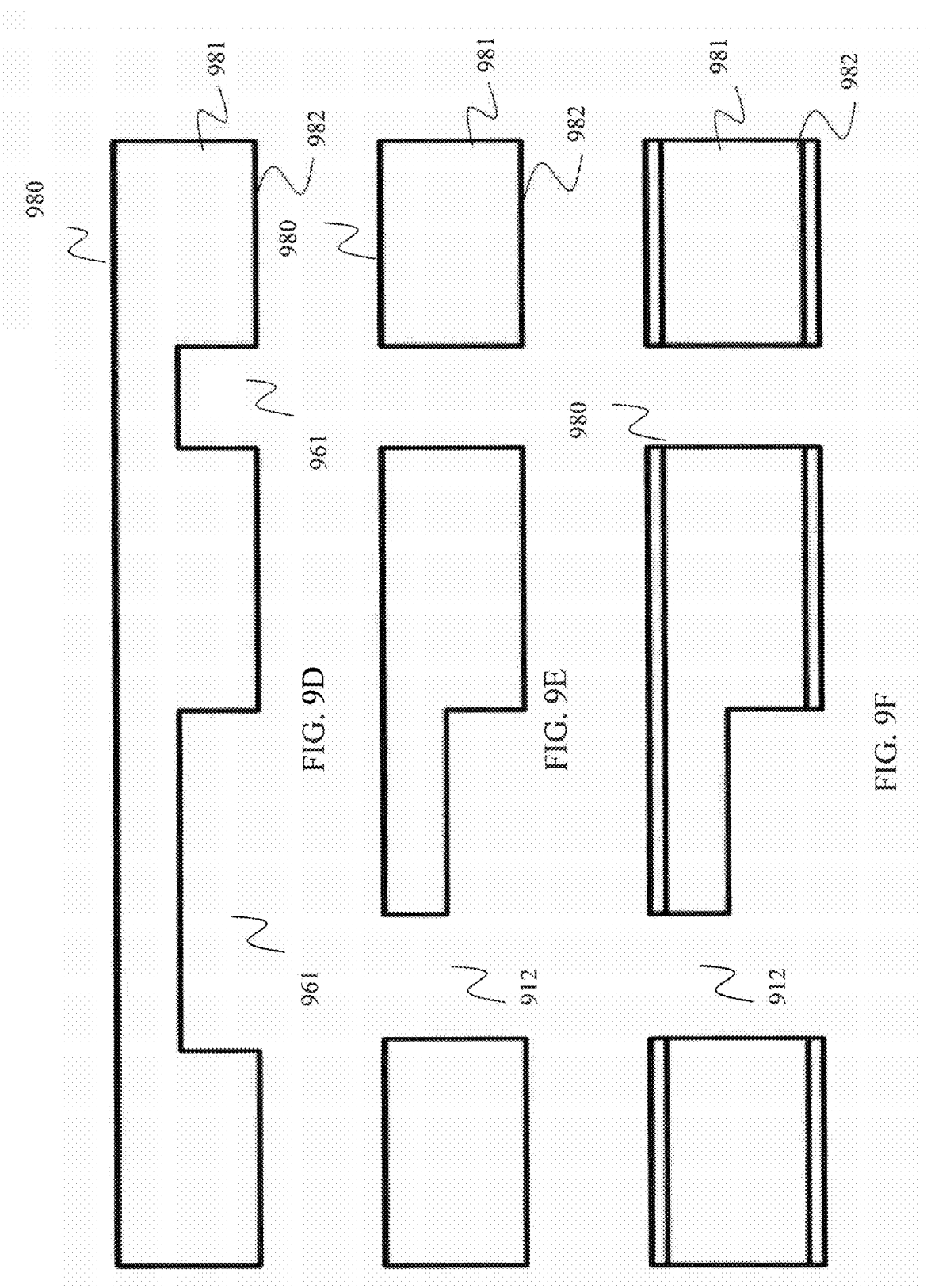

SYSTEMS, DEVICES, AND METHODS FOR SEMICONDUCTOR DEVICE TEMPERATURE MANAGEMENT

RELATED APPLICATIONS

The present invention claims priority to U.S. Provisional Patent Application No. 61/059,603, entitled "System and Methods for Cooling Semiconductor Device," filed Jun. 6, 2008, U.S. Provisional Patent Application No. 61/060,413, entitled "Systems, Methods, and Devices Providing for Liquid Cooling of a Semiconductor Device" filed Jun. 10, 2008, and U.S. Provisional Patent Application No. 61/086,600, entitled "Systems, Methods, and Devices Providing for Liquid Cooling of a Semiconductor Device" filed Aug. 6, 2008, all of which are hereby incorporated by reference.

FIELD OF THE INVENTION

The invention relates generally to integrated circuits and, more particularly, to temperature management of integrated circuits.

BACKGROUND OF THE INVENTION

Designers of Integrated Circuit (IC) technology typically strive to provide IC devices that take up a minimum amount of space, and operate reliably at high speeds while consuming a minimum of power. Of increasing importance in IC design is the management of heat generated by device structures of an IC, namely transistors.

The amount of heat generated in a particular IC, or portion of an IC, is dependent at least in part on a number of transistors, the frequency (speed) at which they operate, and/or an amount of electrical energy consumed. This generated heat may cause a variety of operational and/or structural issues. A "hot" IC may operate at limited speed (Many authors have posited that for every 10 degrees in heat reduction, a typical IC will operate at a 2% higher operating frequency), may suffer from data and other reliability issues, and may consume more power than a device operating at lower temperatures. The IC may even fail functionally or physically.

Recently, ever-increasing consumer demand for improved IC performance has caused IC designers to look to multi-substrate IC devices in which a plurality of integral IC device layers (substrate layers in which transistors or other IC device structures are formed) are stacked and interconnected in a single die. By utilizing multi-substrate designs, an IC can be provided in a more compact arrangement and lengths of wire routes (electrical connections between IC devices structures such as transistors) can be reduced. Shorter wire lengths may improve operation speeds, reduce parasitic effects on circuit operation, and improve a designer's ability to meet timing requirements.

Because multi-substrate IC devices incorporate transistors arranged in proximity in both horizontal and vertical dimensions they may be more susceptible to the effects of heat. As such it may be difficult to remove heat from such devices by traditional methods.

Some single or multi-substrate ICs are formed with silicon-on-insulator (SOI) structures that include an insulating layer formed between different semiconductor substrate layers and/or IC die. These insulating may layers trap heat in the IC, which may exacerbate issues related to the presence of heat.

Many technologies have been developed to remove heat from an IC, for example heat sinks. One example of a heat sink is described in U.S. Pat. No. 4,807,018 to Cellai, which describes a metallic structure adapted to be thermally coupled with one or more exterior surfaces of an IC die or package to transfer heat from the IC into the surrounding environment. Heat sinks may be coupled to an IC on a PC board, or may be included within an IC package.

Other solutions to IC heat management utilize fluid to cool an IC. For example, U.S. Pat. No. 5,388,635 to Gruber et al., U.S. Pat. No. 4,894,709 to Phillips et al., U.S. Pat. No. 7,219,713 to Gelorme et al., U.S. Pat. No. 7,157,793 to Torkington, et al., and U.S. Pat. No. 5,210,440 to Long each describe devices adapted to be placed in contact with or in proximity to one or more surfaces of an IC to circulate fluid in order to cool the IC. Additional, approaches, such as described in U.S. Pat. No. 7,170,164 to Chen et al., describe the formation of trenches in a surface of an IC, and the circulation of fluid through the trenches to cool the device. Still other approaches describe the formation of micro-fluidic channels at a back surface of a semiconductor die to dissipate heat. Similarly, other approaches provide for the formation of micro-channels on a surface of a plurality of stacked and interconnected die, such as described in *A Cool Innovation Stack Microprocessors*, Tom Adams (Chip Scale Review, pp. 24-29, Jan. 2009, http://e-ditionsbyfry.com/Olive/AM3/CSR/Default, htm?href=CSR/2009/010/01).

Other solutions have also been proposed. For example, U.S. Pat. No. 6,389,582 to Valainis et al. describes a thermal driven placement system for the automated placement of components of an IC design based on a thermal model of the design. Similarly, U.S. Pat. Pub. No. 2009/0024969 to Chandra describes the creation of a thermal model of an IC design and modifying one or more thermal management systems based on the thermal model. A thermal model of an IC design may include designations of "hot spots", or those portions of the IC that generate a relatively greater amount of heat than other regions or portions of the IC.

Still other approaches provide one or more metallic heat flow paths internal to an IC die itself to remove heat from the design. For example, U.S. Pat. No. 5,955,781 to Joshi et al, describes the formation of heat conductive metallic structures internal to an IC design to dissipate heat directly from hotter elements of the IC. Other approaches, such as described in U.S. Pat. Pub. 2008/0266787 to Gosset et al., describe the formation of micro-fluidic channels in metallization layers of a single substrate IC die. The channels are coupled to an extra-die fluidic cooling circulation driver.

While the above-mentioned approaches for IC temperature management may mitigate the effects of heat on IC device operation, there is a need for improvements in IC thermal management.

SUMMARY OF THE INVENTION

Devices, systems, and method providing for improvements in IC device temperature management are provided herein. In some embodiments, an integrated circuit (IC) device is described. The IC device includes a semiconductor die that includes a plurality of integral device layers and a plurality of semiconductor device structures embedded within the plurality of integral device layers. The device further includes at least one coolant reservoir constructed to hold a coolant fluid. The device also includes at least one coolant channel in fluid communication with the coolant reservoir and constructed to locally interface with at least one of the plurality of semiconductor device structures. In an embodiment, the device includes at least one inter-layer cooling channel and at least one intra-layer cooling channel. In an embodiment, the coolant reservoir and the coolant channel are disposed wholly within the semiconductor die and are constructed and arranged to permit a fluid disposed within the at least one coolant reservoir to circulate through said at least one coolant channel to manage an operating temperature of the IC device.

Also described herein are various embodiments of methods of forming an IC die that includes at least one intra-die cooling structure. In one embodiment, a method includes providing a first substrate layer. At least one recessed portion is defined in a first surface of the substrate layer. A second substrate layer may be provided. The first substrate layer may be bonded to a second surface of the second substrate layer to form at least one inter-layer coolant channel. At least one portion of the second surface of the first substrate layer is removed to form at least one inter-layer coolant channel. In an embodiment, at least one of the first surface of the second substrate layer or a second surface of the first substrate layer is bonded to at least one other layer of the IC die.

A method of forming at least one coolant reservoir is described herein. In an embodiment, the method includes providing a first substrate layer that includes a first surface and a second surface. At least one recess is defined in the second surface. The at least one recess is filled with a structural material to form at least one reservoir pillar. The first surface is etched to expose the at least one reservoir pillar at the second surface. The first surface is etched at least one region adjacent to the at least one reservoir pillar to form at least one coolant housing portion. At least one of the first surface or the second surface is bonded to at least one other layer of the IC die.

A method of forming an IC die that includes at least one intra-die cooling structure is described herein. The method includes providing at least one semiconductor substrate layer with at least one coolant channel formed therein. At least one coolant reservoir layer is provided that includes at least one coolant channel interface adapted to be fluidically coupled to the at least one coolant channel. The at least one semiconductor substrate layer is bonded to the at least one coolant reservoir layer such that the at least one coolant channel interface is fluidly coupled with the at least one coolant channel.

A computer-based method of designing a temperature regulated Integrated Circuit (IC) device is further described herein. The method includes acquiring at least one electronic representation of a physical layout of an IC device that includes at least one representation of a plurality of integral device layers and at least one indication of a physical placement of at least one semiconductor device structure embedded in the plurality of integral device layers. At least one electronic representation of a thermal model of the IC is acquired. At least one design parameter is acquired. Based on the at least one thermal model, at least one region of the IC device structure is identified as susceptible to high temperature operation. A physical design of at least one intra-die fluid cooling structure is automatically determined. At least one portion of the fluid cooling structure is adapted to locally interface with the at least one region of the IC device to channel a coolant fluid proximal to the at least one region of the IC device susceptible to high temperature operation.

Another computer-based method of designing a temperature regulated Integrated Circuit (IC) device is described herein. The method includes acquiring at least one electronic representation of a physical design of at least one intra-die fluid cooling structure. Generation of at least one electronic representation of a physical layout of an IC device is enabled. The IC device includes at least one representation of a semiconductor substrate and at least one indication of a physical placement of at least one semiconductor device structure embedded in the at least one semiconductor substrate. At least one electronic representation of said physical design of at least one intra-die fluid cooling structure and at least one electronic representation of a physical layout of said IC device is provided.

A computer-based system for the design of at least one IC device that includes at least one intra-die cooling structure is further described herein. The system includes at least one user interface adapted to receive one or more inputs and present information. The system further includes at least one coolant reservoir module adapted to enable creation of at least one intra-die coolant reservoir. The system additionally includes at least one coolant channel module adapted to enable creation of at least one intra-die coolant channel in fluid communication with said at least one intra-die coolant reservoir. The system further includes at least one multi-physics analysis module constructed to enable verification of said at least intra-die coolant reservoir and said at least one intra-die coolant channel. The system also includes at least one physical design generation module adapted to enable creation of at least one electronic representation of a physical design of said intra-die cooling structure.

A number of other advantages will become apparent from the following Detailed Description of the Preferred Embodiments.

BRIEF DESCRIPTION OF THE DRAWINGS

The invention may be more completely understood in consideration of the following detailed description of various embodiments of the invention in connection with the accompanying drawings, in which:

FIGS. 4A-D illustrate generally various perspective views of one embodiment of an intra-die cooling structure according to various aspects of the invention described herein.

FIGS. 5K-O illustrate generally one embodiment of an intra-die cooling structure that includes cooling structure portions arranged in at least one array according to various aspects of the invention described herein.

FIGS. 6A-F illustrate generally one embodiment of a method of forming an IC die that includes at least one intra-die cooling structure according to various aspects of the invention described herein.

FIGS. 7A-G illustrate generally one embodiment of a method of forming an IC die that includes at least one intra-die cooling reservoir according to various aspects of the invention described herein.

FIGS. 8A-B illustrate generally one embodiment of a method of forming an IC die that includes at least one intra-die cooling structure according to various aspects of the invention described herein.

FIGS. 9A-H illustrate generally one embodiment of a method of forming an IC die that includes at least one intra-die cooling structure according to various aspects of the invention described herein.

Figure 1A:
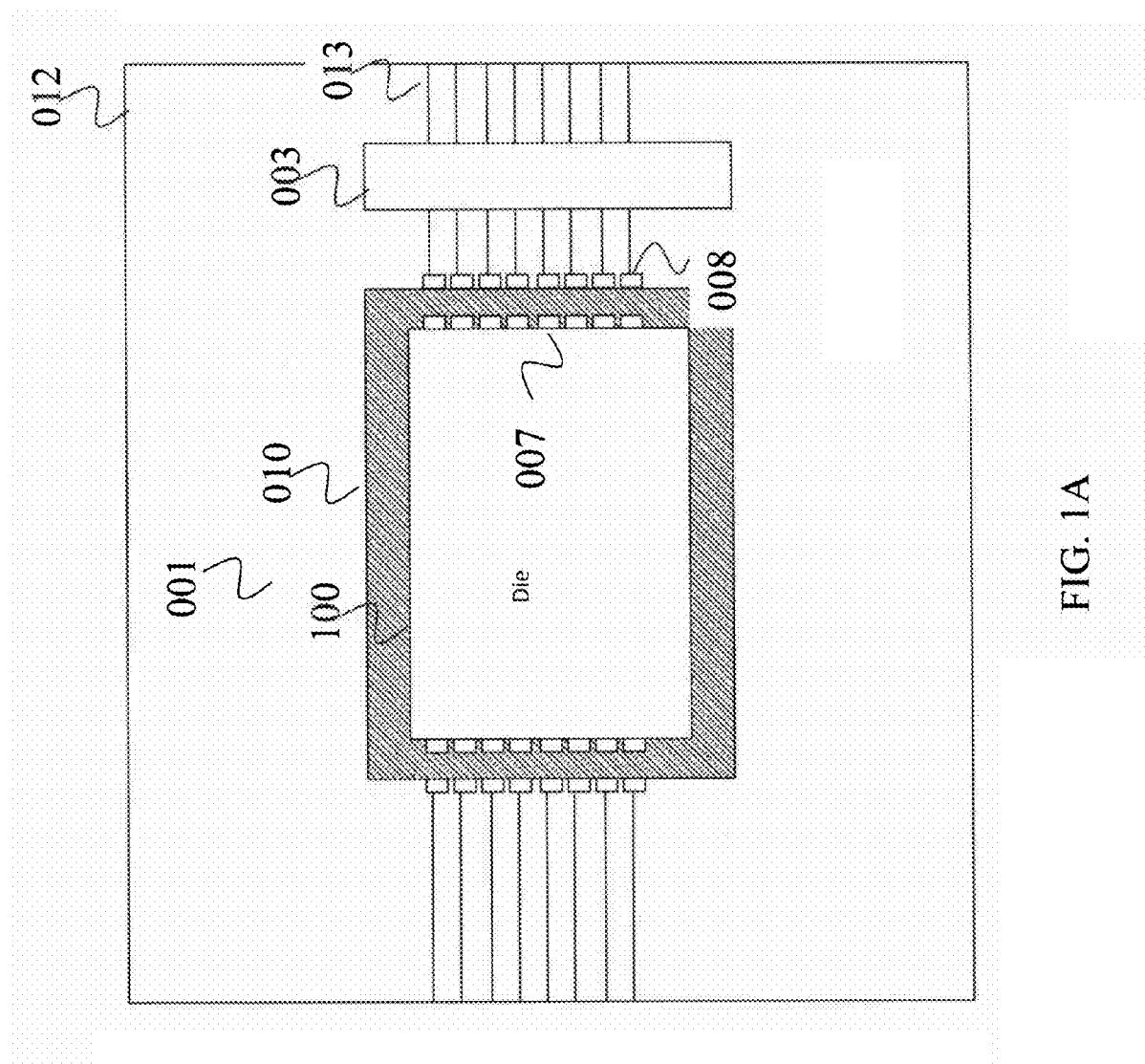
FIG. 1A illustrates generally one example of an IC device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

FIG. 1A illustrates generally one example of a typical IC device 001. As shown, IC device 001 includes one or more semiconductor die 100. Semiconductor die 100 may include any variety of circuits adapted to enable IC device 001 to perform computational, signal processing, or other functions. The circuits may be formed in one or more integral layers of die 100.

As also shown, semiconductor die 100 is housed in package 010. Package 010 is constructed to provide protection to die 100. Package 010 may further be constructed to provide one or more pins 008. Die 100 may include a plurality of pads 007. Pads 007 provide an interface for electrical connection to circuits of die 100. Pads 007 of die 100 are adapted to be electrically connected to pins 008, thus allowing electrical access to functions of die 100 through package 010.

Package 010 may be adapted to be secured to a printed circuit (PC) board 012 or other mounting surface. PC board 012 may include one or more traces 013. Traces 013 of PC board 012 may be electrically coupleable to pins 008 of package 010. Traces 013 may be adapted to enable electrical coupling of IC device 001 to one or more other devices 003.

Figure 1B:
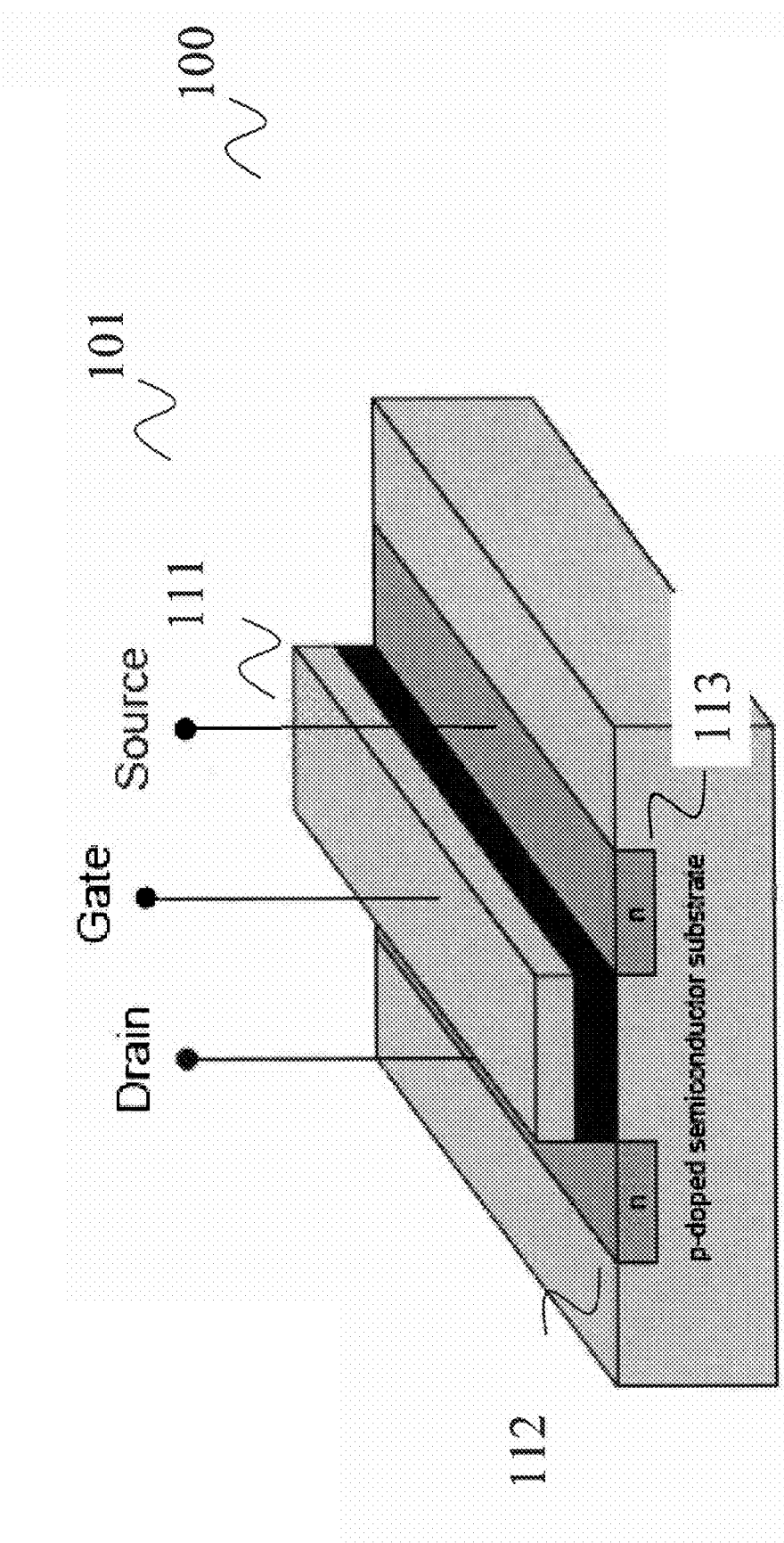
FIG. 1B illustrates generally one example of an IC die.

FIG. 1B illustrates generally a semiconductor device structure, transistor 101, embedded in die 100. Transistor 101 includes a gate 111, a drain 112, and a source 113. Transistor 101 may be operative such that when a voltage is applied across gate 111 and drain 112, or gate 111 and source 113, a current is caused to flow. By operating as such, transistor 101 may be utilized as an electrical switch. Multiple transistors 101 may be electrically interconnected in various ways to form analog and/or digital circuits. These circuits may be interconnected to that enable IC device 001 to perform computational, signal processing, or other functions.

Figure 1C:
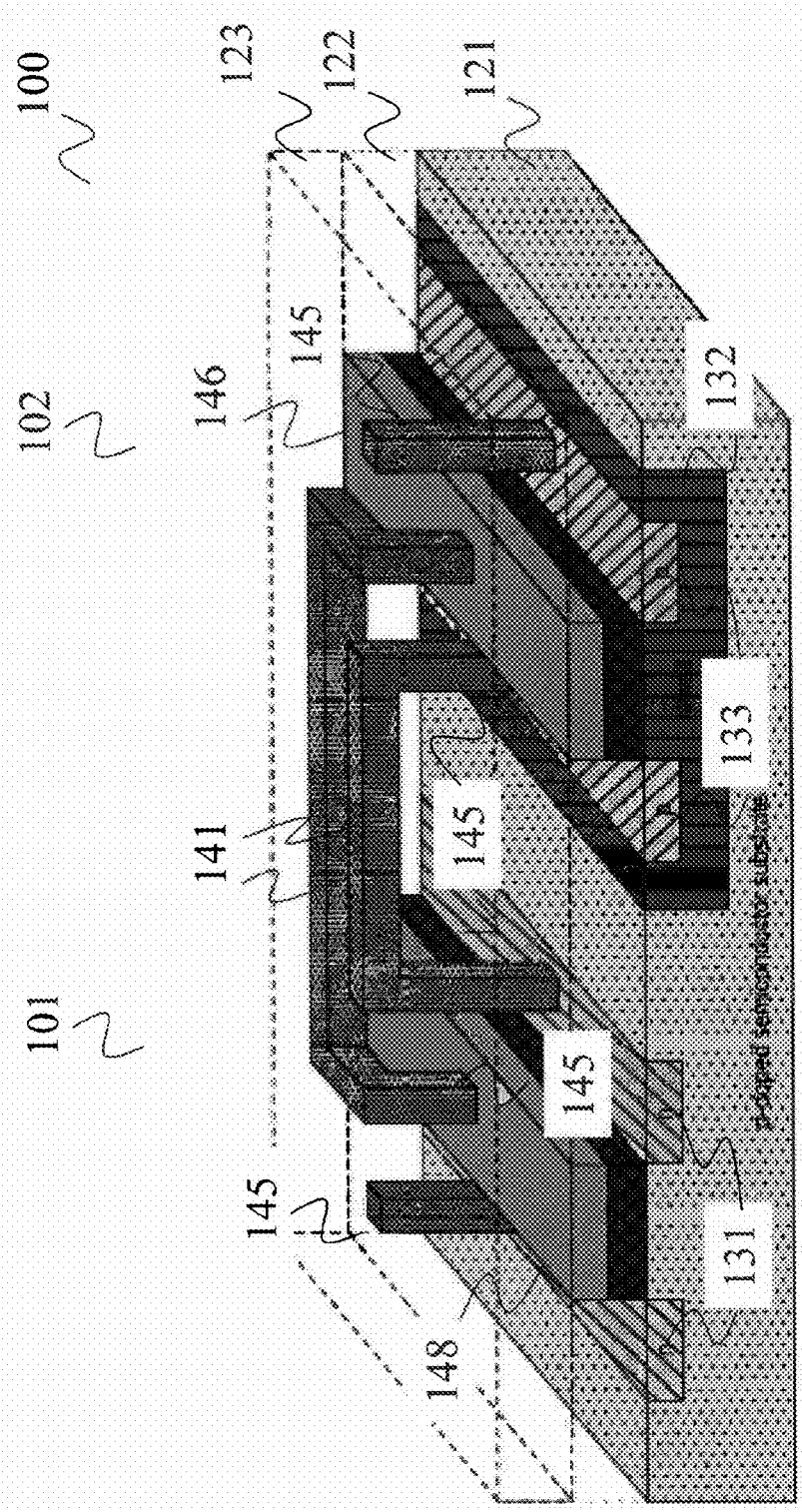
FIG. 1C illustrates generally one example of an IC die.

FIG. 1C illustrates generally one example of a simple circuit embedded in a die 100. Die 100 depicts a highly simplified example of a typical IC die 100 that includes two semiconductor device structures, transistors 101 and 102. One of skill in the art will recognize that this simplified version of die 100 is provided for exemplary purposes only, and that die 100 may include up to many millions of semiconductor device structures. Also, the depicted example shows CMOS transistors embedded in semiconductor die 100, however one of skill in the art will recognize that any transistor, or other structure embedded in a die, is within the spirit and scope of the invention described herein.

Further, discussions herein are primarily directed to liquid-based cooling of one or more IC die 100. However, the systems, methods, and devices described herein may be applied to any die-based device, including optical, MEMS, or other devices.

As shown, IC die 100 includes semiconductor substrate layer 121, metal layer 122, and routing layer 123. Substrate layer 121 is composed of silicon or similar material. To form IC device structures, for example transistors 101 and 102 of die 100, substrate layer 100 is doped, or embedded with selected impurities, to achieve desired electrical properties. IC die 100 of FIG. 1C depicts substrate 121 doped with impurities to create N-regions 131, N-well region 132, and P+ 133 regions in an upper portion of substrate layer 121. These doped regions are constructed to facilitate an electrical current to flow between them under certain conditions.

Metallization layer 122 is adapted to enable electrical coupling to doping regions 131-133. Metallization layer 122 includes contact vias 145, and gates 146 and 148. Transistor 101 includes gate 148 of metallization layer 122 disposed upon n-doped regions 131 and substrate layer 121. Similarly, transistor 102 includes gate 146 formed upon n-well region 132 and p-doped regions 133. Substrate layer 121 and metallization layer 122 in combination form transistors 101 and 102. As such, these layers may be referred to as device layers.

Transistors 101 and 102 are operable such that a voltage at gate 146, 148 and respective doping regions 132, 133, and 131 may cause a current to flow between doping regions 132, 133, and 131. Vias 145 are arranged to enable electrical connections between semiconductor substrate layer 121 metallization layer 122, routing layer 123, or any other layer of die 100.

Routing layer 123 may include a plurality of metal "routes" 141, or electrical connections adapted to electrically couple semiconductor device structures of die 100, or to extend electrical connections within die 100 out to pads 007 of die 100. In the example shown, route 141 and vias 145 are arranged to electrically couple a gate of transistor 101 to a gate of transistor 102. Similarly, other routes 141 and vias 145 are arranged to electrically couple n– doping region of transistor 101 to p+ doping region of transistor 102.

The term die as utilized herein is directed to a multi-layer semiconductor component having at least 3 integral layers such as layers 121-123. Likewise, the term intra-die cooling structure as discussed below refers to the formation of at least one cooling structure wholly within such a die that includes at least three integral layers. The term intra-die cooling structure may refer to cooling structures formed at least partially within traditional layers of an IC die such as layers 121-123. The term intra-die cooling structure may further refer to cooling structures formed in dedicated cooling structure layers formed integral to other die layers 121-123. One of skill in the art will recognize that such dedicated layers may be formed integral to and in any position or orientation with respect to traditional integral layers of a die.

Figure 1D:
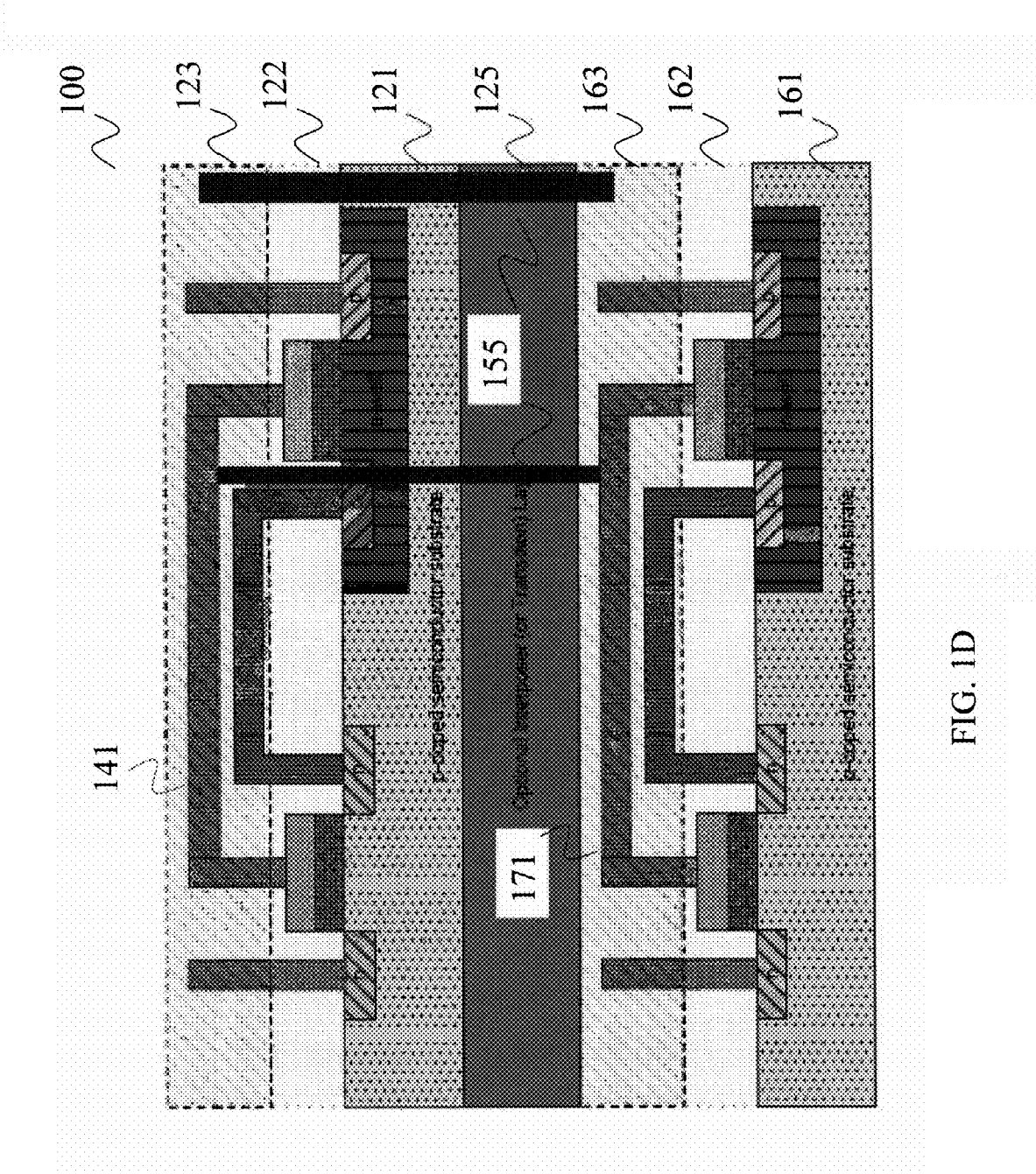
FIG. 1D illustrates generally one example of a multi-substrate IC die.

FIG. 1D illustrates generally a side perspective view of one example of an IC device that includes multiple substrate layers 121, 161. In the illustrated embodiment, die 100 includes substrate layer 121, metallization layer 122, and routing layer 123. Die 100 further includes substrate layer 161, metallization layer 162, and routing layer 163. Disposed between and integral to routing layer 163 and substrate layer 121 is insulator layer 125. Insulator layer 125 is adapted to electrically isolate layers 121, 122, and 123 from layers 161, 162, and 163. Insulator layer 125 may further provide functional benefits for transistor 101, 102 operation, such as a reduction of leakage currents. In other examples not shown in FIG. 1C, a multi-substrate IC device may be formed of multiple layers of die not separated by insulator layer 125.

Device 002 further includes inter-substrate vias 155. Inter-substrate vias 155 provide electrical connection between routes 141 of routing layer 123 and routes 171 of routing layer 163.

Multi-substrate IC devices provide advantages over single substrate designs. For example, more circuits may be formed in a single IC package, thus improving IC density. Also, using inter-substrate vias 135, electrical connections may be made shorter, thus simplifying timing requirements. Multi-substrate IC devices present significant obstacles, however, in the form of increased susceptibility to heat. Not only are more transistors arranged in proximity to one another, insulator layer 125 may prevent heat removal.

The embodiment illustrated in FIGS. 1A-C shows an IC die that includes only three primary layers. One of skill in the art will recognize that a typical IC die may include many layers not described herein. One of skill will further recognize that any number or combination of IC die layers is within the spirit and scope of the invention described herein.

A typical IC die includes many electrical circuits made up of transistors and other IC structures such as capacitors, inductors, resistors, and the like. The number of IC structures that can be fit in a single IC die may be many millions.

Electrical circuits adapted to perform different electrical functions of an IC device may incorporate varying numbers of IC device structures arranged in different densities and/or that operate at different speeds. For example, an IC device may include a microprocessor circuit and a memory circuit. A microprocessor may require faster speeds than a memory circuit, and transistors of the microprocessor circuit may be packed more closely together. They may also operate at faster rates. Thus the microprocessor regions of a die may generate more heat than the memory regions. As a result, operational temperatures may vary substantially between various regions of an IC die. Operational temperatures may further vary in a horizontal or vertical dimension.

Figure 2:
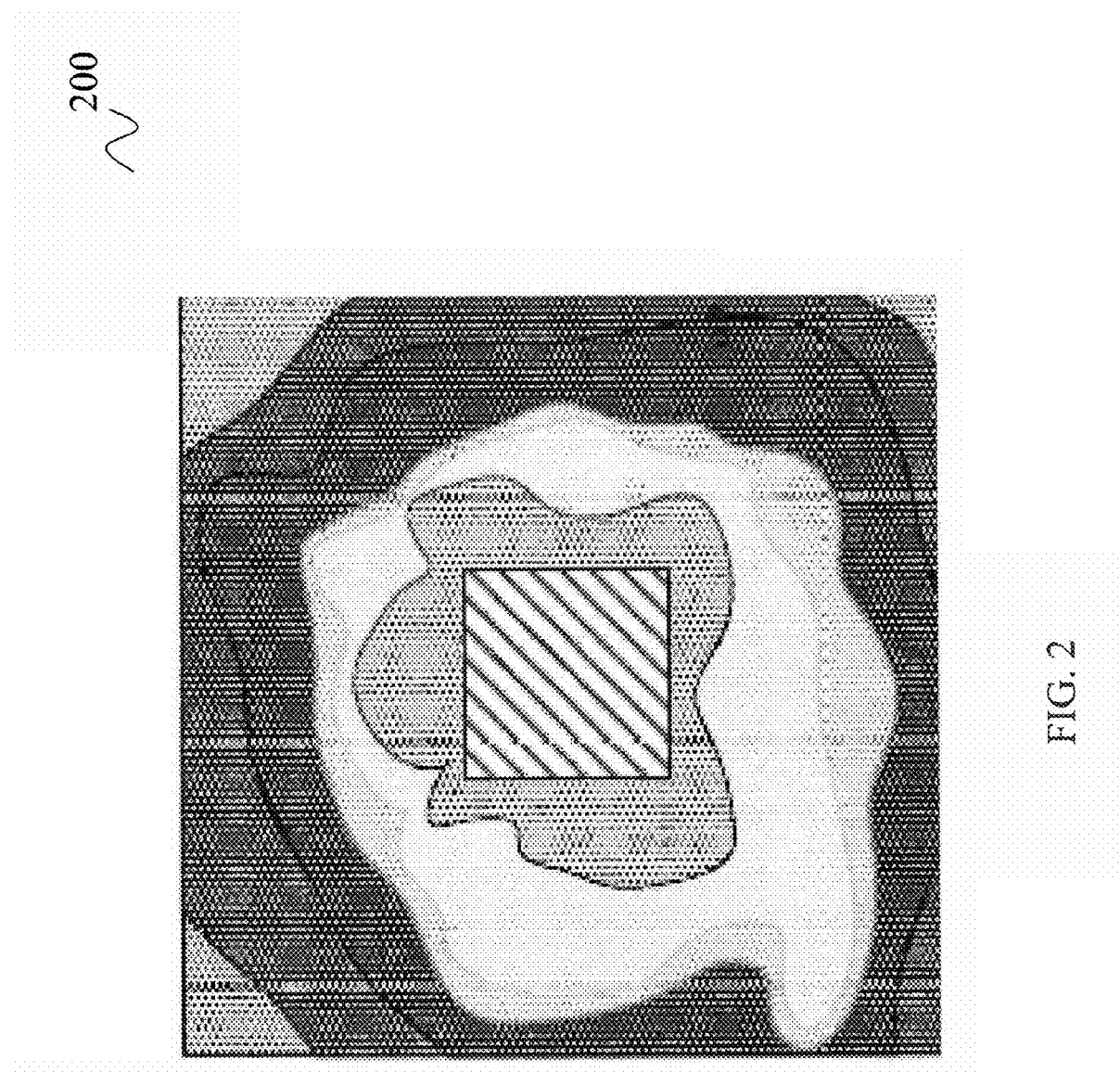
FIG. 2 illustrates generally one example of a thermal profile of an IC die.

FIG. 2 illustrates generally a temperature profile of an exemplary semiconductor die 200. As illustrated, an operation temperature of die 200 is not constant across the surface of die 200. FIG. 2 shows a top-down temperature profile of die 200. An operating temperature of die 200 may also vary across a cross sectional dimension of die 200. Further, FIG. 2 only shows a single "hot spot", or region of higher temperature, of die 200. Die 200 may also have multiple "hot spots" at different regions of die 200. Die 200 may also have one or more "cool spots" with a lower relative operating temperature.

Relative hot and cool operating regions of an IC may create significant problems in the design and operation of die 200. For example, temperature variations may cause disparity in operating speeds, thus potentially causing data or reliability issues, or even failure. As such, a need exists to manage operating temperatures of IC die 200 to remove heat from die 200 and/or normalize operating temperatures die 200 or regions of die 200.

Figure 3A:
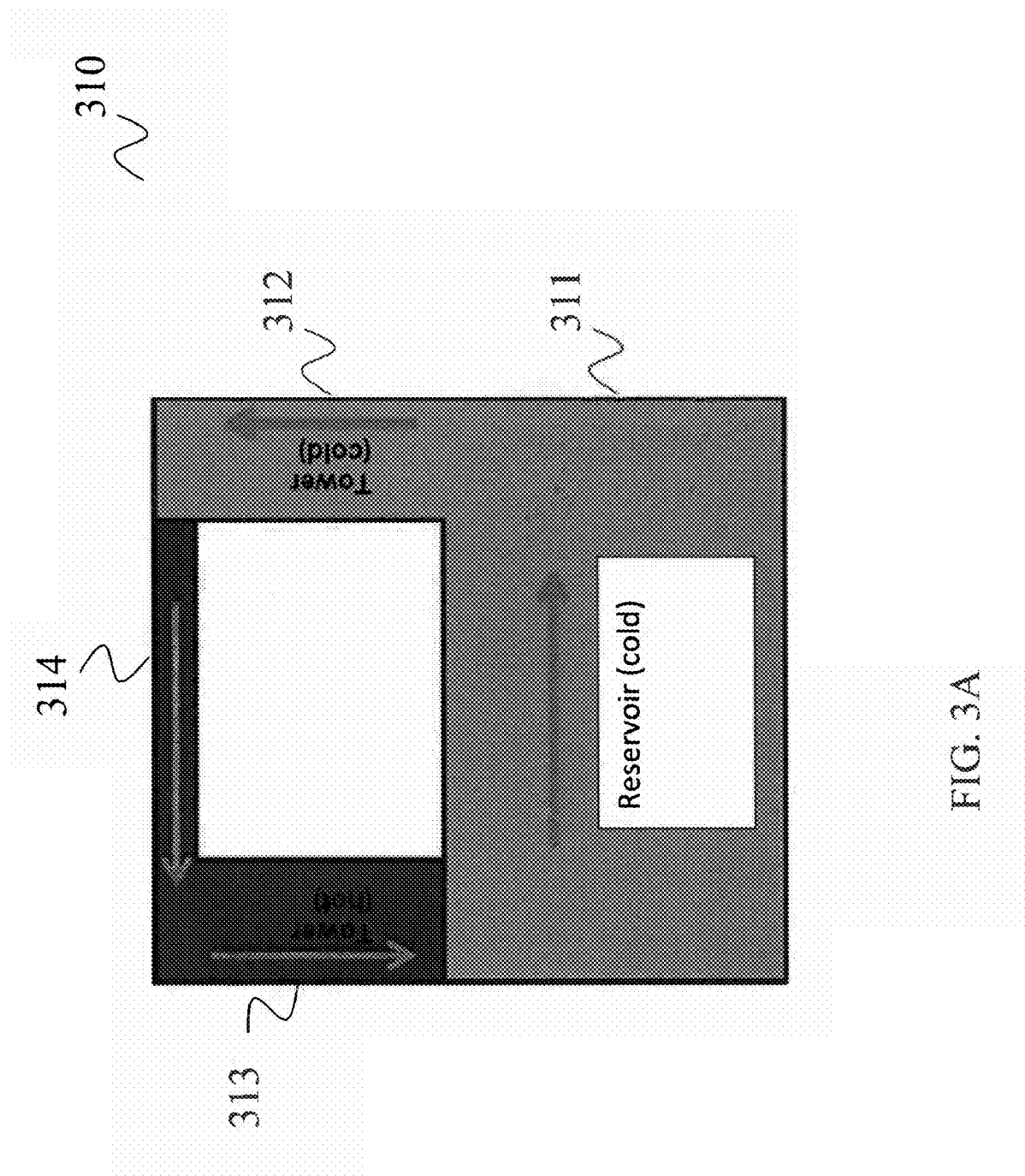
FIGS. 3A-B illustrate generally one embodiment of an intra-die cooling structure according to various aspects of the invention described herein.
Figure 3B:
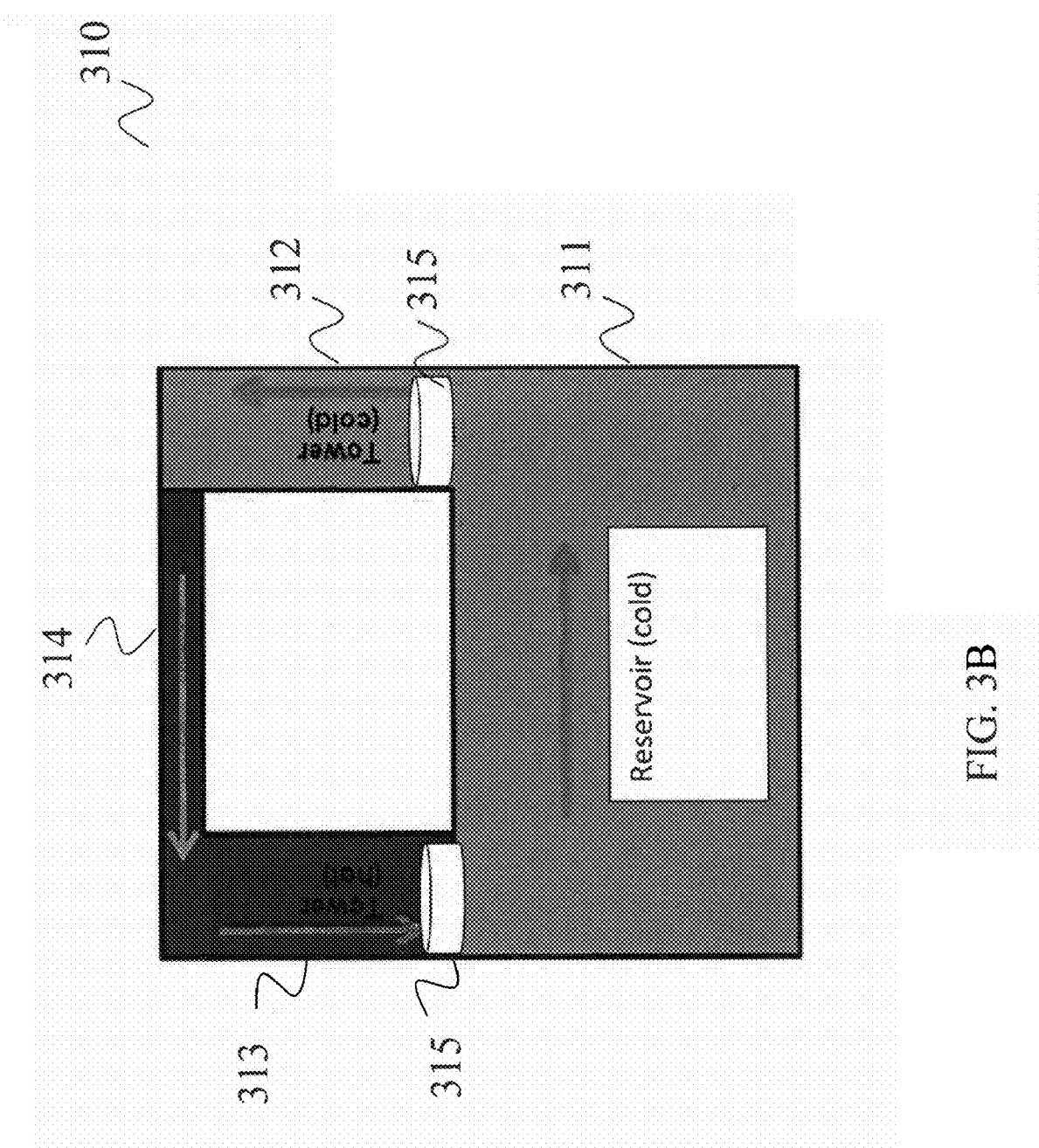

FIGS. 3A and 3B illustrate generally a block diagram of one embodiment of an intra-die fluid cooling structure 310 adapted to operate by natural convection according to various aspects of the invention described herein. As shown in FIG. 3A, cooling structure 310 is adapted to circulate fluid internal to an IC die to provide localized transfer of heat between regions of the die.

In the embodiment depicted, structure 310 includes a fluid reservoir 311 and both inter-layer 312, 313 and intra-layer coolant channels 314. Channels 312-314 are coupled to reservoir 311 to enable circulation of a coolant fluid. In an embodiment, coolant channels 312-314 enable a localized thermal interface with regions of an IC die such that a coolant fluid may be circulated in proximity to regions of the die to manage heat. In various embodiments, cooling structure 310 is adapted such that cooler fluid held in reservoir 311 is transferred local to IC device structures via channel 312, is brought local to IC device structures via channel 314, and is returned to reservoir 311 via channel 313.

In the embodiment shown in FIG. 3A, cooling structure 310 is adapted to circulate a coolant fluid by natural convection. Natural convection is the gravity and/or generally accelerated movement of a fluid or gas from one location to another caused by density changes of the fluid or gas due to temperature differentials between the locations. As discussed above with respect to FIG. 2, IC die may have regions that operate at relatively hotter or cooler temperatures. As such, cooling structure 310 may be selectively arranged to cause coolant fluid to flow from reservoir 311, local to hotter regions of die 100, and back. Cooling structure 310 may further be selectively arranged to cause coolant fluid to flow from hot to cool, or from cool to hot, regions of the die. In an embodiment, electrical circuits of die 100 may be arranged or re-arranged to create, remove, or otherwise modify hot and/or cool spots of die 100.

FIG. 3B illustrates generally a block diagram of operation of an intra-die fluid cooling structure adapted to operate at least in part by forced convection according to various aspects of the invention described herein. As shown, intra-die cooling structure 310 includes one or more fluid transfer elements 315. In various embodiments, fluid transfer elements 315 may be adapted to cause or accelerate movement of fluid through channels 312-314. In an embodiment, fluid transfer elements 315 may be MEMS based. For example, fluid transfer elements 315 may be one or more micro-fluidic pumps, as for example electrophoretic pumps, diaphragm pumps, or peristaltic pumps. In another embodiment not depicted, cooling structure 310 may be constructed to operate based on both natural convection and forced convection. According to these embodiments, construction of channels 312-314 may be selected to enable natural convection flow, however flow acceleration may be assisted by one or more fluid transfer elements 315.

In various embodiments, selection of an arrangement of cooling structure 310 is design specific. For example, location of reservoir 311, channels 312-314, and fluid transfer elements 315 may depend on the amount of temperature normalization or dissipation required, operating temperature of a design, obstacles to structure 310 location, a number of hot or cool spots, an expected orientation of die 300 in an IC package or electronics device, or other considerations. For a specific design, cooling structure 310 may be arranged in a variety of positions, with any number of reservoirs 311 or channels 312-314, or with reservoirs 311 or channels 312-314 of different sizes, shapes, or configurations to provide desired temperature management.

FIGS. 4A-4D and FIGS. 5A-L illustrate generally various embodiments of intra-die cooling structures 410 formed in a semiconductor die 400. Some of these embodiments show portions of cooling structures formed in various IC device layers that are typically included in an IC die such as substrate layer 421, metallization layer 422, or routing layer 423. In other embodiments portions of cooling structures may be formed in layers dedicated to cooling structure portions. The various embodiments depicted below are provided for exemplary purposes only, and one of skill in the art will recognize that the intra-die cooling structures described herein may be formed in any integral layer of an IC die, including any layer that serves any purpose, whether or not specifically described herein. One of skill will further recognize that cooling structures portions may be formed in a plurality of die layers and/or between die layers, for example as a channel formed with opposed halves in adjacent layers.

Figure 4C:
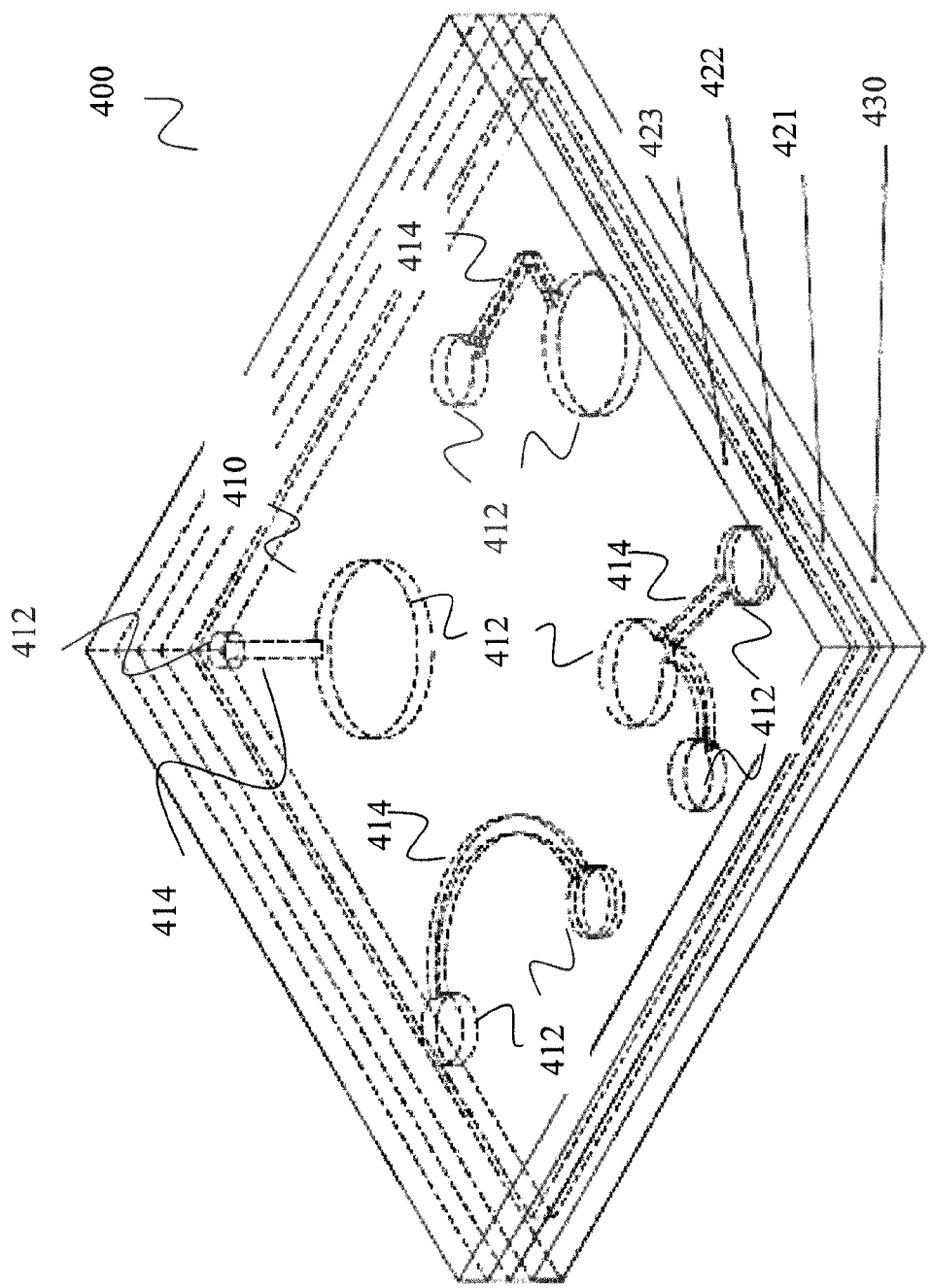
Figure 4D:
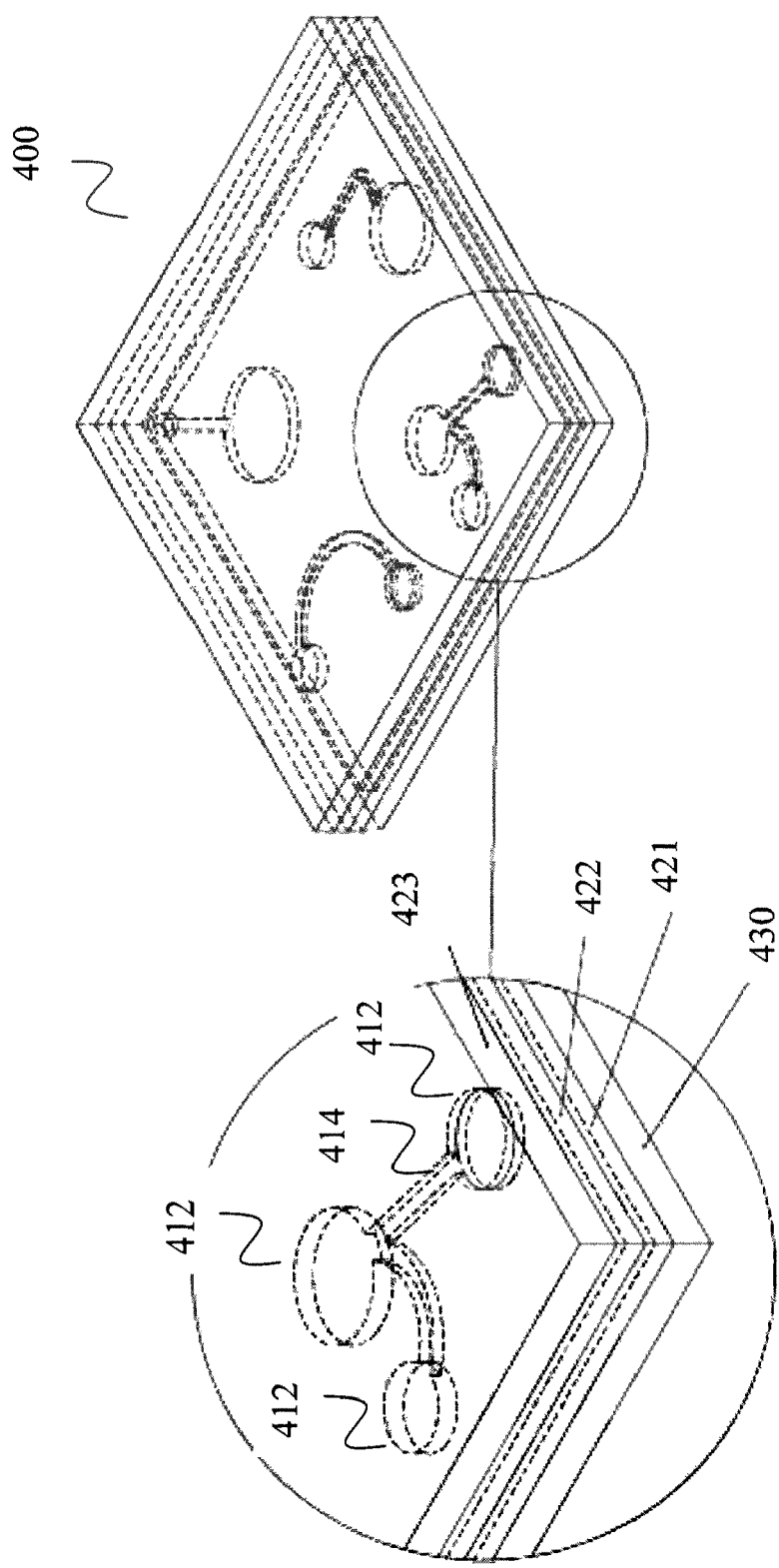

FIGS. 4A-D depict one embodiment of a cooling structure 410 that includes intra-layer cooling channels formed in a semiconductor substrate layer 421 of die 400. FIG. 4A depicts a top perspective view of die 400, FIG. 4B depicts a side view of die 400, FIG. 4C depicts an angular perspective view of die 400, and FIG. 4D depicts a cutout angular perspective view of die 400.

As shown, die 400 includes reservoir layer 430. In the depicted embodiment, reservoir layer 430 is a dedicated layer for reservoir 411. In an embodiment, reservoir layer 430 is an additional layer of die 400 other than traditional IC layers such as layers 121, 122, and 123 as depicted in FIGS. 1A-C discussed above. Reservoir layer 430 is integral to substrate layer 422, however reservoir layer 430 may be arranged at any position with respect to die layers 421-423.

As depicted in FIG. 4B, reservoir 411 is in fluid communication with one or more inter-layer fluid channels 412. Inter-layer fluid channels 412 may be adapted to provide a conduit for fluid to flow between reservoir 411 and intra-layer channels 414 of substrate layer 422. In various embodiments, channels 412 and 414 may be adapted to thermally interface with local regions or structures of die 400 to transfer heat.

In various embodiments, reservoir 410 is adapted to provide an exit path for heat to be removed from die 400. According to these embodiments, reservoir 411 may be thermally coupled to one or more heat removal elements external or internal to die 400. In one such embodiment, reservoir may be thermally coupled to one or more heat sinks external to die. In another embodiment, reservoir 411 may be thermally coupled to one or more extra-die fluid channels disposed on a surface of die 400 or elsewhere.

The embodiment depicted in FIGS. 4A-C provides a fully enclosed cooling solution by intra-die cooling structure 410 formed wholly within integral layers of 421 and 430 of die 400. By forming cooling structure 410 wholly intra-die, fluidic connection external to die 400, for example within or without a package of an IC device, is unnecessary. Because such external fluid connections are not required, production of IC devices incorporating cooling structures is simplified.

Figure 5A:
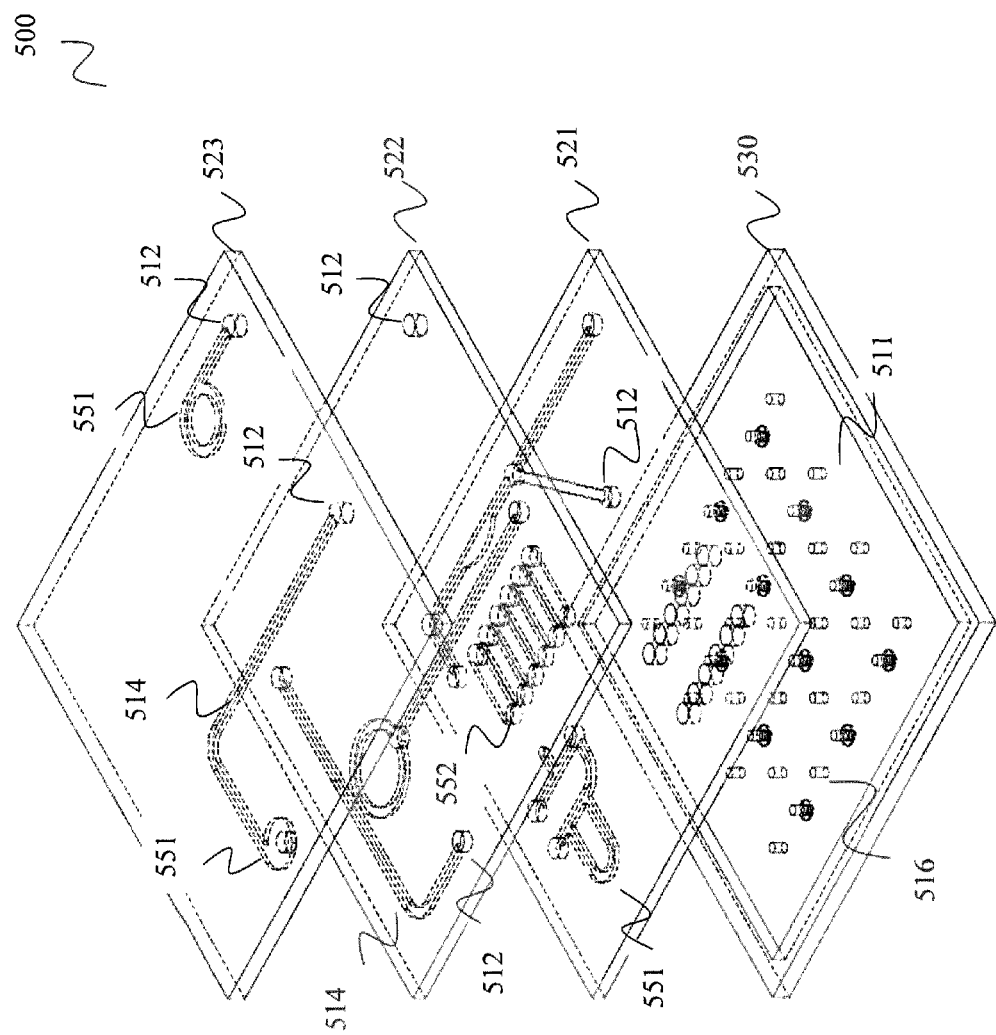
FIGS. 5A-F illustrate generally various perspective views of one embodiment of a multi-layer intra-die cooling structure according to various aspects of the invention described herein.
Figure 5B:
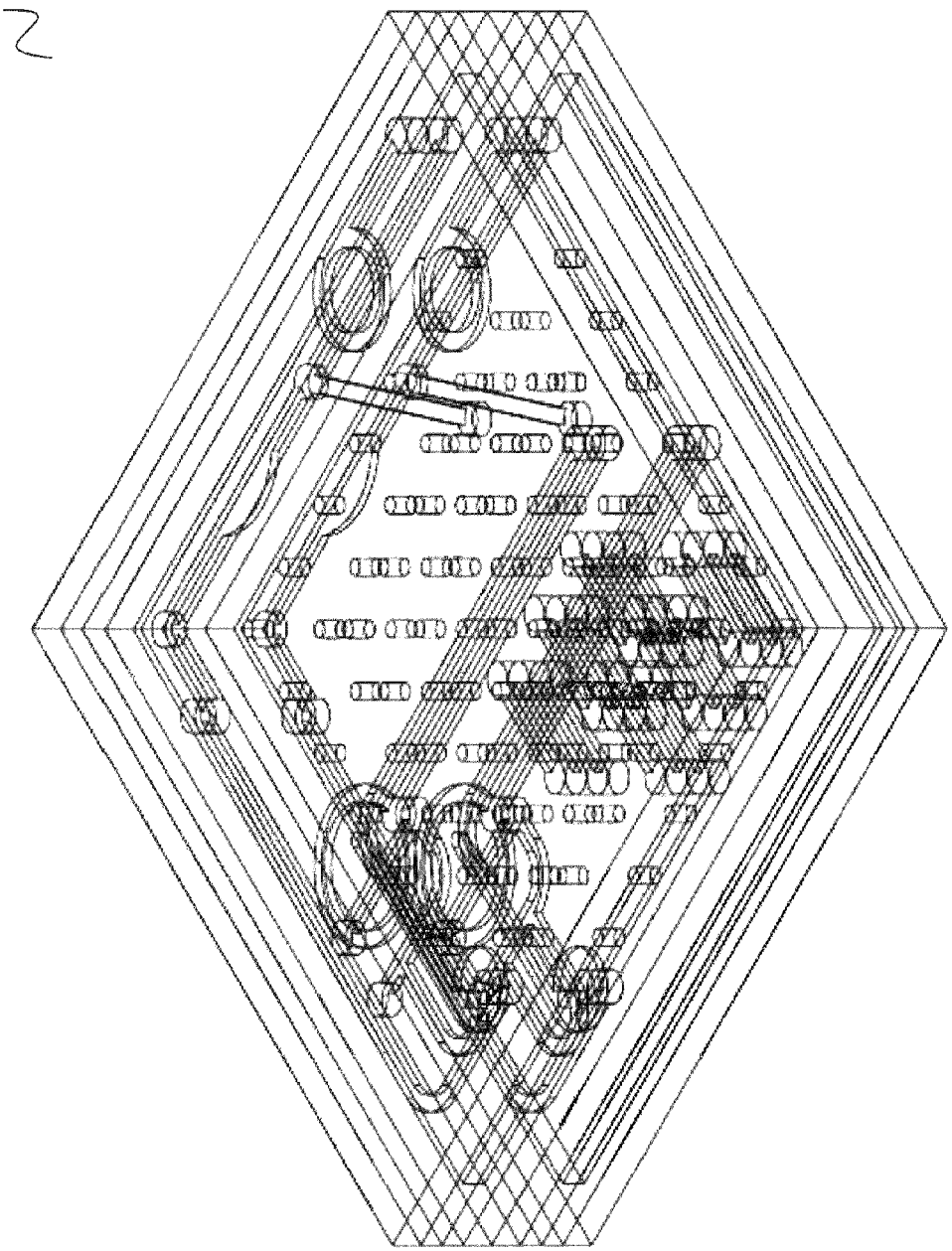
Figure 5C:
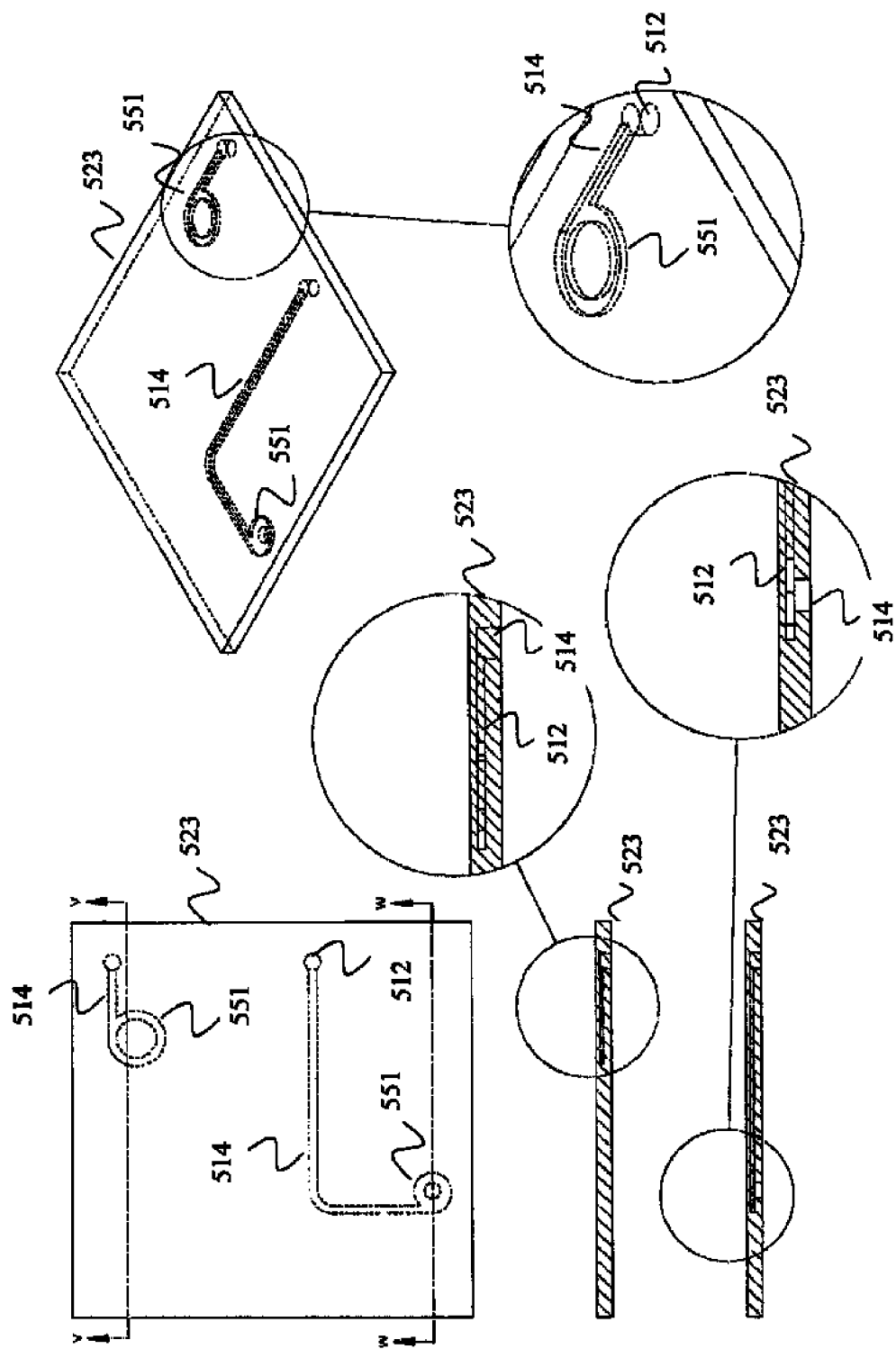
Figure 5D:
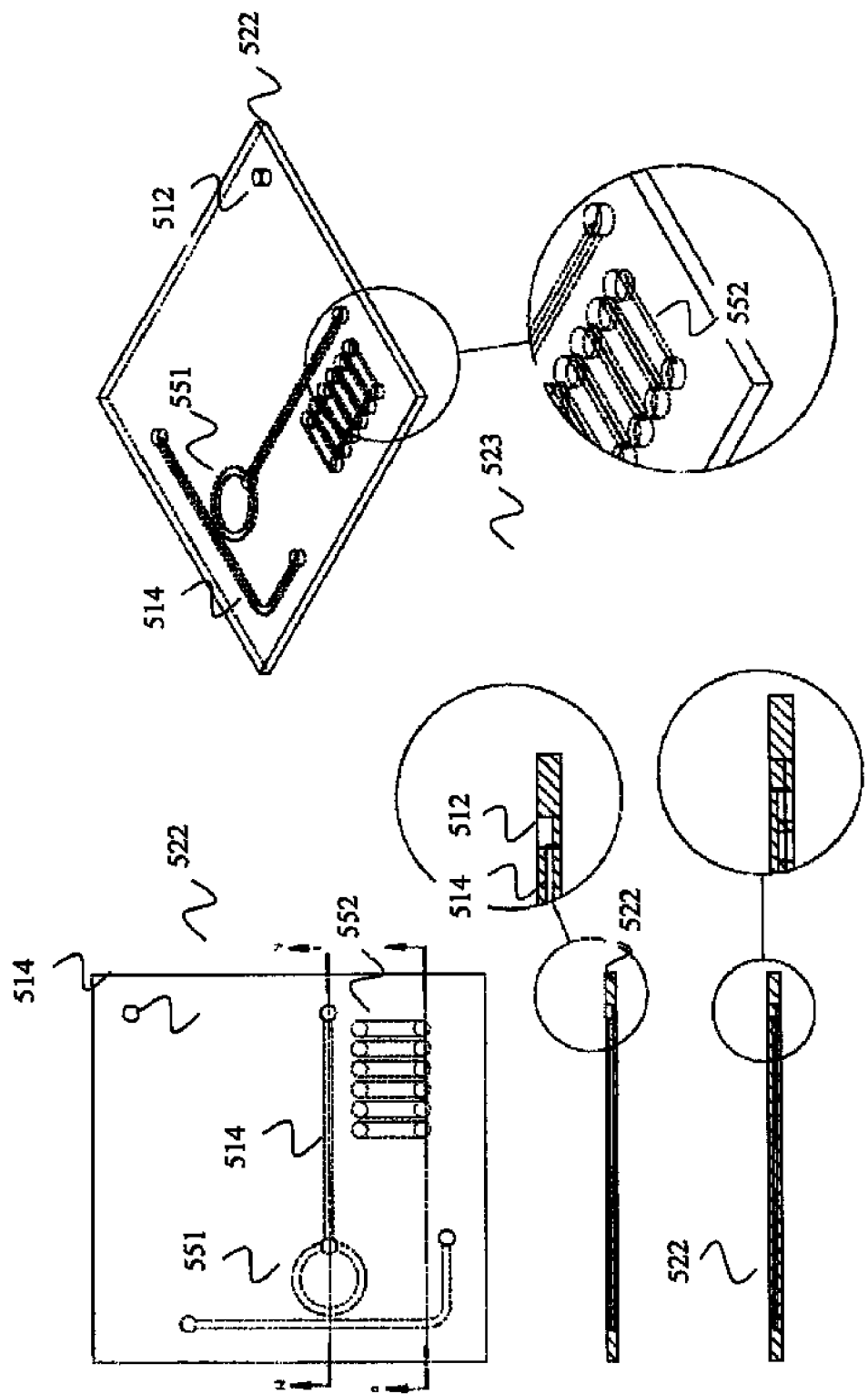
Figure 5E:
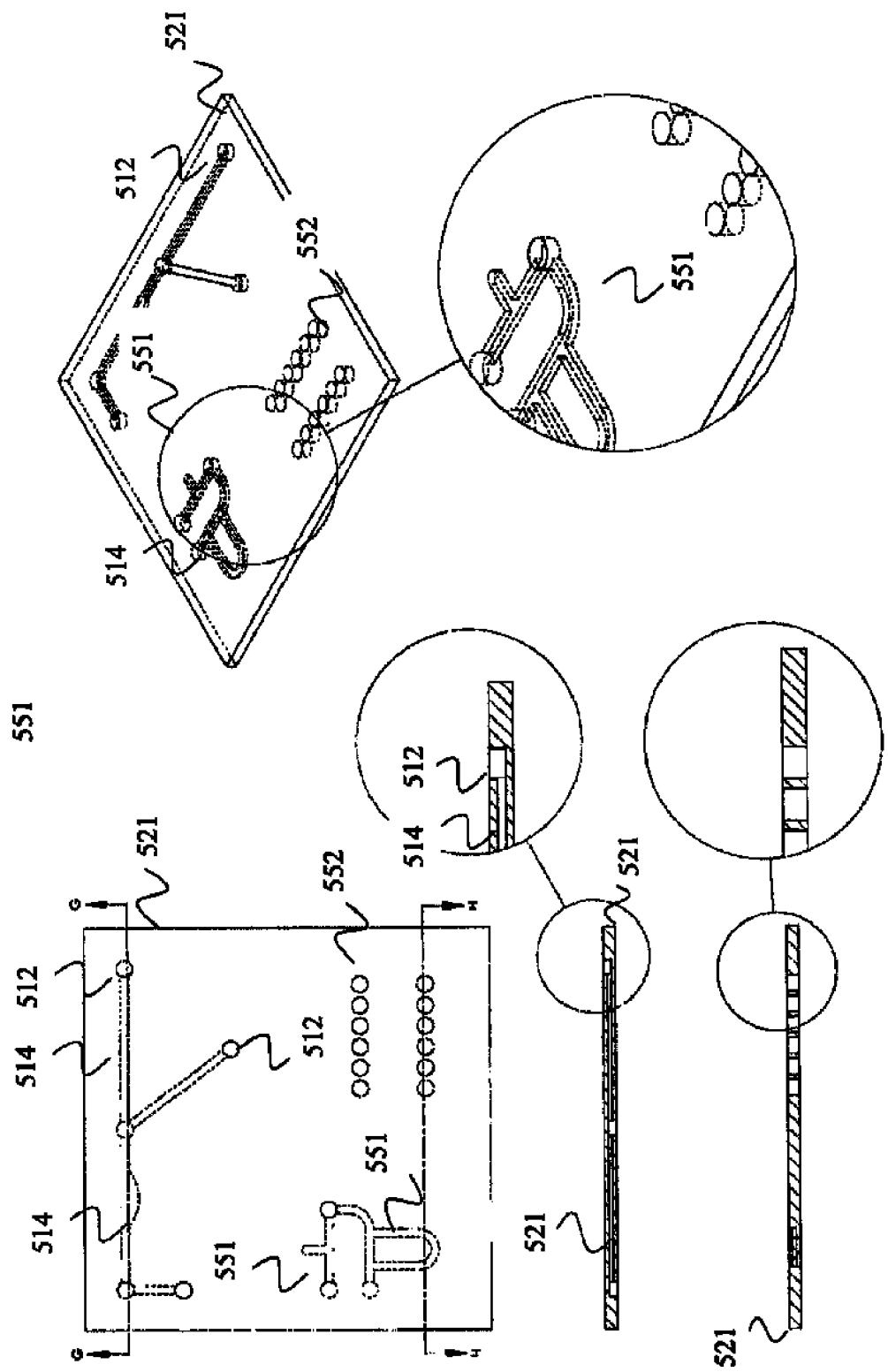
Figure 5F:
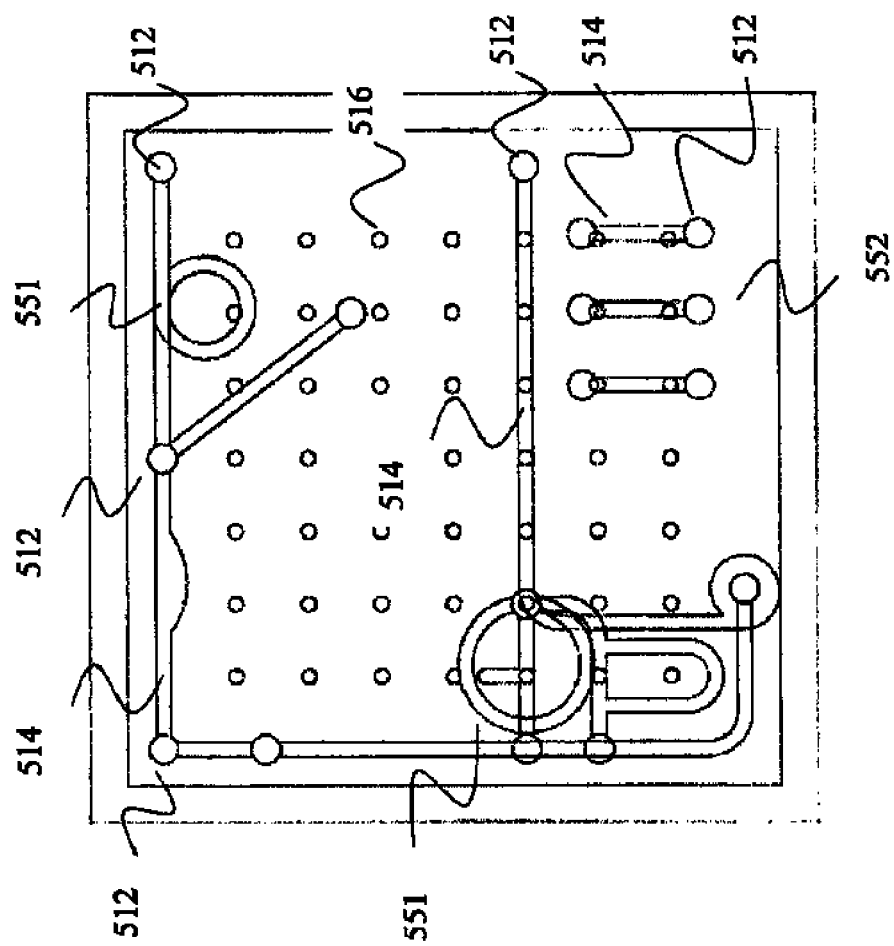

FIGS. 5A-C illustrate generally embodiments of cooling structures 510 that include intra-layer cooling channels 514 on more than one integral layer of an IC die 500 according to various aspects of the invention described herein. FIG. 5A shows a perspective expanded view of die 500, FIG. 5B shows die layers formed into die 500. FIGS. 5C-E depict various perspective views of IC layers 521-523, and FIG. 5F shows a top down perspective view of die 500.

Similar to the embodiment of FIGS. 4A-4C, FIG. 5 depicts an IC die 500 that includes a reservoir layer 530, substrate layer 521, metal layer 522, and routing layer 523. Cooling structure 510 includes inter-layer channels 512 configured as a fluid path between reservoir 511 and intra-layer channels 514 disposed in or between layers 521-523.

As depicted, both inter and intra-layer channels 512, 514 are formed in a variety of configurations. For example, channel structures 551 are configured at least partially surround respective regions of layers 521-523. These structures may be formed to dissipate heat from die regions that are susceptible to particularly high operating temperatures. In other embodiments not shown, channels 512-514 may be constructed to at least partially surround one or more regions of die 500 inter-layer, for example intra-layer channels formed at similar positions on different layers, or inter-layer channels formed at opposed positions to surround a region of die 500.

Cooling structure 510 further includes channel array configuration 552. In an embodiment, uniform configuration 552 of cooling channels 512, 514 may be employed for device structures of uniform arrangement and/or temperatures. For example, a channel array configuration may be employed for temperature management of a series of microprocessor circuits with similar characteristics.

Figure 5G:
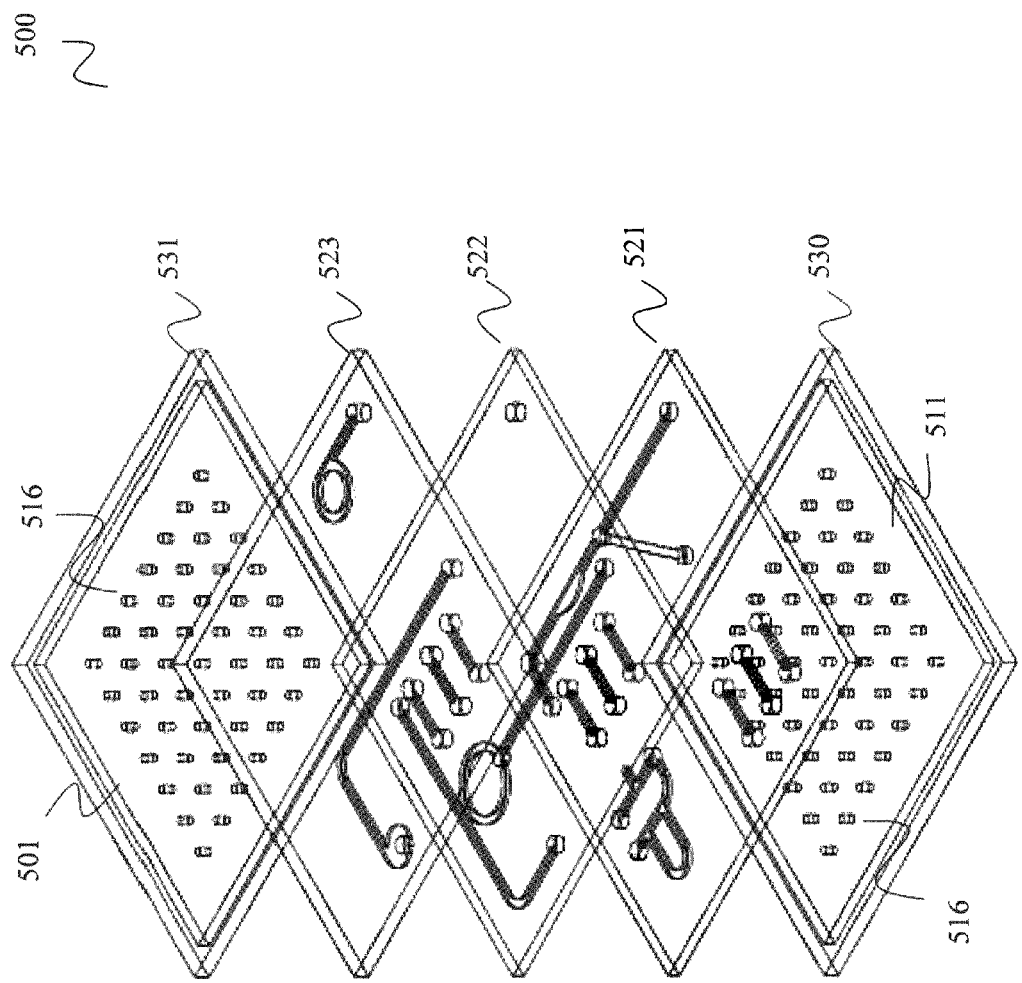
FIGS. 5G-H illustrate generally one embodiment of an intra-die cooling structure that includes a plurality of reservoirs according to various aspects of the invention described herein.
Figure 5H:
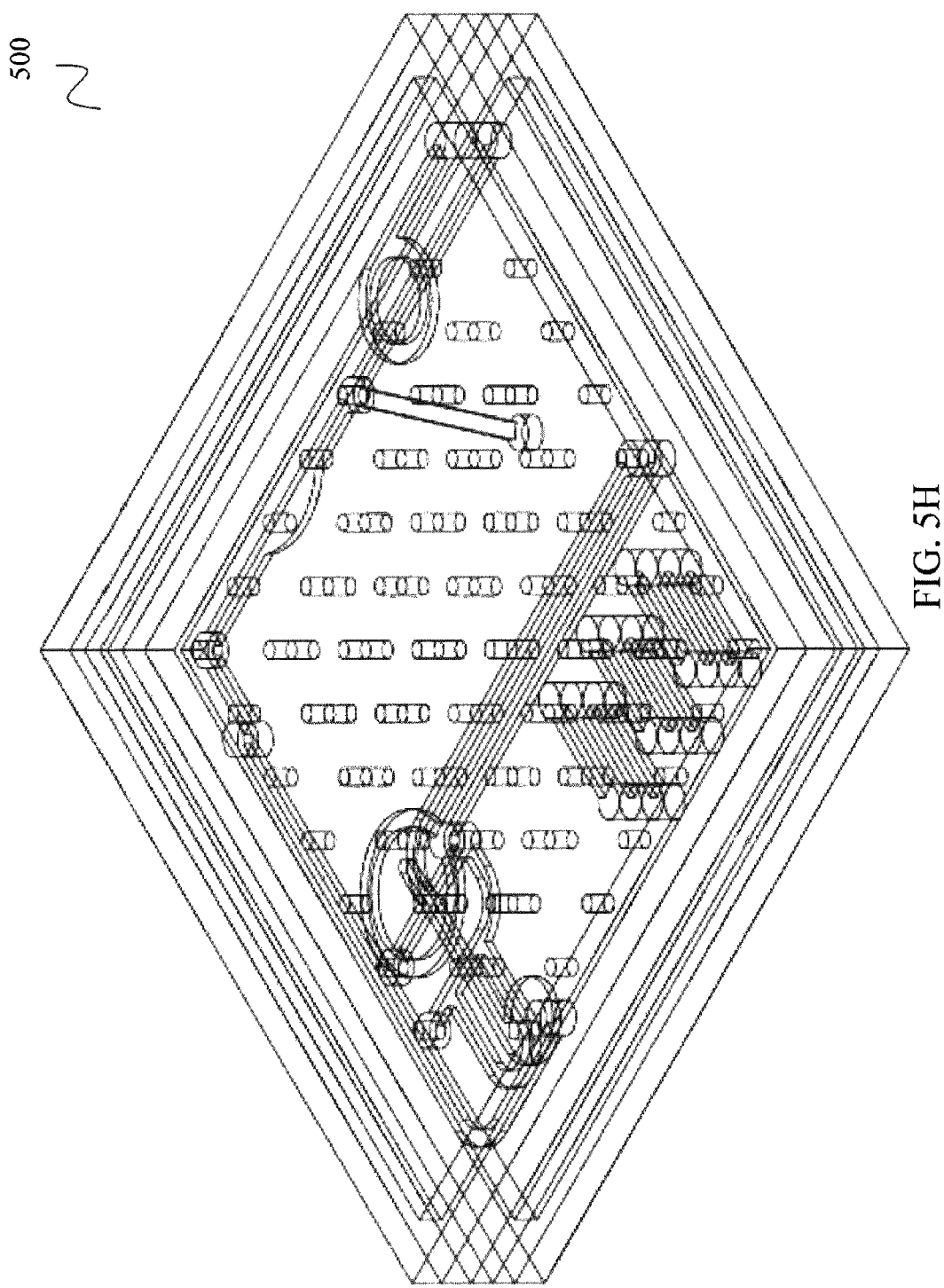

FIGS. 5G-H illustrate generally one embodiment of a cooling structure 510 that includes more than one reservoir 511 according to various aspects of the invention described herein. As depicted, in addition to reservoir 511 of reservoir layer 530 disposed adjacent to substrate layer 521, a second reservoir 501 is shown disposed in a second reservoir layer 531. In the depicted embodiment, second reservoir layer 531 is disposed integral to routing layer 523, however first reservoir layer 530 and/or second reservoir layer 531 may be disposed integral to any layer of die 500 without departing from the spirit and scope of the invention described herein.

Figure 5I:
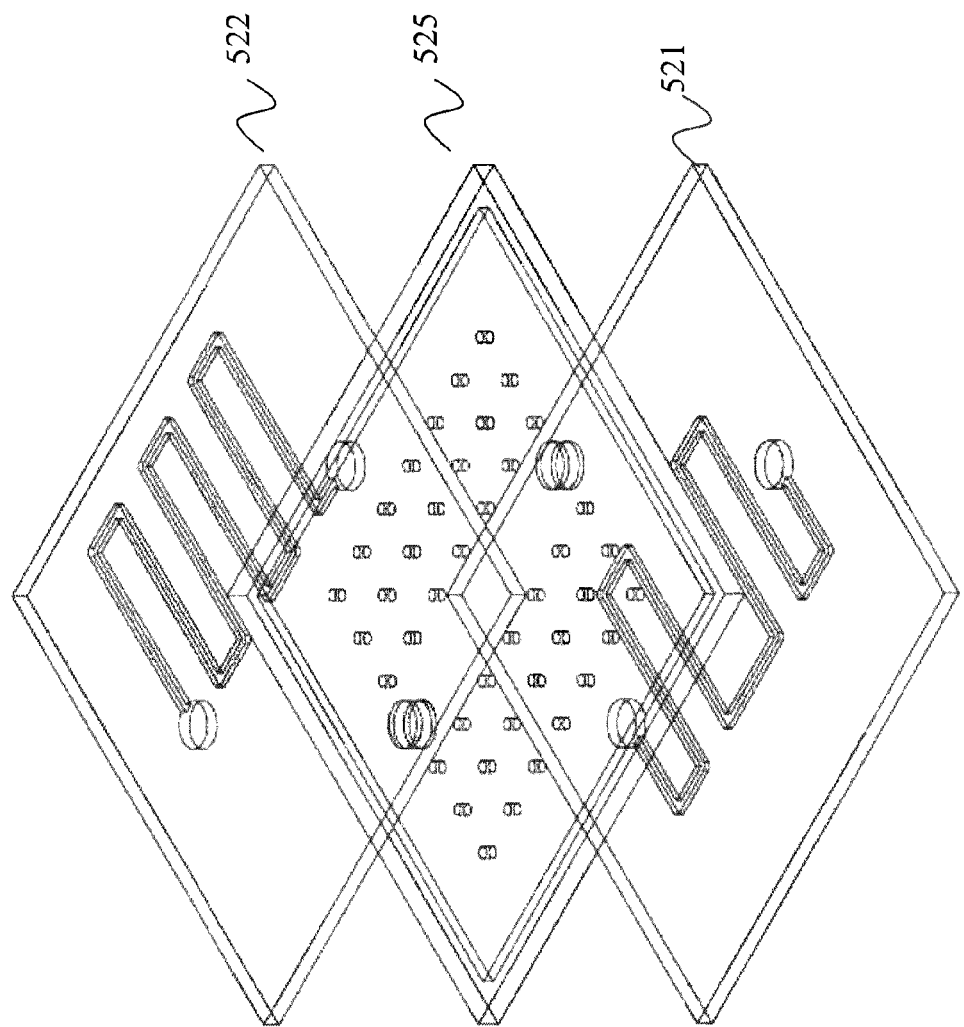
FIGS. 5I-J illustrate generally one embodiment of an intra-die cooling structure that includes a reservoir between integral layers of an IC die according to various aspects of the invention described herein.
Figure 5J:
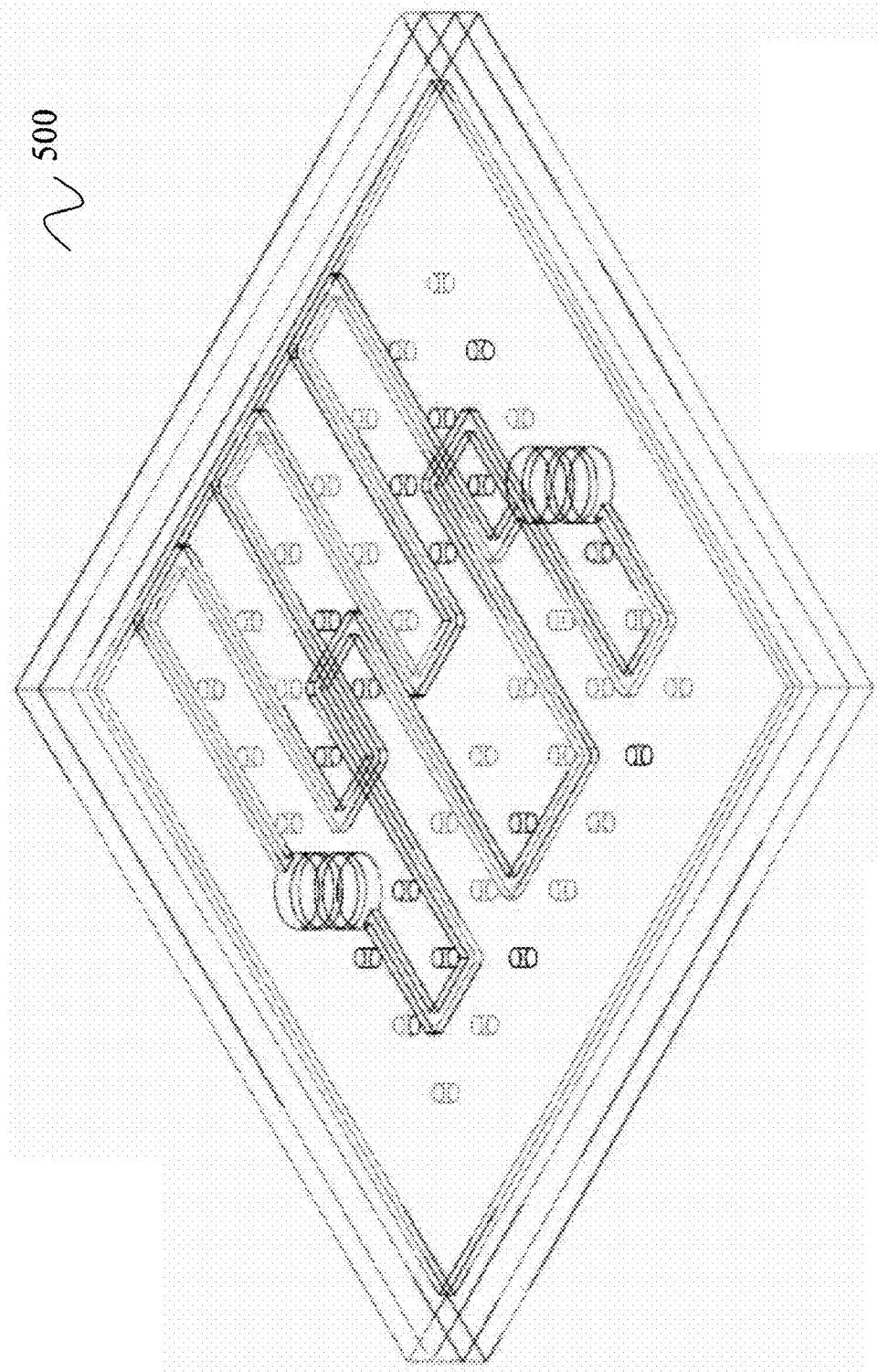

FIGS. 5I-J illustrate generally one embodiment of an IC die 500 that includes at least one reservoir 511 disposed between two layers of die 500. As depicted, reservoir layer 525 may be disposed between layers 521 and 522 of die 500. In one embodiment, reservoir layer 525 is dedicated to reservoir 511. In other embodiments, reservoir layer 525 may be disposed in one or more functional layers of die 500, for example an insulator layer disposed at a position between substrates of a multi-substrate die as discussed above with respect to FIG. 1D.

Figure 5K:
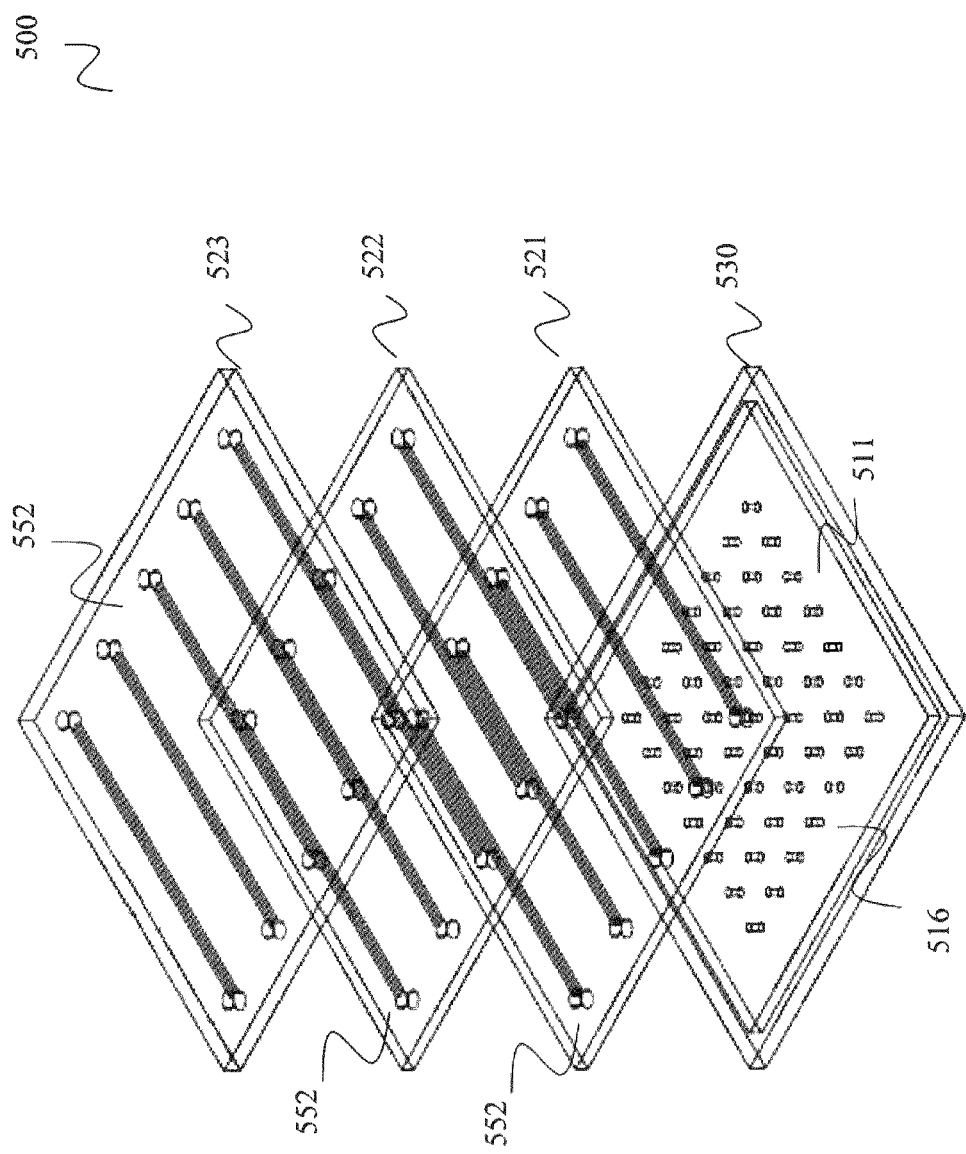
Figure 5L:
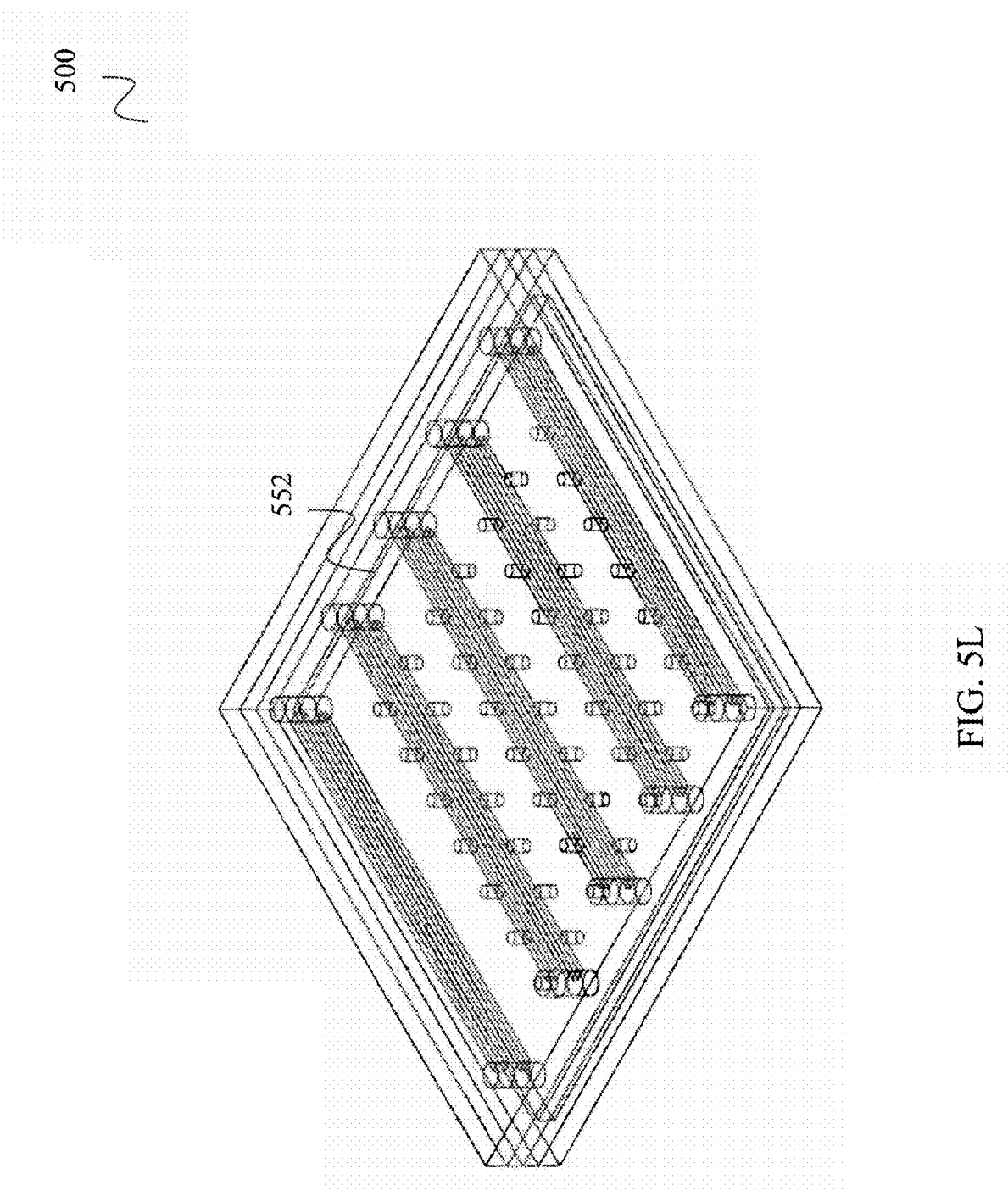
Figure 5M:
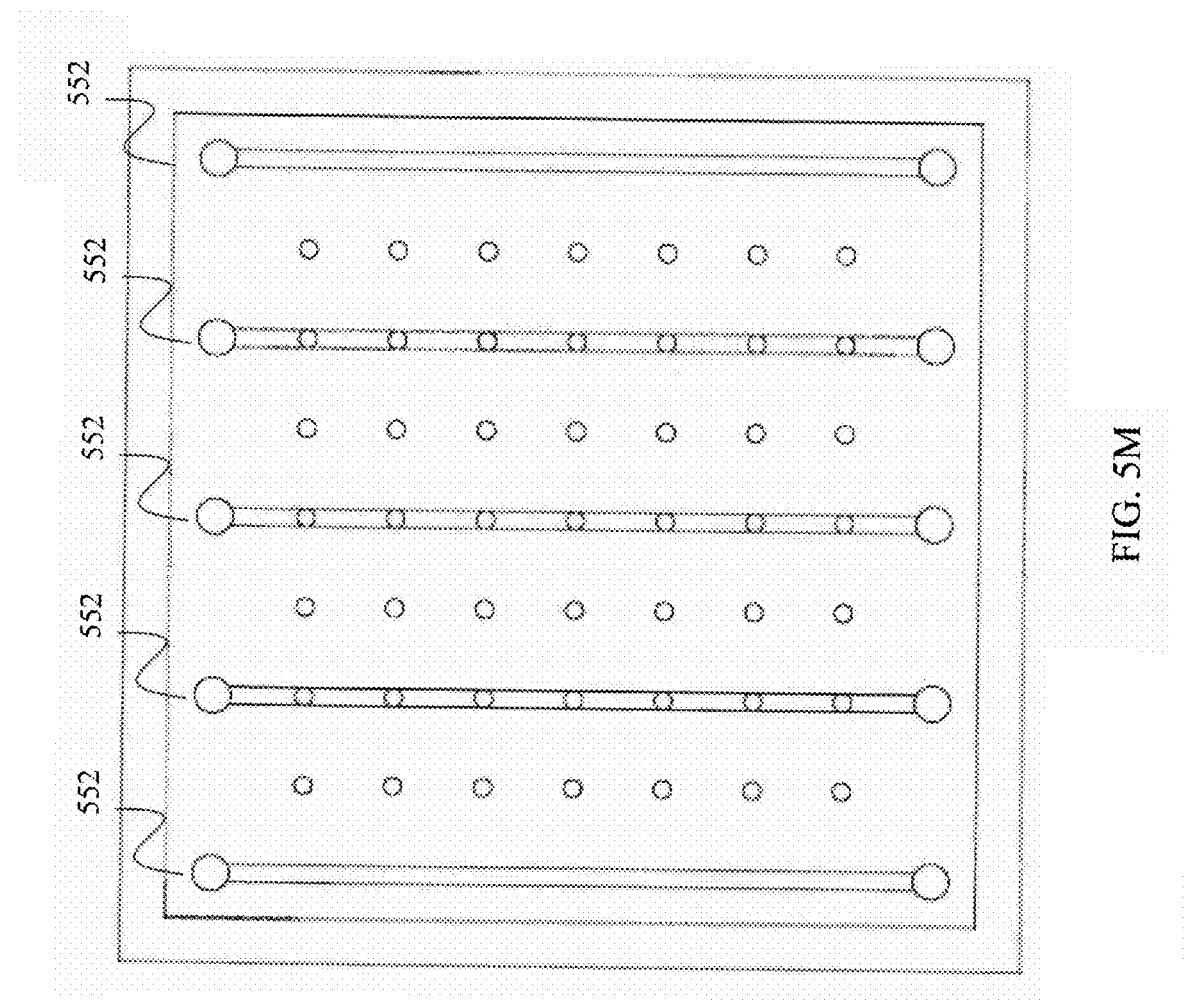

FIGS. 5K-5M illustrate generally one embodiment of an intra-die cooling structure that includes one or more array structures 552 of cooling channels 512, 514. As shown, instead of design specific structures as depicted in FIGS. 5A-E, the embodiments depicted in FIGS. 5I-M have a uniform structure across one or more layers 521-523 of die 500. As will be discussed in greater detail below, uniform structures such as array structures 552 may be utilized as a pre-design structure for design, placement, and routing of structures of IC die 500.

Figure 5N:
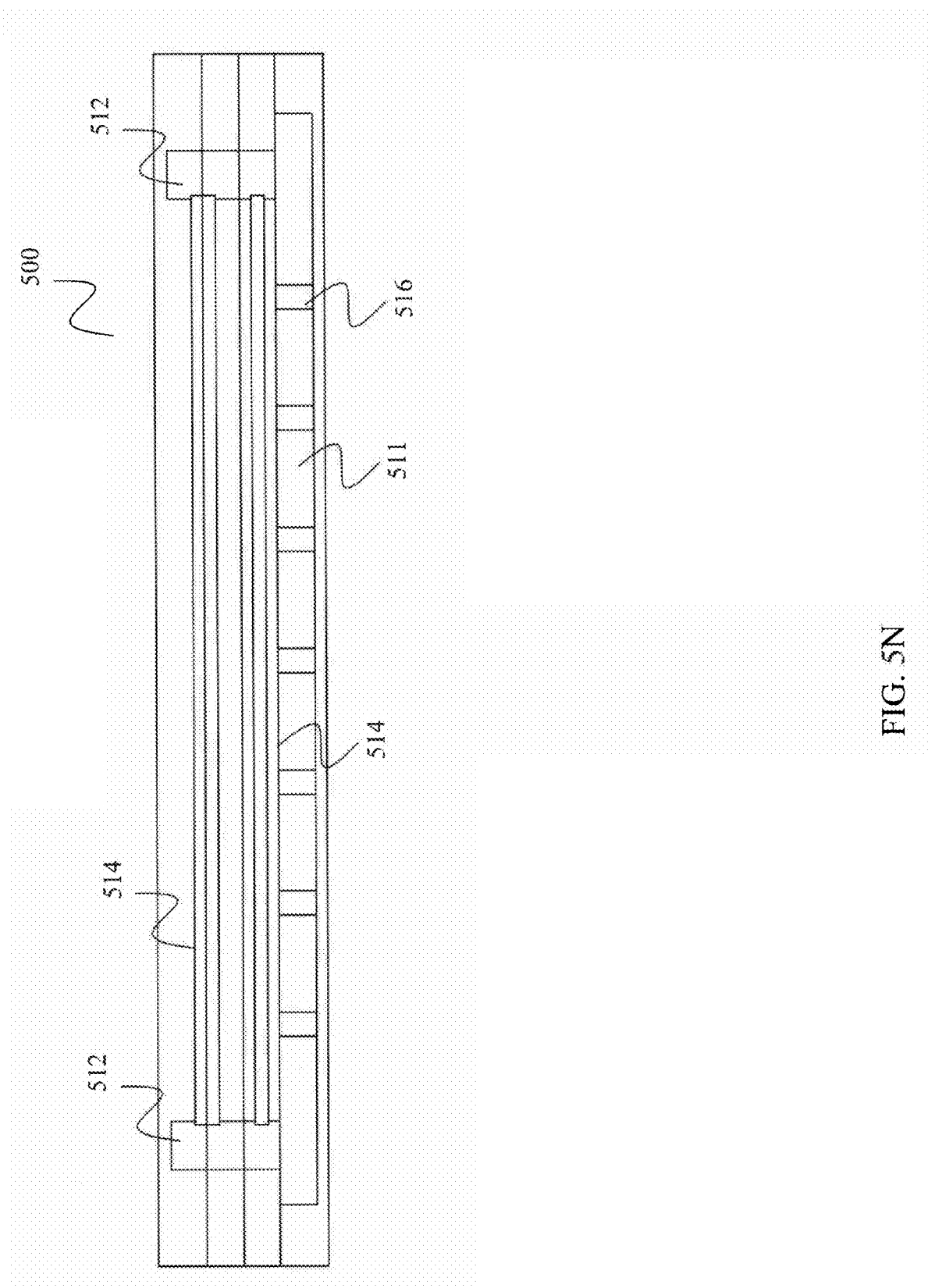
Figure 50:
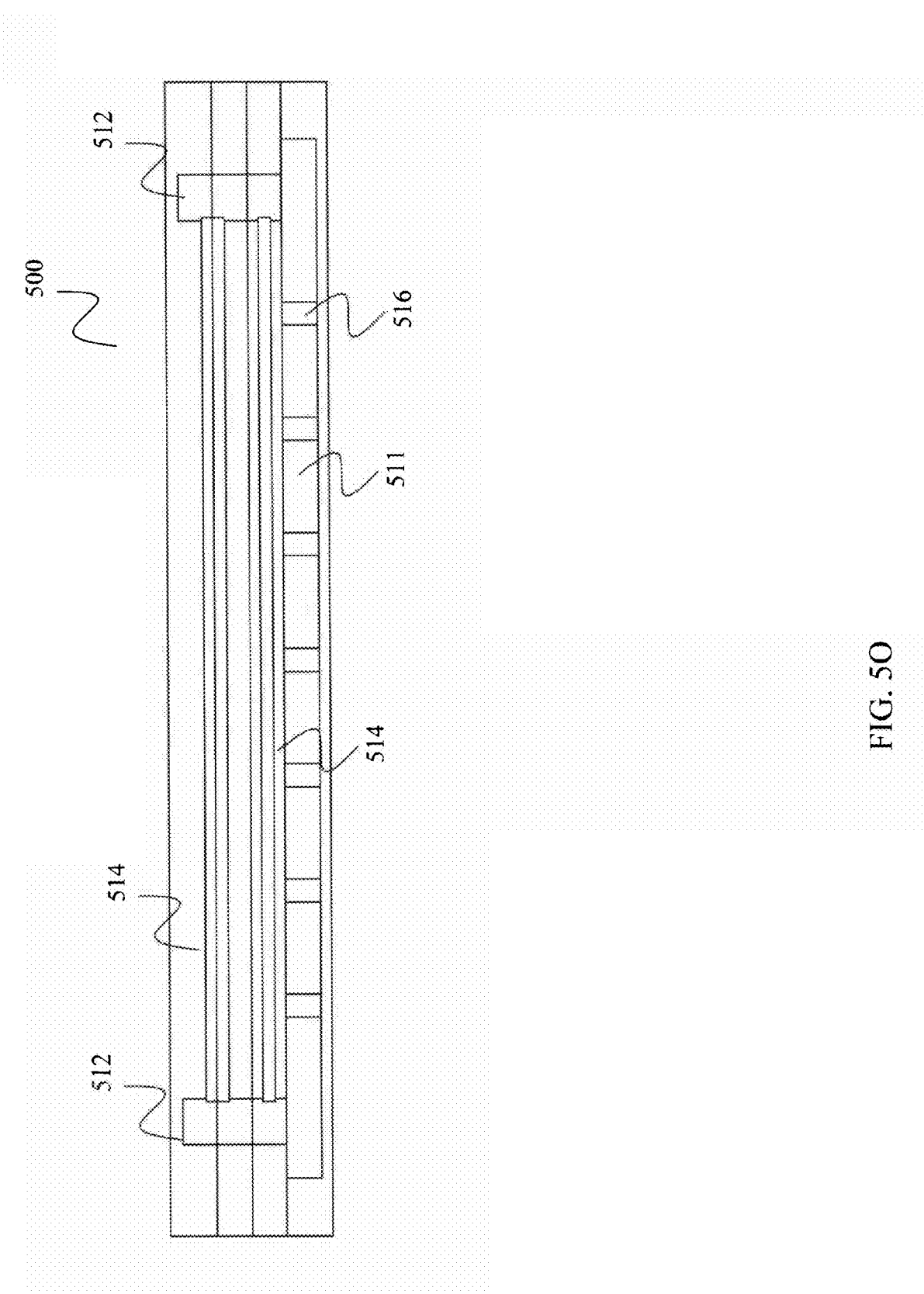

FIGS. 5N-O illustrate generally side perspective views of an IC die 500 that includes one or more intra-die cooling structures. In the depicted embodiment, intra-layer channels 514 are formed in adjacent layers of die 500. In one embodiment, channels 514 are formed with respective portions formed in adjacent layers. Such a between-layer embodiment is not limited to the one or more array structures 552. Instead, such an embodiment is applicable to any of the intra-die cooling structures described herein.

Figure 5P:
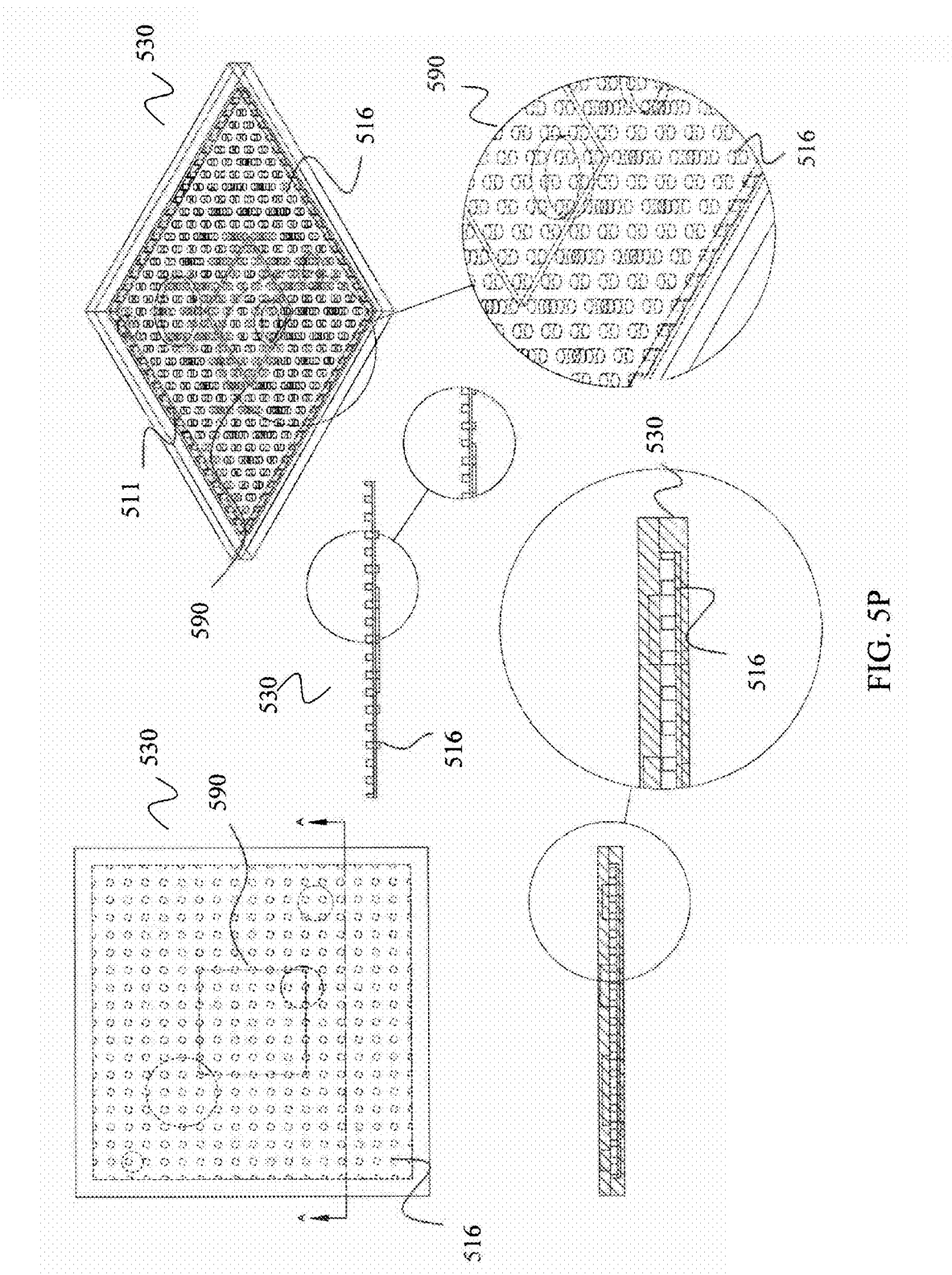
FIG. 5P illustrates generally various perspective views of one embodiment of fluid reservoir according to various aspects of the invention described herein.

FIG. 5P illustrates generally a various perspective views of one embodiment of a intra-die cooling structure reservoir 511. Reservoir is disposed in reservoir layer 530. In various embodiments, reservoir 511 is constructed to house a coolant fluid. In an embodiment, reservoir 511 includes a plurality of pillars 516. In various embodiments, pillars 516 are constructed to provide structural support for reservoir 511. Pillars 516 may be sized shaped, and constructed of one or more materials suitable for maintaining a structural integrity of reservoir 511.

Also shown in FIG. 5P is heat sink 590. In various embodiments, heat sink 590 is adapted to thermally interface with reservoir 511 to enable to transfer of heat from die 500. In an embodiment, heat sink 590 is formed of a metallic or other thermally conductive material. In an embodiment, heat sink 590 may be formed in a variety of structures known in the art for heat dissipation. In an embodiment not depicted, reservoir 511 and/or channels 512, 514 may be constructed to be in fluid communication with one or more extra-die channels formed in or on one or more surfaces of die 500. In various embodiments, these extra-die channels may be arranged to optimize expulsion of heat from die 500.

In the preceding discussion of cooling structures, the term layer was used to indicate primary integral functional layers of an IC die 400 such as semiconductor substrate layer 421, metal layer 422, or routing layer 423. One of skill in the art will recognize that these layers may be composed of a plurality of sub-layers of different materials. As such, in the following discussions regarding process formation, the term layer may further be directed to sub-layers of these primary functional layers of an IC die 400.

Furthermore, the processing embodiments described below are directed to the formation of an IC die. One of skill in the art will recognize that IC die are typically formed in plurality in the form of a wafer, and are then cut apart to form individual dice 400. Wafer-based fabrication of intra-die fluid cooling channels is contemplated.

FIGS. 6A-F illustrate generally one embodiment of a method of forming an IC die that includes at least one intra-die cooling structure according to various aspects of the invention described herein. The method depicted in FIGS. 6A-F is directed to the formation of at least portions of both inter and intra-layer channel structures (e.g. channels 412, 414 as depicted in FIGS. 4A-D in a substrate layer 421 of IC die 400. However, one of skill will recognize that the described method may be applied to form cooling structure portions in or between any layer(s) of IC die 400.

At FIG. 6A, a first semiconductor substrate layer 671 is provided. In an embodiment, first substrate layer 671 is formed of a semiconductor material, such as silicon. Other materials are also contemplated. First substrate layer 671 may or may not be doped with impurities as described above.

At FIG. 6B, one or more recesses 661 are formed in a first surface 670 of first substrate layer 671. In some embodiments, the one or more recesses 661 are formed by a subtractive process in which material is removed from a first surface 670 of the substrate to form trenches oriented in one or more directions. In various embodiments, material is removed by physical etching (sputtering or ion etching, ion-beam etching (ion beam milling)), plasma etching (radical etching), physical/chemical etching, reactive ion etching (including deep reactive ion etching), vapor phase etching with and without plasma, wet-etching (including development, isotropic and anisotropic, with and without electric bias, with and without etch stop) photolithographic, reactive ion etch, wet chemical etch, or any other means of subtractive processing now known or later developed.

In other embodiments, an additive process is used to add material to form of structures 662 on substrate layer 671 to form recess 661. In various embodiments, additive processes include material added as a blanket and selectively removed, selectively added by thin or thick film deposition, UV sensitive and UV insensitive deposition and hardening or softening, spray-on deposition, spin-on deposition (including Sol-Gel), immersion (dip) coating, sputtering, lithography, chemical vapor deposition, physical vapor deposition, plating, silk-screening, casting, tape casting, plasma spraying, plasma polymerization, plastic spraying, micromolding (including LIGA), or any other means of subtractive processing now known or later developed.

In some embodiments, the one or more recesses 661 are filled with at least one temporary sacrificial layer and/or one or more protective layers for later processing. In an embodiment, the protective layer is formed upon first surface 670 of first substrate layer 671. In an embodiment, the protective layer is silicon dioxide.

In various embodiments, a sacrificial layer may be formed in recess 661 of one or more materials in compliance with later processing steps, such as CMOS IC device structure formation. In one such embodiment the sacrificial layer is polysilicon.

In an embodiment first surface 670 is grinded and polished by various means known in the art such that first surface 670 is smooth and level for subsequent processing.

At FIG. 6C a second semiconductor substrate layer 681 is disposed upon first surface 670 of substrate layer 671. In one such embodiment, a second surface 682 of second substrate layer 681 has a bonding layer 663 disposed thereon. In another embodiment, a bonding layer 663 is disposed on first surface 670 of first substrate layer 671. Bonding layer 663 may be formed of a material such as a polymer, or a dioxide such as thermal dioxide. Bonding may be accomplished using a vacuum bonding process. Bonding layer 663 may not only serve to bond first substrate 671 and second substrate 681, it may further be utilized as a protective layer for subsequent processing.

In various embodiments, surfaces 670, 682 may be bonded together according to any means now known or later developed. As shown, once bonded, fluid channel 614 is formed in resulting substrate layer 621. In an embodiment, a first surface 680 of second substrate layer 681 and/or second surface 672 of first substrate layer 671 may be polished for subsequent processing. In an embodiment, the polishing is accomplished using a lapping and polishing process.

In one embodiment, first surface 680 may be doped with impurities prior to being bonded to first substrate layer 671. In other embodiments, first surface 680 may be doped with impurities after bonding. In an embodiment, second substrate layer 681 may be pre-fabricated prior to bonding. In another embodiment, second substrate layer 681 may be formed on top of bonding layer 663 after formation of bonding layer 663. In another embodiment, second substrate layer 681 may be formed directly upon first substrate layer 671. In an embodiment, at FIG. 6D, a metallization layer 622, such as metallization layer 422 depicted in FIG. 4, may be formed on second surface 682 of second substrate layer 681. In some embodiments, one or more through silicon vias, such as vias 145, 155 depicted in FIG. 5C-D above, may be formed in substrate layers 621-623 and/or metallization layer 622.

In an embodiment, bonding layer 663 may include one or more materials with electrically insulating properties. According to this embodiment, a silicon-on-insulator structure is formed. In an embodiment, the presence of an insulator bonding layer 663 may impart desired properties. For example transistor current leakage may be reduced. In an embodiment, bonding layer 663 is formed of a non-conductive material so as to not interfere with IC device structure operation.

In other embodiments, first surface 680 of second substrate layer 681 may not be doped to form semiconductor device structures. According to these embodiments, second surface 672 of first substrate layer 671 may be doped with impurities instead. In a related embodiment, metallization layer 622 may be formed on second surface 672.

Figures 6D, 6E, 6F:
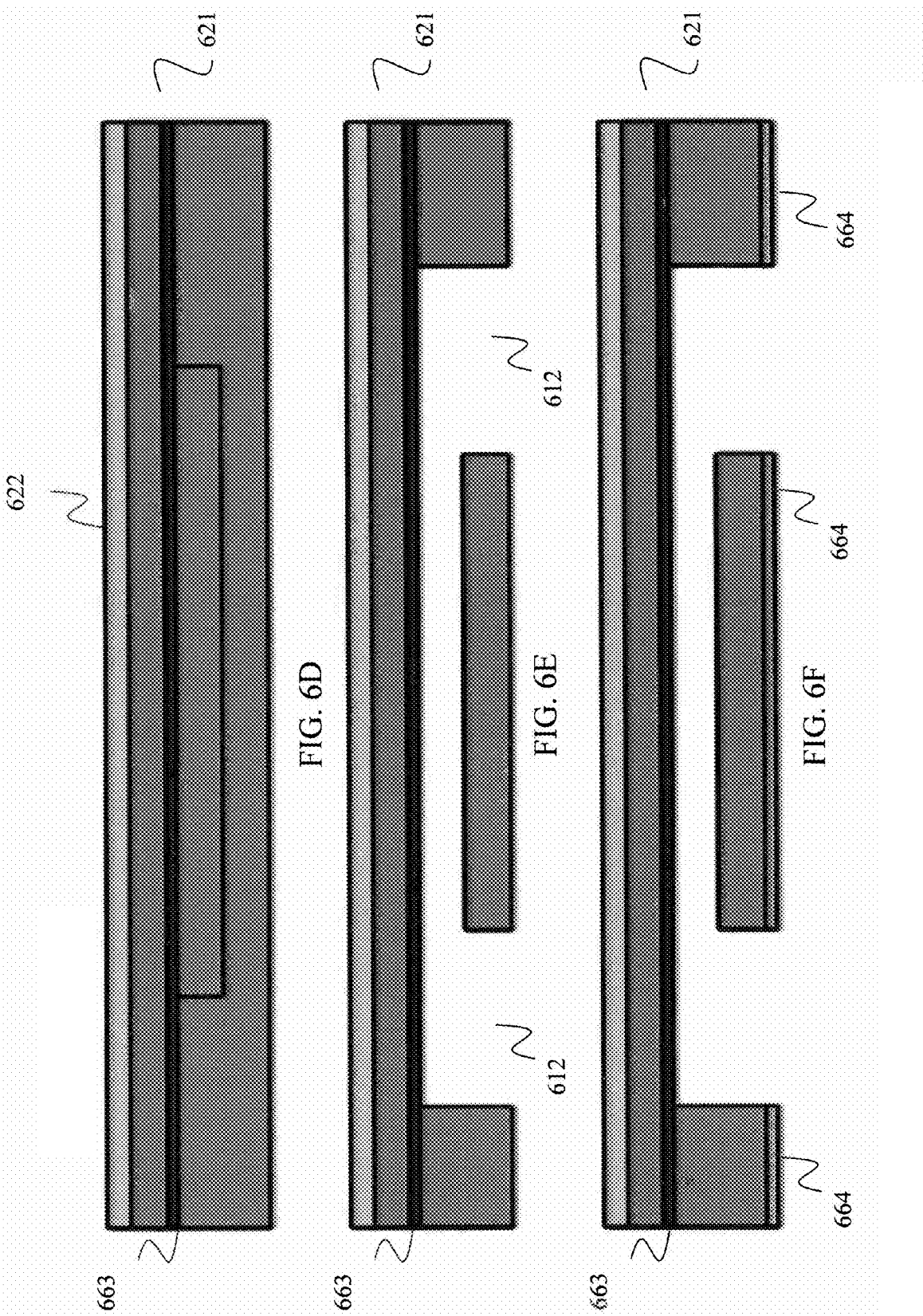

In an embodiment, at FIG. 6E, one or more inter-layer channel portions 612 (two are shown) are formed in substrate layer 621. In an embodiment, the inter-layer channel portion(s) 612 are formed by a subtractive process of material removal as described above. In one embodiment, bonding layer 663 acts as a stop for subtractive material removal. In other embodiments where a protective layer was disposed upon first surface 670 of first substrate 671, the protective layer may act as a stop for subtractive material removal. In one embodiment a second protective layer may be disposed upon second surface 672 of first substrate layer 671. Portions of this second protective layer may be etched to expose sacrificial filling below. In one embodiment, a plasma etch is utilized to etch portions of the protective layer. In one such embodiment, the plasma etch uses CHF3 as a chemical and Argon as an anisotropic physical etch.

Although not depicted in FIGS. 6A-F, inter-layer channels 612 may be adapted to carry fluid through substrate layer 621 to other layers of die 600. In such embodiments, the subtractive process used to form inter-layer channels 612 may not stop at a certain depth. Instead, the subtractive process may remove material from substrate layer through second surface 672. In one embodiment, such an etched inter-layer channel portion may be constructed to interface with similarly sized and shaped structures on other die layers disposed upon substrate layer 621, such as metallization layer 622. In another embodiment, one or more die layers may be formed upon substrate layer 621 prior to subtractive processing, and an inter-layer channel 612 may be formed through two or more layers in a single subtractive process step.

In an embodiment as depicted in FIG. 6F, a second bonding layer 664 may be disposed upon one or more surfaces of substrate layer 622. Second bonding layer 664 may be utilized for subsequent bonding of substrate layer 622 to other layers of die 600. In one such embodiment, substrate layer 622 is bonded to a reservoir layer (not shown in FIG. 6F).

In an embodiment not depicted in FIGS. 6A-F, intra-layer cooling channels inter-layer cooling channels and/or reservoir may be coated with one or more materials to provide desired fluid transfer characteristics of structures. In one such embodiment, structures may be coated with a hydrophilic material. In an embodiment, the hydrophilic material is a dielectric material. In an embodiment, the hydrophilic material is silicon dioxide. In an embodiment, a coating may be formed by any additive process as discussed above. In one embodiment, the coating is formed by chemical vapor deposition (CVD). In another embodiment, the coating is formed by plasma-enhanced CVD (PCVD). In another embodiment, structures may be filled with one or more materials in order to form a mono-layer of hydrophilic material.

The embodiment depicted in FIGS. 6A-6F is simplified in that it only depicts the formation of a simple coolant channel structure. One of skill in the art will recognize that multiple coolant channels may be formed in various orientations in substrates of any material. For example, channels with an orientation perpendicular to those depicted may be formed simultaneously by the described method. Further, according to the embodiments described above, intra-layer channels 414 are shown formed in traditional IC die layers such as substrate layer 421. Intra-layer channels 414 may be formed in between, adjacent to, or within traditional IC die layers 421-423 layers or one or more die layers dedicated to cooling structures. In various embodiments, such dedicated cooling structure layers may be formed at any position with respect to layers 421-423 of die 400.

FIGS. 7A-G illustrate generally one embodiment of a method of forming a coolant reservoir according to various aspects of the invention described herein. At FIG. 7A, a substrate 771 is provided. In one embodiment, substrate 771 is formed of a semiconductor material such as silicon. In other embodiments, substrate 771 may be formed of any material sufficient to form a cavity adapted to house a liquid.

At FIG. 7B, a plurality of recesses 790 are formed in a second surface 772 of substrate 771. Recesses 790 may be formed using a subtractive or additive process as described above. In one embodiment, the recesses 790 are evenly spaced apart. In another embodiment, recesses 790 are formed in both X and Y dimensions with respect to substrate 771. As such, a two dimensional array of pillars 716 may be formed.

At FIG. 7C, recesses 790 are filled with a material to be formed into reservoir pillars. Also in FIG. 7C, a first surface 770 of substrate 771 may be etched, grinded, or otherwise reduced to provide a level surface and expose an upper portion of pillars 716. First surface 770 may further be polished as described above to provide a smooth and level surface for further processing.

At FIG. 7D, material may be removed to a certain depth from first surface 770 at portions between pillars 716 to form recesses 726 for coolant fluid to be disposed in a resulting reservoir. The embodiment shown in FIG. 7D depicts material removal between pillars to form trenches. In one embodiment, material removal forms trenches in both X and Y orientations.

In an embodiment, at edge 776 of substrate 771, a furthest portion of substrate 771 is left intact to provide a barrier for coolant fluid. In another embodiment, as depicted at edge 777, a furthest portion of substrate 771 may be removed to provide a fluid inlet 795 to allow for subsequent filling of reservoir 711 with coolant fluid. In other embodiments, subtractive processing as described above may be employed to remove portions of second surface 772 for purposes of providing one or more fluid inlets 795 for filling of reservoir 711 with coolant fluid.

In an embodiment, substrate 771 is etched such that a layer of substrate material remains surrounding pillars 716. Surrounding substrate material may provide electric, thermal, and/or chemical insulation, and may enable etch processes that are incompatible with pillar 716 material. In another embodiment, substrate material surrounding pillars 726 may be removed entirely, exposing pillars to fluid once reservoir 711 is filled.

In an embodiment, at FIG. 7F, a heat sink 790 may be formed at second surface 772. In various embodiments, heat sink 790 may be formed of any thermally conductive material now known or later developed. In one embodiment, the heat sink may be formed using a sputtering process. In one such embodiment, TI/Au layer stack is sputtered on surface 772 as a seed layer. In an embodiment, the heat sink is formed by a copper electroplating process.

In alternative embodiments not depicted, pillars 716 may be formed by an additive process as opposed to the subtractive process described above. In one such embodiment, one or more additive processes may be used to deposit materials and form pillars 716 on first surface 770 of substrate 771.

In one such embodiment, an additive process includes depositing a functional powder embedded in a matrix material such as an ultraviolet sensitive polymer material on surface 770. According to this embodiment, a photolithographic process may be used to selectively harden or soften deposited powder at those areas where pillars are to be formed. In an embodiment, once pillars have been formed, a subtractive process, such as etching, is be used to remove unwanted deposited material and/or to form a shape of pillars 726.

FIGS. 8A-B illustrate generally one embodiment of a method of bonding a substrate layer 621 to a reservoir layer 730 according to various aspects of the invention described herein. In one embodiment, a bonding layer 765 may be disposed upon a second surface 672 of substrate layer 621. In alternative embodiments, bonding materials may be disposed upon exposed surfaces of pillars 716. In other embodiments, bonding material may be disposed on both surfaces.

In various embodiments, portions of reservoir 711 and channels 712, 714 in substrate layer may be constructed such to present aligning interfaces at respective bonding surfaces. In an embodiment, the reservoir 711 and channels 712, 714 are arranged to provide a desired fluid conduit between reservoir 711 and channels 712, 714. As shown in FIG. 8B, once bonded, an IC die cooling structure comprised of reservoir 711, inter-die channels 712, and intra-die channel 714 disposed within the die.

FIGS. 9A-H illustrate generally an alternative embodiment of a method of forming an IC die that includes at least one intra-die cooling structure according to various aspects of the invention described herein. In the embodiment depicted in FIGS. 6A-G, channels are formed within one or more layers of an IC die. According to the embodiment depicted in FIGS. 9A-H, channels are instead formed with portions in different layers of an IC die. In some embodiments, channels are formed between traditional layers of an IC die. In other embodiments, channels may be formed between dedicated cooling structure layers and/or traditional layers. Any configuration is envisioned.

At FIG. 9A, a substrate layer 971 is provided. In various embodiments, the substrate layer 971 is formed of any material adapted to support one or more cooling structures. In one embodiment, substrate layer 971 is formed of a semiconductor such as silicon. In another embodiment, substrate layer 971 is formed of glass.

At FIG. 9B, substrate layer 971 is shown with a second layer 922 disposed adjacent to substrate layer 971. In one embodiment, substrate layer 971 is a semiconductor substrate layer, and second layer 922 is a metallization layer as described herein. In various embodiments, second layer 922 may be any layer of an IC die, including dedicated cooling structure device layers.

Also at FIG. 9B, one or more recesses 961 are formed in second surface 972. In an embodiment, the one or more recesses 961 are formed of a certain depth to maintain a functional distance between recess 961 and any IC device structures formed in or near first surface 970 of substrate 971. Recesses 961 may be formed of a subtractive or additive process as described above. At FIG. 9C, one or more bonding layers may be formed on second side 972 of substrate layer 971.

FIGS. 9D-F illustrate generally one embodiment of a second layer 981 of an IC die that includes one or more cooling structures. As shown, one or more subtractive or additive processes as described above may be utilized to form one or more recesses 961. In one embodiment, the one or more recesses 961 may be etched through second layer 981 to form one or more inter-layer channels 912. As shown in FIG. 9F, bonding layers may be formed on first surface 980 and/or second surface 982 of second layer 981.

Figure 9G:
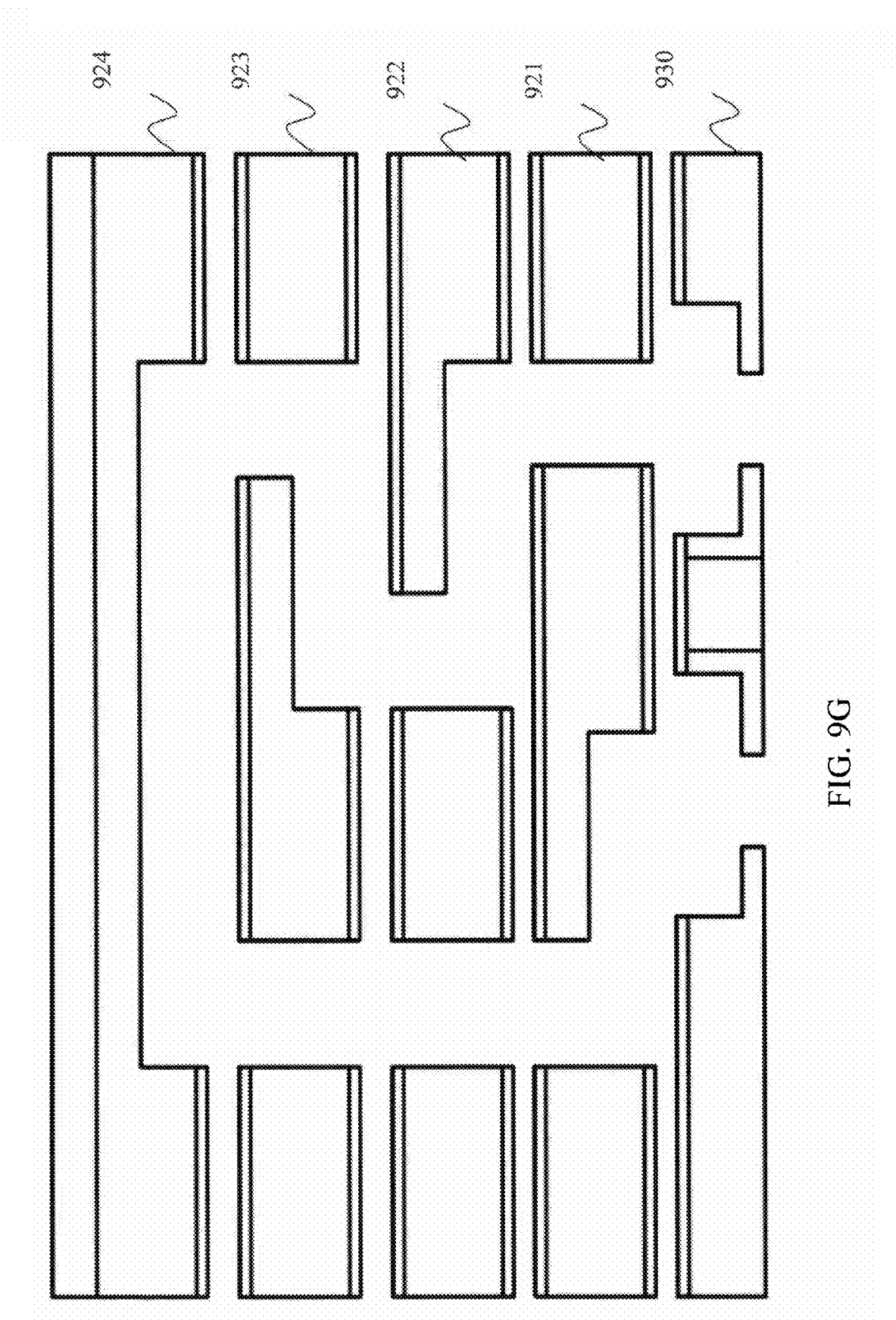
Figure 9H:
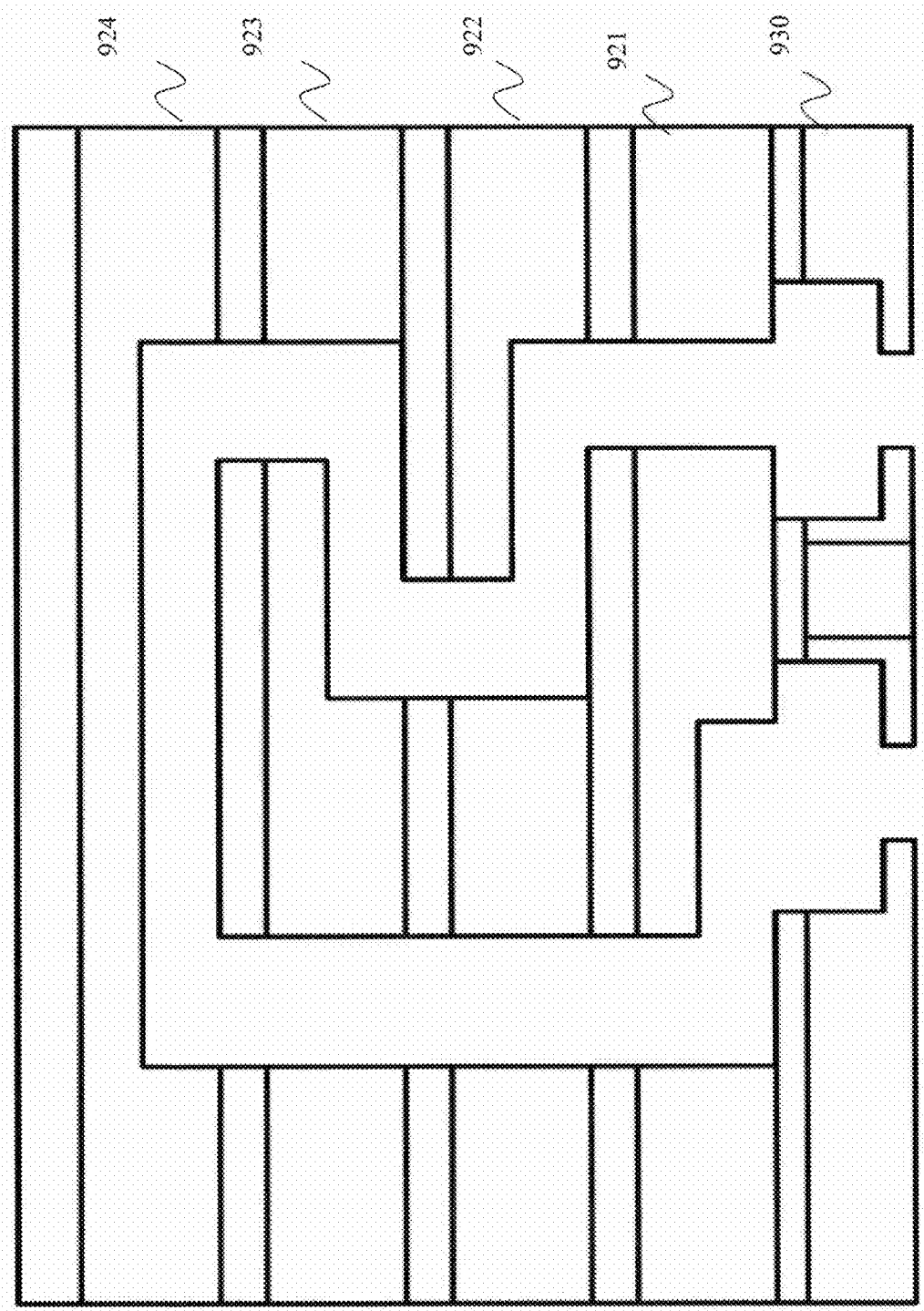

FIG. 9G illustrates generally one example of the formation of a plurality of IC die layers 921-924 that each include one or more cooling structures formed as described above. As depicted in FIG. 9H, the one or more layers may be bonded together to form an intra-die cooling structures. One or more layers 921-924 may further be bonded to one or more cooling reservoir layers 930 as shown. Bonding methods include polymer bonding, metal bonding, ceramic bonding, direct bonding, physical bonding, or any other means now known or later developed.

FIGS. 9K-N illustrate generally an alternative embodiment of a method of forming an IC die that includes at least one intra-die cooling structure according to various aspects of the invention described herein. At FIG. 9K, a substrate layer 971 is provided. In an embodiment, substrate layer 971 has one or more IC device structures formed in a first surface 970. In an embodiment as depicted, a metallization layer 922 is formed adjacent to the substrate layer 971.

Figure 9K:
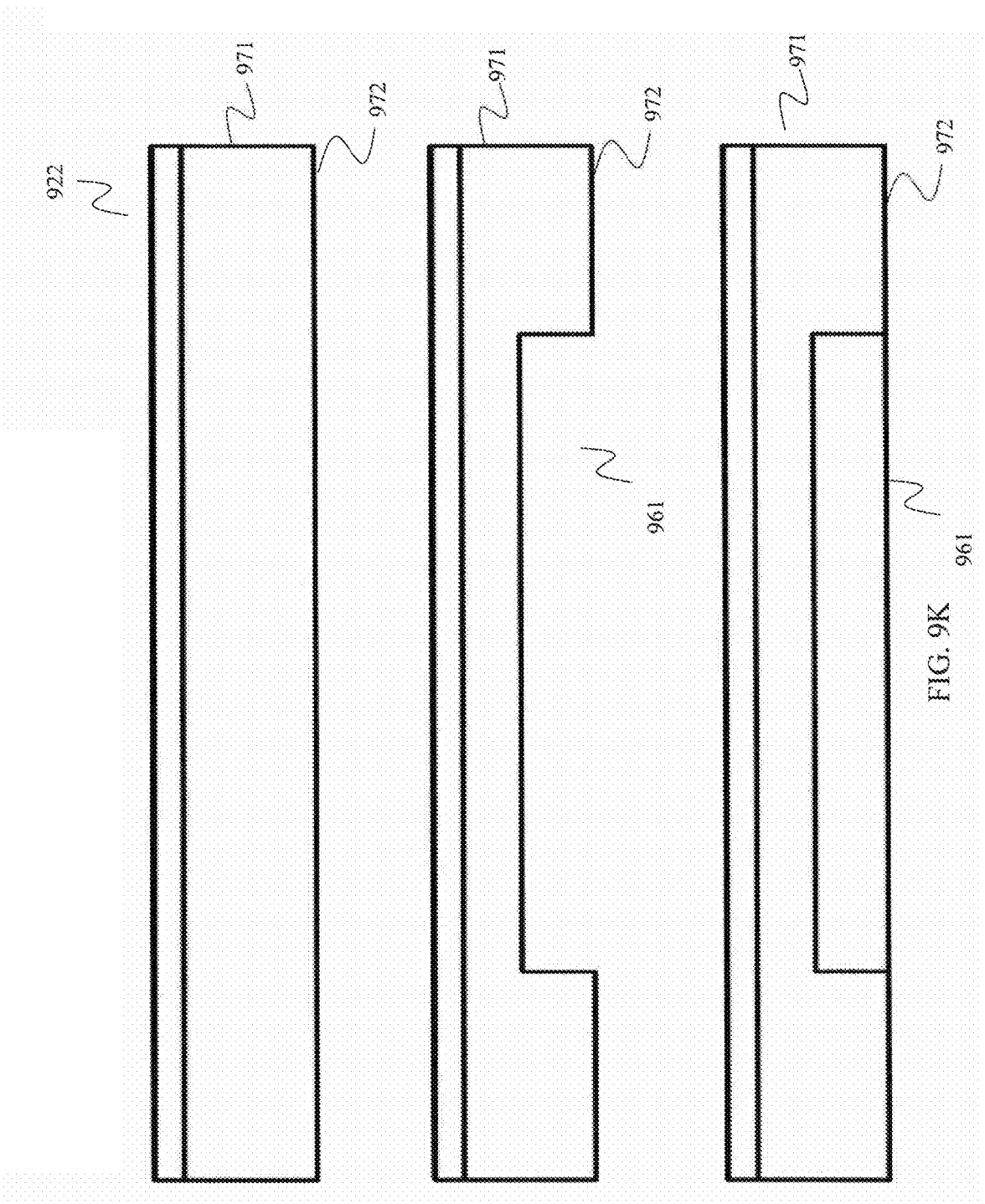
FIGS. 9K-N illustrate generally one embodiment of a method of forming an IC die that includes at least one intra-die cooling structure according to various aspects of the invention described herein.

Also shown in FIG. 9K, one or more recesses 961 are formed in second surface 972 of substrate layer 971. The one or more recesses 961 may be filled with a sacrificial layer. In one embodiment, the sacrificial layer may be formed of a polymer.

Figure 9L:
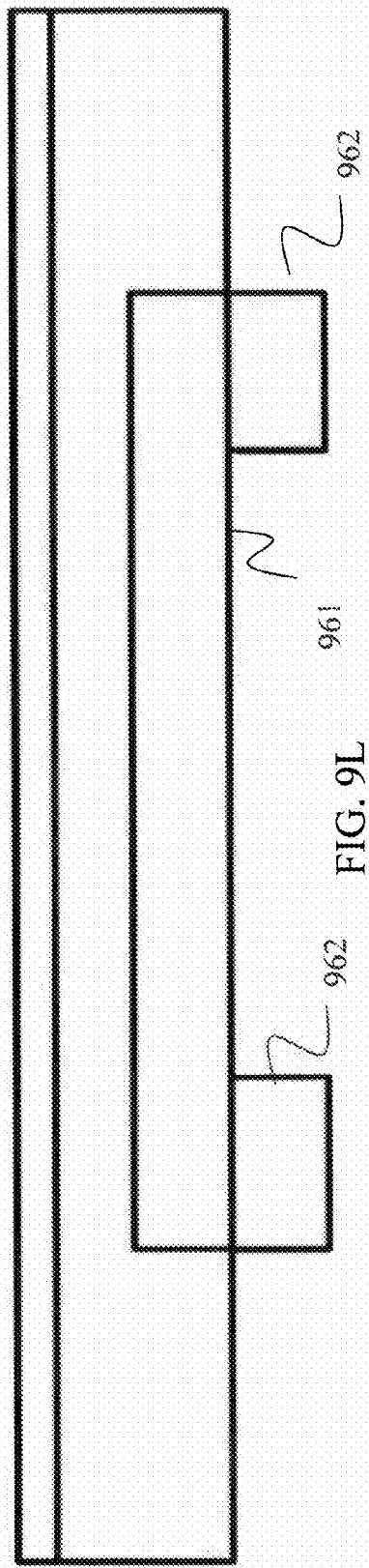

At FIG. 9L, one or more sacrificial structures 962 may be formed upon second surface 972. In various embodiments, sacrificial structures 962 may be formed by one or more additive processes as described herein. In an embodiment, an additive process using light sensitive polymers is employed to form sacrificial structures 962.

Figure 9M:
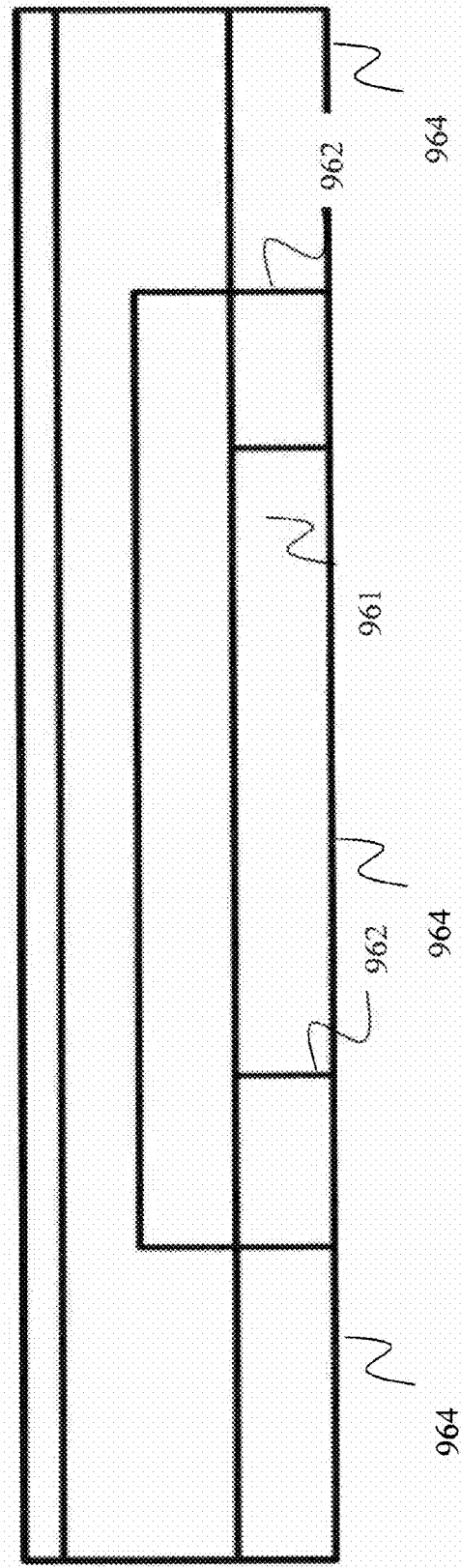

At FIG. 9M, one or more fluidic channel support structures 964 may be formed on second surface 972. In various embodiments, support structures 964 may be formed by one or more additive processes as described herein. In an embodiment, support structures 964 may be formed adjacent to sacrificial structures 962. In an embodiment, support structure 964 may be formed in one or more recesses defined by sacrificial structures 962. In some embodiments, support structure 962 and sacrificial structure may be formed of the same material. At least one of structures 964 and 962 may be selectively treated. In one embodiment, masked UV light may be imposed on one or more UV sensitive materials to define support structure 962 and/or sacrificial structure 964.

Figure 9N:
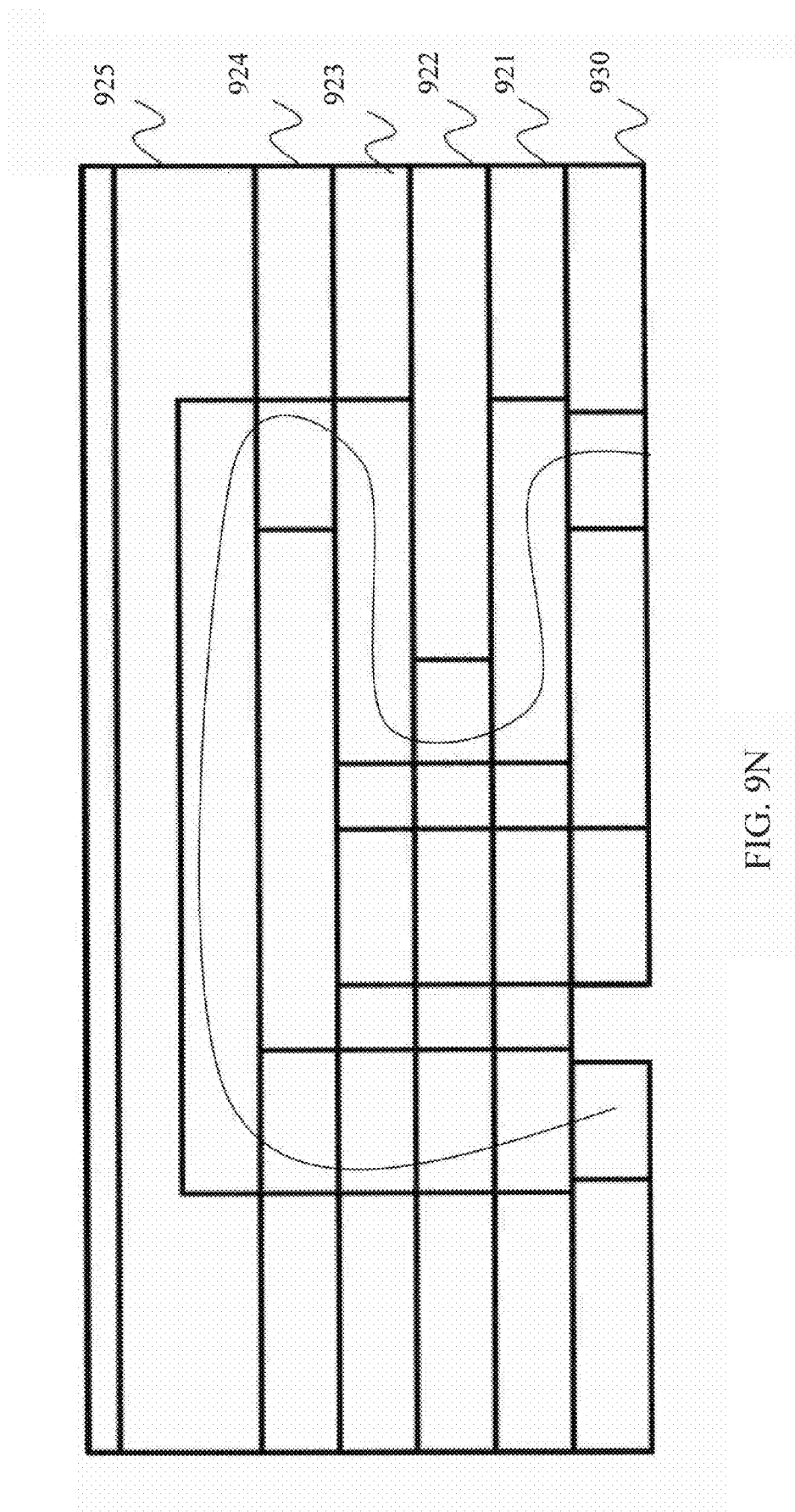

In various embodiments as shown in FIG. 9N, the process of FIGS. 9L-M may be repeated to form multiple layers of fluid channel structures. As shown by the curved line of FIG. N, at least one fluid channel is formed by the method described with respect to FIGS. 9K-N.

Figure 10:
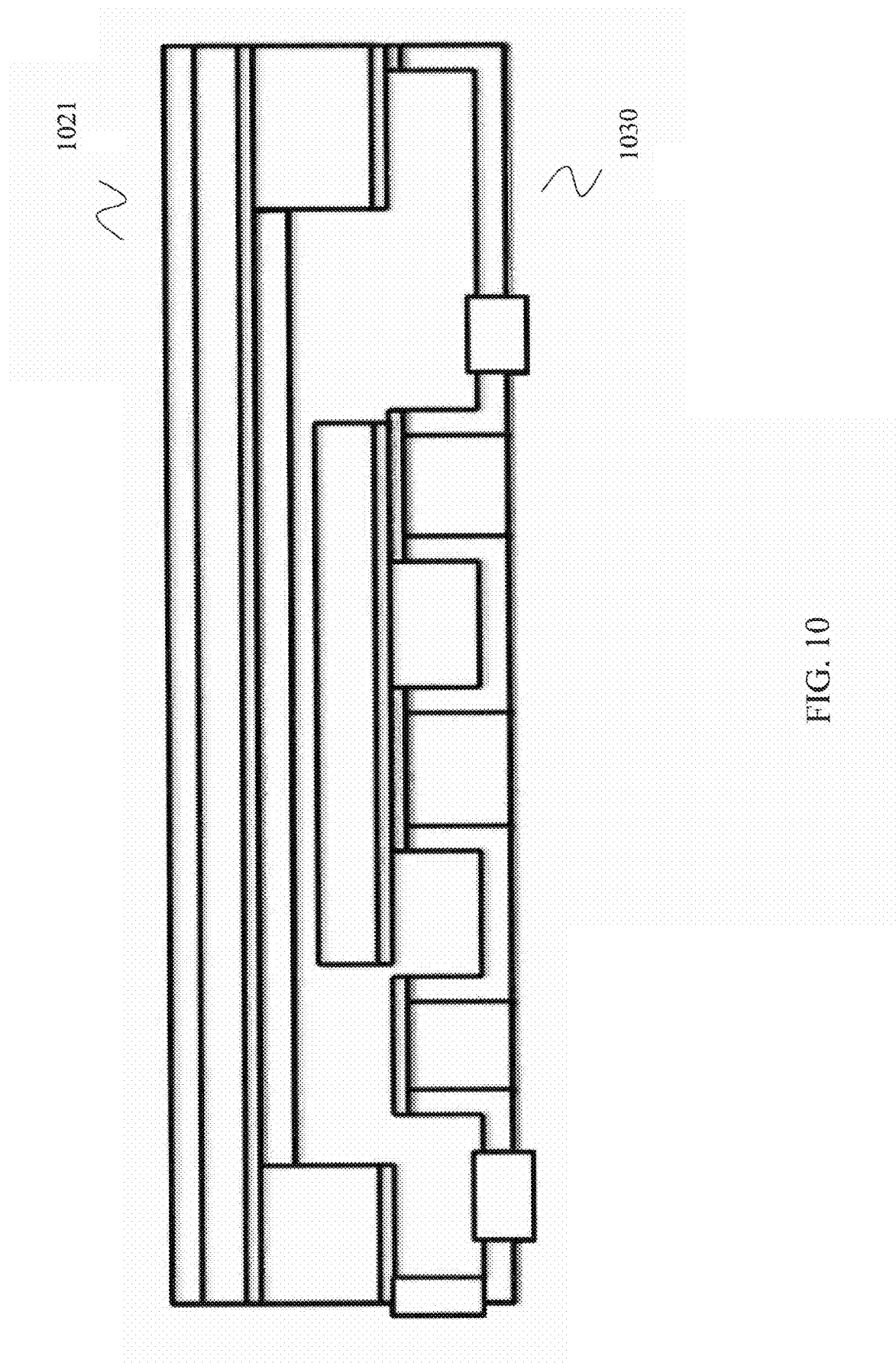
FIG. 10 illustrates generally one embodiment of an IC die that includes at least one intra-die cooling structure with sealed fluid inlets according to various aspects of the invention described herein.

FIG. 10. illustrates generally one embodiment of a portion of an IC die 900 that includes cooling structures according to various aspects of the invention described herein. The embodiment depicted in FIG. 9A is similar to the embodiment of FIG. 8B, however fluid inlets 795 have been closed.

In an embodiment, after liquid has been disposed in reservoir, one or more additive processes as described above may be employed to seal inlets 795.

Figure 11:
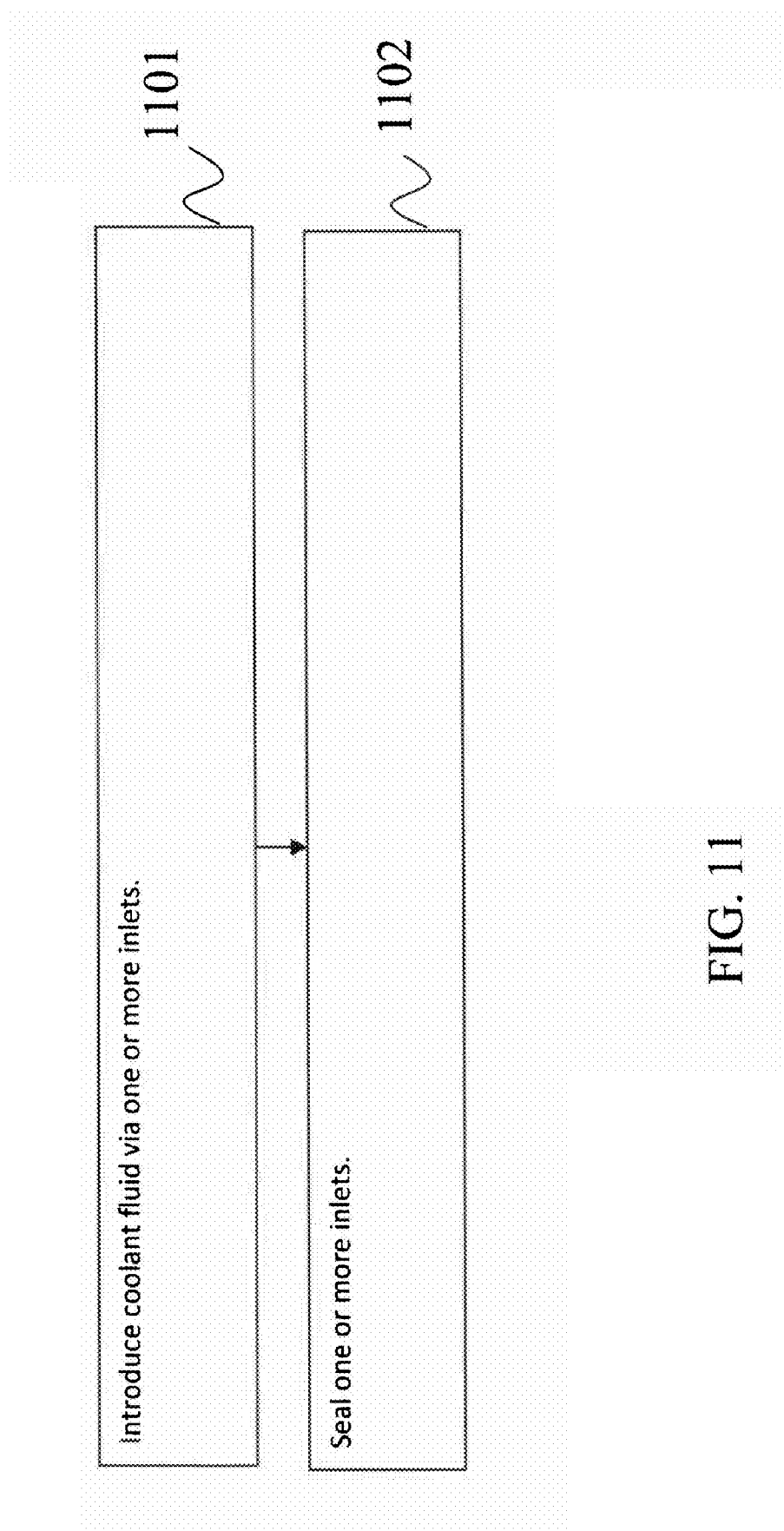
FIG. 11 illustrates generally one embodiment of a method of filling an IC die that includes at least one intra-die cooling structure according to various aspects of the invention described herein.

FIG. 11 illustrates generally one embodiment of a method of filling an intra-die cooling structure according to various aspects of the invention described herein. At 1101, liquid and/or gas is introduced through inlets. In one embodiment, a die is heated, and introduced to a relatively cooler liquid and/or gas. Air may be trapped in the cooling structure, and due to thermal compression may cause fluid to be drawing into the cooling structure. In another embodiment, fluid may be introduced by capillary action. According to this embodiment, an inlet may be in fluid communication with one or more capillaries that cause fluid to be drawn into cooling system. In another embodiment, coolant fluid may be introduced by injection, for example a needle or other fluid conduit introduced via inlet 795. In another embodiment, fluid may be introduced through one or more fluid transfer elements as discussed above with respect to FIG. 3B. At 1102, the one or more inlets may be sealed such as by one or more additive processes as described above.

In an embodiment, the coolant fluid is comprised of a liquid and a gas. In an embodiment, the inclusion of a gas enables liquid to expand due to heat without affecting structural integrity of the die. In another embodiment, the liquid is a two-phase liquid adapted to at least partially evaporate at a particular temperature. In one embodiment, the two-phase liquid is adapted to partially evaporate at or near an operating temperature of an IC, such that should a temperature of an IC become too high, a gas is present to prevent pressure of the liquid from causing damage to IC structural integrity. The coolant fluid may be one or more combinations of liquid and/or gas, for example any combination of: water (e.g. de-ionized water), aqueous copper II sulfate, gallium (liquid metal), various concentrations of saline (or other salt derivative) solutions, organic liquids (including those with a low evaporation temperature that form a two phase mixture), emulsions, solids floating in liquids, inert gasses, air, or any liquid or gas now known or later developed.

Figure 12:
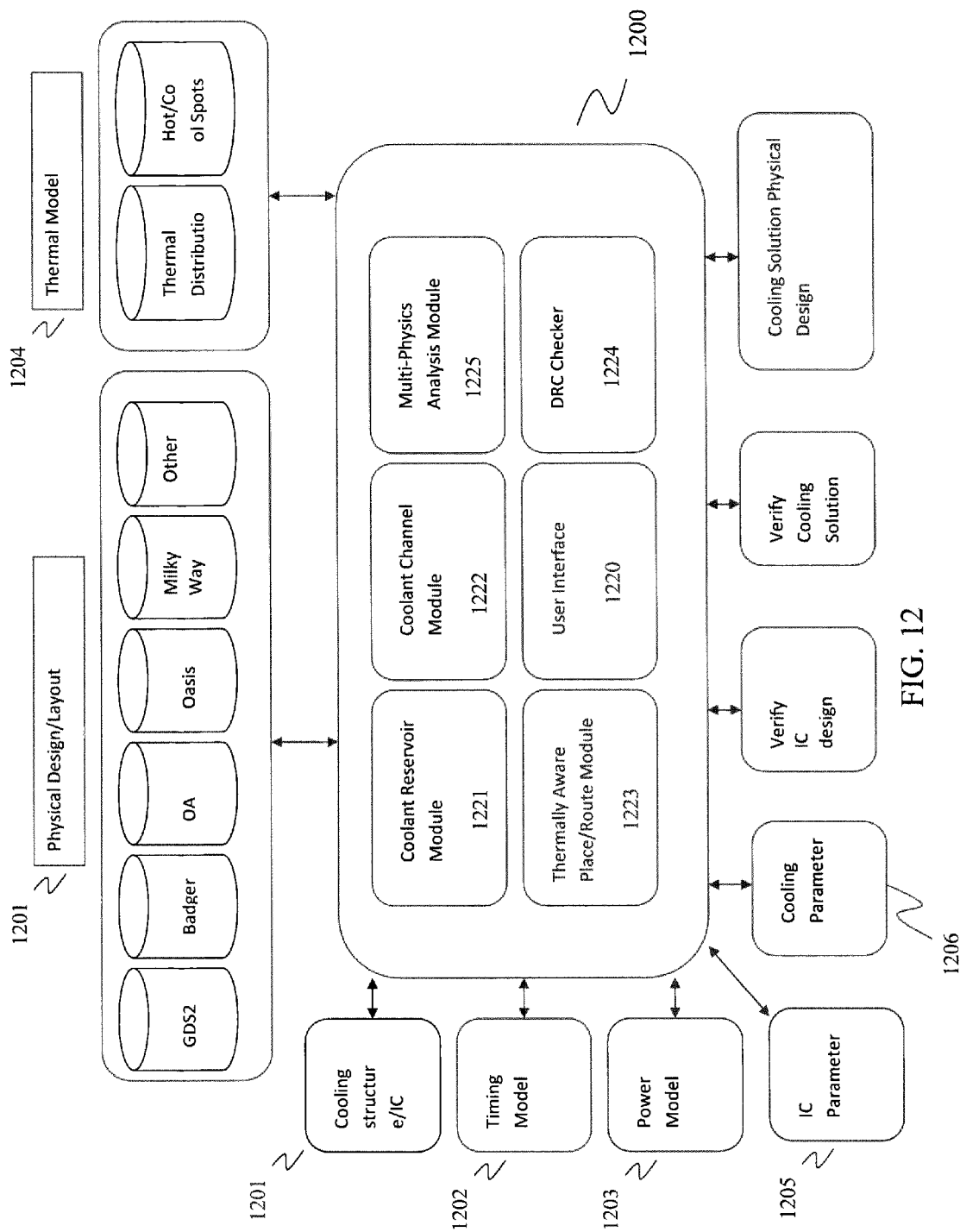
FIG. 12 illustrates generally a block diagram of one embodiment of a cooling structure and IC design system according to various aspects of the invention described herein.

FIG. 12 illustrates generally a block diagram depicting one embodiment of a cooling structure and IC design system according to various aspects of the invention described herein. In various embodiments, system 1200 is adapted to facilitate design of one or more IC die that include one or more intra-die cooling structures.

In various embodiments, system 1200 is adapted to acquire (receive, generate, and/or enable generation of) one or more models of an IC design 1201-1204. In an embodiment, system 1200 is adapted to receive as input or enable creation of one or more physical models 1201 of an IC design, such as electronic representations of an IC die physical design 1201. Physical design 1201 may be represented in an industry standard format such as Graphical Design System II (GDS2 or GDSII), Badger™, OpenAccess™ (OA), Open Artwork System Interchange Standard (OASIS), or Milkyway™ formats. In various embodiments, physical design 1201 represents one or more device structures and/or other physical characteristics of an IC design. In some embodiments, physical design 1201 may instead or in addition represent one or more optical or micro-electrical mechanical systems (MEMS) structures. Also in some embodiments, system 1200 may be adapted to generate and/or enable user generation of an electronic physical design 1201.

System 1200 may further be adapted to receive or create one or more timing models 1202. Timing model 1202 may include information relating to operation timing of devices and/or circuits of an IC design. System 1200 may also be adapted to receive as input or create one or more power models 1203 adapted to represent power consumption of IC device structures.

In addition, system 1200 may be adapted to receive or create one or more thermal models 1204. The one or more thermal models 1204 may include indication of operation temperatures of an IC die. The one or more thermal models may be 2-D or 3-D thermal models. In one embodiment, thermal model 1204 may include at least one indication of one or more hot and/or cool spots of an IC die as discussed above.

In various embodiments, models 1201-1204 may be generated by system 1200. For example, system 1200 may include one or more physical design, timing, power, or temperature analysis and/or generation modules adapted to generate and/or enable generation of one or more of models 1201-1204. Models 1201-1204 may further be generated based on one another. For example, a physical design 1201 may be used to generate timing, power, or temperature models, or a power model 1203 may be used to generate temperature model 1204.

In an embodiment, system 1200 may further be adapted to receive cooling structure parameters 1206 and/or IC parameters 1205. In an embodiment, an IC parameter 1205 may include desired operating temperature or speed. An IC parameter may further include operating conditions such maximum or minimum operating temperature, power consumption, or like restrictions. An IC parameter may be directed to an IC wafer, die, or portion of an IC.

In an embodiment, cooling structure parameters 1206 may include one or more indications of coolant structure location (for example what layers structures are to be formed in or between and at what coordinates), channel, reservoir, or other cooling structure size constraints, a desired volume of coolant fluid, desired coolant fluid type (or types), desired coolant fluid flow rate, desired IC operating temperature, specific heat of a coolant fluid at interfaces of a cooling structure, a coolant channel inlet temperature and/or pressure, coolant channel outlet temperature and/or pressure, an aperture profile of a coolant channel (for example circular, oval, triangular, rectangular, or other shapes), a heat flux at a given cross-section of a coolant channel or reservoir, or other like parameters.

In various embodiments, system 1200 may be adapted to provide one or more user interfaces 1220. In one embodiment, user interface 1220 is a graphical user interface. In another embodiment, user interface 1220 is a command-line user interface. In various embodiments, user interface 1220 is constructed to enable a user to input or create IC models 1201-1204 and/or to input or initiate generation of cooling structure parameters 1206. User interface 1220 may also be adapted to enable a user to initiate generation of one or more IC models 1201-1204.

In an embodiment, user interface 1220 is adapted to provide a user one or more graphical indications of IC models 1201-1204. In related embodiments, user interface 1220 may be adapted to enable a user to modify one or more models 1201-1204 by computer-based manipulation of the one or more graphical indications. For example, a user may be enabled to graphically modify a position and or interconnect of one or more routes or one or more IC device structures using user interface 1220.

In other embodiments, user interface 1220 is adapted to provide a user one or more ASCII or binary files that represent IC models 1201-1204. The one or more ASCII or binary files may be presented in any number of industry standard formats. User interface 1220 may further be adapted to enable a user to manipulate the one or more models 1201-1204 via command-line instructions, or by direct modification of one or more ASCII or binary files.

In an embodiment, system 1200 includes a coolant reservoir analysis/creation module 1221. In various embodiments, coolant reservoir analysis/creation module 1221 may be adapted to determine a configuration of one or more coolant reservoirs of an IC design. For example, reservoir analysis module 1221 may be adapted to determine, based on one or more IC models 1201-1204 and/or parameters 1205-1206, one or more locations with respect to layers of an IC die. In an embodiment, the one or more reservoir designs may be presented to a user. In one such embodiment, the one or more reservoir designs are presented to a user via user interface module 1220. In other embodiments, the one or more reservoir designs may be presented by one or more ASCII or binary files.

Reservoir analysis module 1221 may further determine various characteristics of a coolant reservoir. Examples of reservoir characteristics include size, shape, number of support pillars 516, support pillar 516 spacing, orientation, characteristics of one or more inlet ports 795 or one or more interfaces with cooling structures disposed in or between one or more other layers of an IC die.

System 1200 may further include a coolant channel analysis/creation module 1222. In various embodiments, channel analysis/creation module 1222 may be adapted to determine a configuration of one or more inter or intra-layer coolant channels of an IC design. In an embodiment, the one or more channel configurations may be presented to a user. In one such embodiment, the one or more channel configurations are presented to a user via user interface module 1220. In an embodiment, the one or more channels may be graphically manipulable using user interface module 1220. In other embodiments, the one or more channels may be manipulable via command-line using user interface module 1220. In still other embodiments, the one or more channels may be manipulable via modification of one or more ASCII or binary files representing channels.

Channel analysis/creation module 1221 may be adapted to determine, based on one or more IC models 1201-1204, one or more locations of channels with respect to layers of an IC die. In an embodiment, channel analysis/creation module 1221 may be adapted to analyze a physical design 1201 of an IC and determine available space on IC die layers for arrangement of channels. In another embodiment, channel analysis/creation module 1221 may be adapted to determine one or more IC device structures that may be relocated to provide space for channels. In still other embodiments, channel analysis/creation module may be adapted to alter a location of hot and/or cool spots or to create hot and/or cool spots of a die.

Channel analysis/creation module 1222 may further determine various characteristics of coolant channels. Examples of channel characteristics include size, shape, orientation, number of channels, number of layers, proximity to IC device structures, whether formed around a region of die, and/or a uniformity of channels, among other characteristics.

System 1200 may further include a thermally aware placement/routing module 1223 (hereinafter "placement/routing module" 1223). In one embodiment, placement/routing module 1223 is be adapted to optimize an organization of routes 141 of one or more routing layers and vias of an IC design to reduce and or normalize one or more operating temperatures of an IC design. In one embodiment, placement/routing module 1223 is adapted to optimize routing based on thermal operating conditions of an IC prior to design of intra-die cooling structures. In another embodiment, placement/routing module 1223 is adapted to optimize routing after design of intra-die cooling structures. In one embodiment, placement/routing module 1223 may be adapted to determine one or more IC device structures or routes 141 to relocate and or re-interconnect to create space for disposition of cooling channel(s) or reservoir(s).

In an embodiment not depicted in FIG. 12, system 1200 includes a physical design module adapted to enable creation of an IC physical design. In a related embodiment, the physical design module may be adapted to enable physical design based on at least one previously existing model of an IC cooling structure. In an embodiment, a user may be presented one or more IC cooling structures for selection. In an embodiment, a user may create a physical design of an IC based on the previously existing cooling structure model.

System 1200 may further include design rules check (DRC) module 1224. In various embodiments, a design rule is a predetermined parameter for structures of an IC. For example, certain electronic representations of IC device structures, such as logic elements (e.g. standard cell libraries) may associated with one or more desired or absolute placement and/or interconnect requirements. In one embodiment, a design rule may indicate that a transistor may not be disposed within three microns of a power carrying route. In another embodiment, a design rule may indicate that a cooling channel may not be disposed within 20 microns of a capacitor. In some embodiments, DRC module 1224 is constructed to verify IC or cooling structure design as system 1200 operates to generate and/or enable generation of IC or cooling structures. In other embodiments, DRC module 1224 may be adapted to verify design rules are not violated after operation of system 1200 to generate or enable generation of an IC. In an embodiment, user interface module 1220 is adapted to provide a user with one or more graphical or other indications of DRC rule violation. In another embodiment, user interface module 1220 is adapted to present one or more DRC rule violations in ASCII or binary format.

System 1200 may further include a multi-physics analysis module 1225 (hereinafter "multi-physics module" 1225). In an embodiment, multi-physics module 1225 may analyze thermal model 1204 and/or physical design 1201 of an IC to determine optimal fluid flow (i.e. number of channels, size, location, rate of heat transfer, coolant fluid flow rate, location and/or number of fluid transfer elements needed, location/number of hot and cool spots, . . . etc.). In another embodiment, multi-physics module 1225 may be adapted to analyze one or more intra-die coolant structures to determine whether one or more desired thermal characteristics of an IC have been achieved. In various embodiments, one or more indications of multi-physics module 1225 analysis may be presented to a user via user interface. The one or more indication may be provided via graphical or text based (ASCII/binary) as well.

In various embodiments, as depicted in FIG. 12, modules 1221-1225 may be adapted to operate in a recursive fashion. For example, coolant reservoir analysis/creation module 1221 and coolant channel analysis/creation module 1222 may operate to determine a physical design of a cooling structure. Place/route module 1223 may operate to create and/or modify routing of IC circuits. Based on a resultant physical design 1201, coolant reservoir module 1221 and coolant channel module 1222 may be adapted to create and/or modify one or more cooling structures based on the resultant physical design 1201.

In various embodiments, modules 1221-1225 are operable to create a plurality of alternative physical designs 1201 of an IC or of cooling structures for selection by a user. In an embodiment, modules 1221-1225 are operative to perform a monte-carlo style analysis, to create physical designs 1201 in a random fashion based on parameters 1205, 1206. In one embodiment, system 1200 is operable to select a desired model from the plurality of models 1201. In other embodiments, system 1200 is operable to present a plurality of modules to a user via user interface 1220, and enable user selection of a desired model 1201.

In various embodiments, modules 1221-1225 are adapted to enable the design of one or more intra-die fluid cooling structures. In an embodiment, system 1200 is further adapted to verify an IC design itself in combination with an intra-die cooling structure.

In one embodiment, system 1200 is adapted to present one or more electronic representations of an intra-die cooling structure. In one such embodiment, system 1200 is adapted to generate a stand-alone physical design of one or more cooling structures. In another embodiment, system 1200 is adapted to modify a previously existing electronic physical design to incorporate one or more cooling structures and create a combined electronic physical design.

Figure 13:
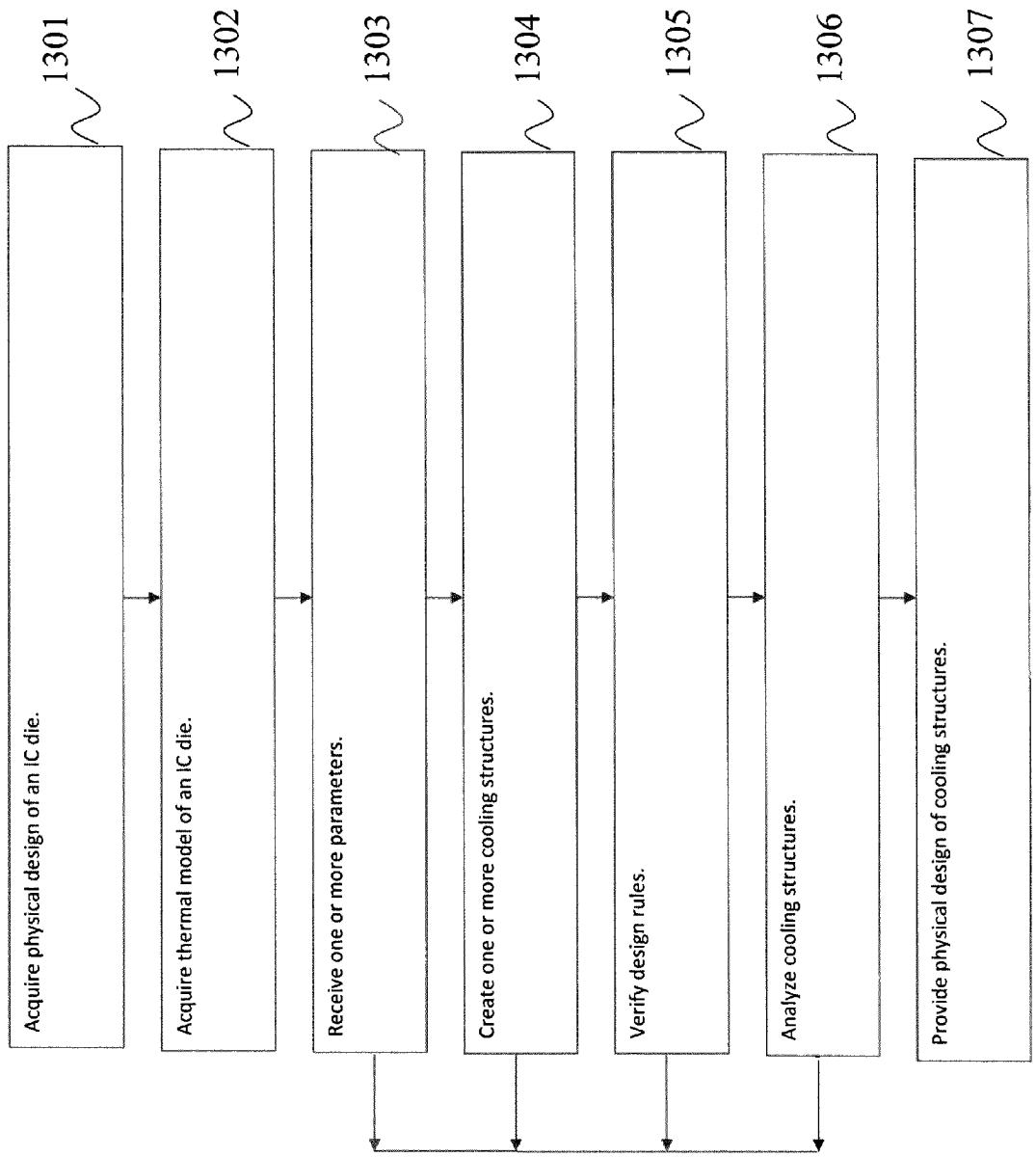
FIG. 13 illustrates generally one embodiment of a method of designing an IC that includes at least one intra-die cooling structure according to various aspects of the invention described herein.

FIG. 13 illustrates generally one embodiment of a method of creating an intra-die cooling structure according to various aspects of the invention described herein. At 1301, a physical design of one or more IC die is acquired. In various embodiments, the physical design is represented in one or more industry standard formats. In one such embodiment, the physical design is represented in a GDS2 format. At 1302, one or more thermal profiles of the IC are acquired. In one embodiment, the thermal profile is a 2-D thermal profile. In another embodiment, the thermal profile is a 3-D thermal profile. At 1303, one or more design parameters are received. In an embodiment, the one or more design parameters include IC design parameters. In another embodiment, the one or more design parameters include cooling structure design parameters. In an embodiment, the one or more design parameters are user selectable via a user interface.

At 1304, one or more cooling structure designs are created. In various embodiments, the one or more cooling structure designs include one or more reservoirs and one or more channels. In an embodiment, the one or more cooling structure designs are created based on one or more IC design parameters, one or more cooling structure design parameters, and/or one or more models of an IC. In an embodiment, the one or more models are selected from the group consisting of a physical design model, a timing model, a power model, and a thermal model. In an embodiment, a physical location of one or more cooling structures may be determined. In one such embodiment, one or more cooling structures may be disposed in available areas of an IC die. In another embodiment, one or more IC die structure or route positions or interconnects may be reconfigured to enable disposition of the one or more cooling structures.

At 1305, design rules are verified. In one embodiment the design rules are rules regarding IC device structure, placement and/or interconnect. At 1306, one or more analysis of cooling structure designs may be performed. In one embodiment, a structural integrity of cooling structure designs may be verified. In another embodiment, a desired flow rate is verified. In another embodiment, a desired operating temperature of an IC is verified.

In various embodiments, as depicted in FIG. 13, the method described herein may be recursive. For example, steps 1303-1306 may be performed multiple times in various combinations to determine desired cooling structure and/or IC configurations.

At 1307, a physical design of one or more cooling structures is created. In an embodiment, the physical design is represented electronically. In an embodiment, the physical design of one or more cooling structures is provided stand alone. In another embodiment, the physical design of one or more cooling structures is provided in combination with a physical design of one or more IC die. In various embodiments, the physical design of one or more cooling structures may be utilized to manufacture an IC die that includes one or more cooling structures.

Figure 14:
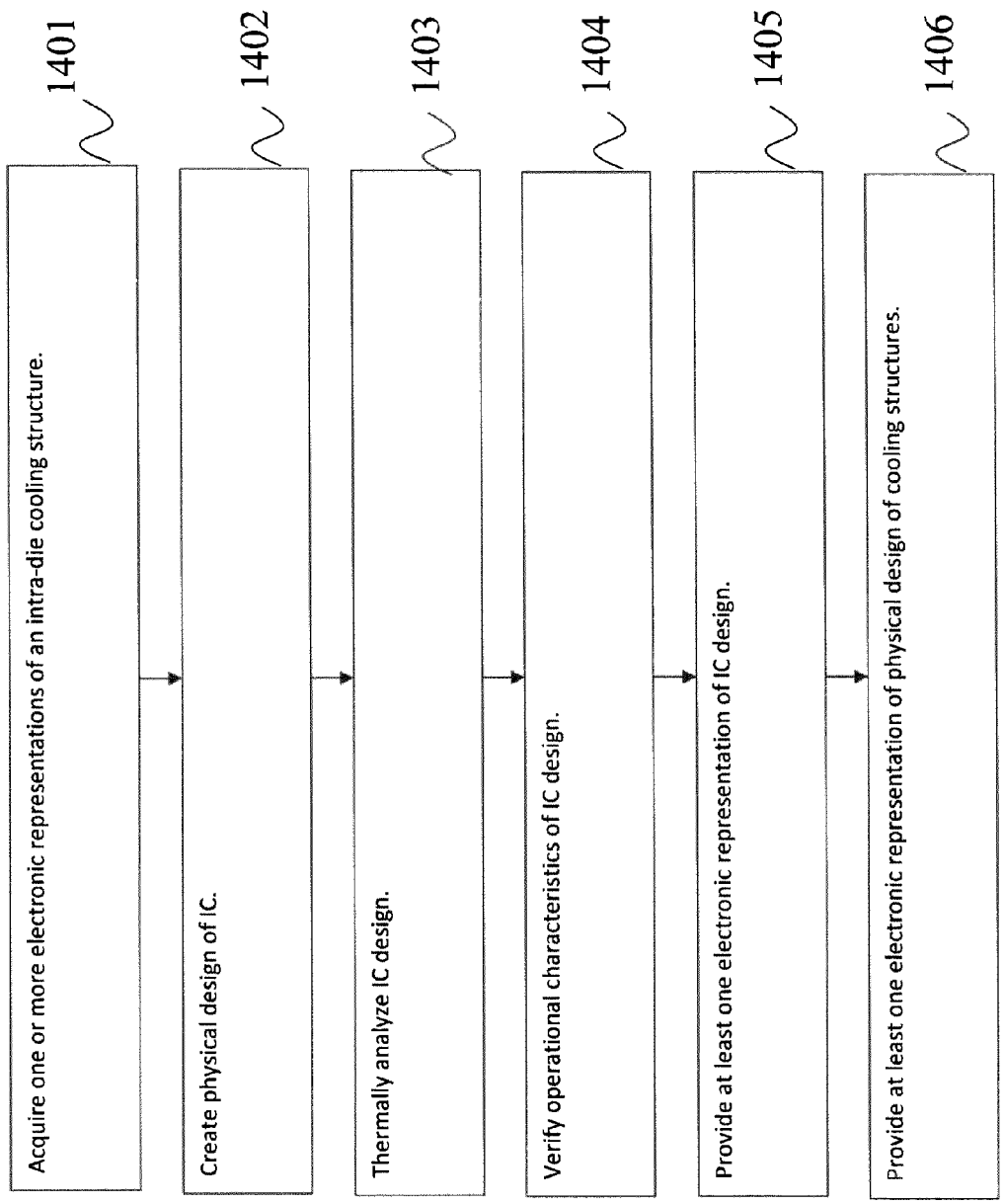
FIG. 14 illustrates generally one embodiment of a method of designing an IC that includes at least one intra-die cooling structure according to various aspects of the invention described herein.

FIG. 14 illustrates generally a flow chart of one embodiment of a method of designing an IC device according to various aspects of the invention described herein. At 1401, one or more electronic representations of an intra-die cooling structure are acquired. In an embodiment, at least one portion of the cooling structure is a uniform cooling structure. In an embodiment, at least one portion of the cooling structure may take the form of a cooling structure array. In an embodiment, a user may be presented a plurality of cooling structures for selection.

At 1402, a physical design of an IC is created. In various embodiments, the physical design of the IC is created based on location of the one or more cooling structures. In one such embodiment, the physical design is created to arrange one or more relatively hotter regions of the physical design in proximity to at least one cooling structure.

At 1403, during or after creation of the IC physical design, a thermal analysis of the physical design in accordance with the one or more structures is performed. In an embodiment, the thermal analysis is at least in part based on one or more predetermined parameters for IC physical design placement and/or configuration.

At 1404, operation characteristics of the IC design are verified. In one embodiment, timing of the IC design is verified. In another embodiment, an operational temperature of the IC design is verified. In yet another embodiment, power consumption of the physical design is verified.

At 1405, at least one electronic representation of the IC design is provided. At 1406, at least one electronic representation of the intra-die cooling structure is provided. In an embodiment, the at least one electronic representation of the IC design is provided without the at least one electronic representation of the intra-die cooling structure. In another embodiment, the at least one electronic representation of the IC design is provided with at least one electronic representation of the intra-die cooling structure.

The embodiments above are intended to be illustrative and not limiting. Additional embodiments are within the claims. In addition, although aspects of the present invention have been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An Integrated Circuit (IC) device, comprising:
a semiconductor die that includes a plurality of integral device layers and a plurality of transistors embedded within the plurality of integral device layers;
at least one coolant reservoir constructed to hold a coolant fluid;
at least one coolant channel in fluid communication with said coolant reservoir and constructed to locally interface with at least one of said plurality of transistors; and
wherein said coolant reservoir and said coolant channel are disposed wholly within said semiconductor die and are constructed and arranged to permit a fluid disposed within said at least one coolant reservoir to circulate through said at least one coolant channel to manage an operating temperature of said IC device.

2. The IC device of claim 1, further comprising:
at least one heat sink thermally coupled to said at least one coolant reservoir to dissipate heat from said coolant.

3. The IC device of claim 1, wherein said at least one semiconductor die includes at least two semiconductor substrates and a sacrificial layer disposed between said at least two semiconductor substrates, and wherein said coolant reservoir is disposed within said sacrificial layer.

4. The IC device of claim 1, wherein said at least one coolant channel is constructed to enable coolant flow between at least one hot operating region of said IC device and at least one cool operating region of said IC device.

5. The IC device of claim 1, wherein at least one portion of said at least one coolant channel is formed in at least one of said plurality of integral semiconductor device layers.

6. The IC device of claim 1, wherein at least one portion of said at least one coolant channel is formed in at least one layer of said IC device formed without integrated circuits in said at least one layer.

7. The IC device of claim 1, wherein said coolant reservoir is formed in at least one layer of said IC device formed without any of said plurality of transistors in said at least one layer.

8. The IC device of claim 1, wherein at least one portion of said at least one coolant reservoir is formed in at least one of said plurality of integral semiconductor device layers.

9. An Integrated Circuit (IC) device, comprising:
a semiconductor die that includes a plurality of integral semiconductor device layers and a plurality of transistors embedded within said plurality of integral semiconductor device layers;
at least one coolant reservoir constructed to hold a coolant fluid;
at least one inter-layer cooling channel and at least one intra-layer cooling channel in fluid communication with said coolant reservoir, wherein at least one of said inter-layer cooling channel and said intra-layer cooling channel is constructed to locally interface with at least one of said plurality of transistors; and
wherein said at least one coolant reservoir, said at least one inter-die cooling channel, and said it least one intra-die coolant channel are disposed wholly within said semiconductor die and are constructed and arranged to permit a fluid disposed within said at least one coolant reservoir to circulate through said at least one coolant channel to manage an operating temperature of said IC device.

10. The IC device of claim 1, further comprising:
at least one heat sink thermally coupled to said at least one coolant reservoir to dissipate heat from said coolant.

11. The IC device of claim 1, wherein said at least one semiconductor die includes at least two semiconductor substrates and a sacrificial layer disposed between said at least two semiconductor substrates, and wherein said coolant reservoir is disposed within said sacrificial layer.

12. The IC device of claim 9, wherein said at least one inter-layer cooling channel and said at least one intra-layer coolant channel are constructed to enable coolant flow between at least one hot operating region of said IC device and at least one cool operating region of said IC device.

13. The IC device of claim 9, wherein at least one portion of said at least one intra-layer coolant channel is formed in at least one of said plurality of integral semiconductor device layers.

14. The IC device of claim 9, wherein at least one portion of said at least one intra-layer coolant channel is formed in at least one layer of said IC device that does not include any of said plurality of transistors.

15. The IC device of claim 9, wherein said at least one coolant reservoir is formed in at least one layer of said IC device that does not include any of said plurality of transistors.

16. The IC device of claim 1, wherein at least one portion of said at least one coolant reservoir is formed in at least one of said plurality of integral semiconductor device layers.

17. An Integrated Circuit (IC) device, comprising:
a semiconductor die that includes a plurality of integral semiconductor device layers and a plurality of transistors embedded within said plurality of integral semiconductor device layers;
means for housing a coolant fluid disposed wholly within said semiconductor die; and
means for circulating coolant fluid proximal to at least one of said plurality of transistors, wherein the means for circulating are disposed wholly within said semiconductor die.

* * * * *